US012324265B2

(12) United States Patent
Tarek et al.

(10) Patent No.: US 12,324,265 B2
(45) Date of Patent: Jun. 3, 2025

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventors: Ayman Abdelghafar Tarek, Tokyo (JP); Junji Iwata, Tokyo (JP); Kazuhiro Morimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/509,751

(22) Filed: Oct. 25, 2021

(65) Prior Publication Data

US 2022/0130877 A1  Apr. 28, 2022

(30) Foreign Application Priority Data

Oct. 28, 2020 (JP) .................................. 2020-180165
Mar. 22, 2021 (JP) .................................. 2021-047087
Sep. 27, 2021 (JP) .................................. 2021-157065

(51) Int. Cl.
  *H10F 39/00*   (2025.01)
  *H04N 25/70*   (2023.01)
  *H10F 30/225*  (2025.01)

(52) U.S. Cl.
  CPC .......... *H10F 39/807* (2025.01); *H04N 25/70* (2023.01); *H10F 39/8033* (2025.01); *H10F 30/225* (2025.01)

(58) Field of Classification Search
  CPC ...... G01S 17/10; G01S 17/894; G01S 7/4863; H01L 27/1461; H01L 27/1463;
  (Continued)

(56) References Cited

U.S. PATENT DOCUMENTS 10,204,950 B1   2/2019  Yamashita
10,446,601 B2 * 10/2019  Otake ................. H01L 27/1464
(Continued)

FOREIGN PATENT DOCUMENTS

JP   2018064086 A    4/2018
JP   2018201005 A   12/2018
(Continued)

*Primary Examiner* — Antoinette T Spinks
(74) *Attorney, Agent, or Firm* — Canon U.S.A., Inc. IP Division

(57) ABSTRACT

A photoelectric conversion apparatus includes a plurality of avalanche photodiodes. Each of the plurality of avalanche photodiodes includes an avalanche multiplication unit formed by a first semiconductor region of a first conductivity type that is arranged at a first depth, and a second semiconductor region of a second conductivity type different from the first conductivity type and which is arranged at a second depth deeper than the first depth. A fourth semiconductor region at least one of a conductivity type and an impurity concentration of which is different from those of a third semiconductor region of the second conductivity type is arranged at a position shallower than the third semiconductor region, and a depth of a boundary portion between the third semiconductor region and the fourth semiconductor region is deeper than that of the avalanche multiplication unit.

34 Claims, 39 Drawing Sheets

(58) Field of Classification Search
CPC . H01L 27/14643; H01L 31/107; H04N 25/70; A01G 13/08; A01G 7/045; A01G 9/022; F24F 11/63; F24F 11/72; F24F 13/20; F24F 2013/205; F24F 8/108; F24F 8/167; F24F 8/175; F24F 8/22; H10F 30/225; H10F 39/8033; H10F 39/807
See application file for complete search history.

(56) References Cited

U.S. PATENT DOCUMENTS

| | | | |
|---|---|---|---|
| 2019/0280145 A1* | 9/2019 | Natsuaki | H01L 31/107 |
| 2022/0052092 A1* | 2/2022 | Furumi | H01L 27/14685 |
| 2022/0271067 A1* | 8/2022 | Sugiura | H10F 39/8033 |
| 2023/0215893 A1* | 7/2023 | Sekine | H01L 27/14612 |
| | | | 257/292 |

FOREIGN PATENT DOCUMENTS

| | | |
|---|---|---|
| JP | 2019033136 A | 2/2019 |
| JP | 2022055214 A | 4/2022 |
| WO | 2007135809 A | 11/2007 |
| WO | 2020/059702 A1 | 3/2020 |

* cited by examiner

FIRST EXEMPLARY EMBODIMENT

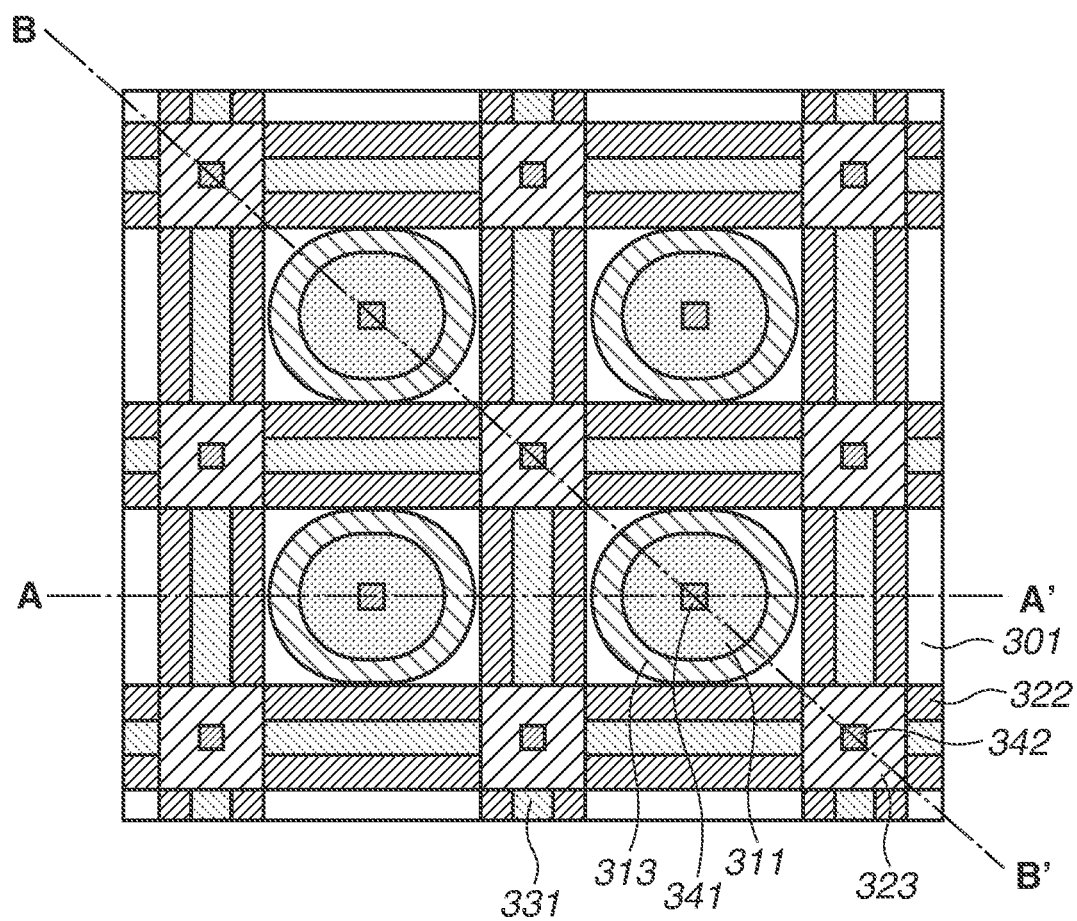

THIRD EXEMPLARY EMBODIMENT

FOURTH EXEMPLARY EMBODIMENT

FIFTH EXEMPLARY EMBODIMENT

SIXTH EXEMPLARY EMBODIMENT

SEVENTH EXEMPLARY EMBODIMENT

EIGHTH EXEMPLARY EMBODIMENT

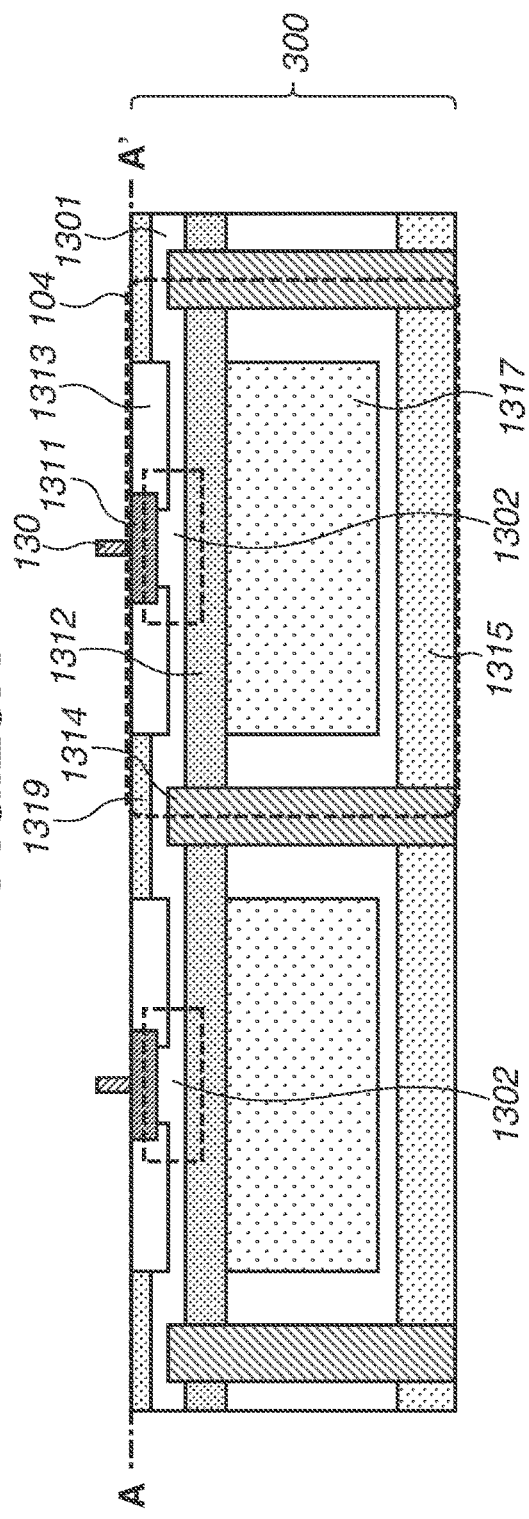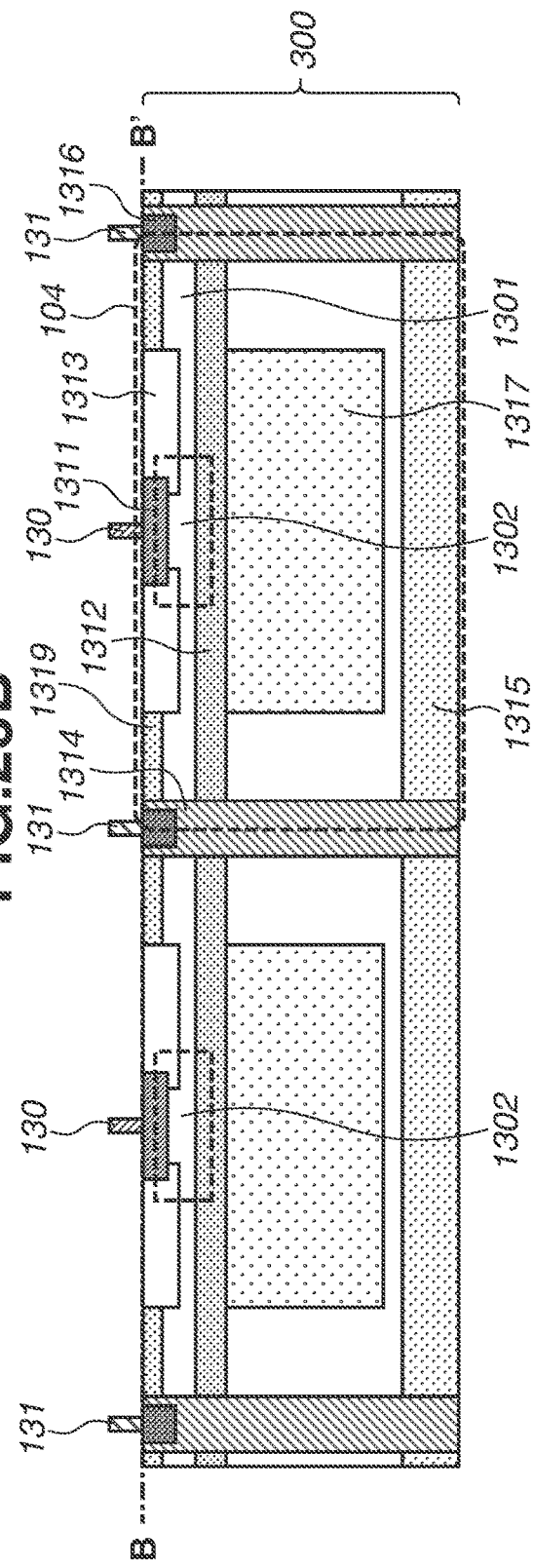

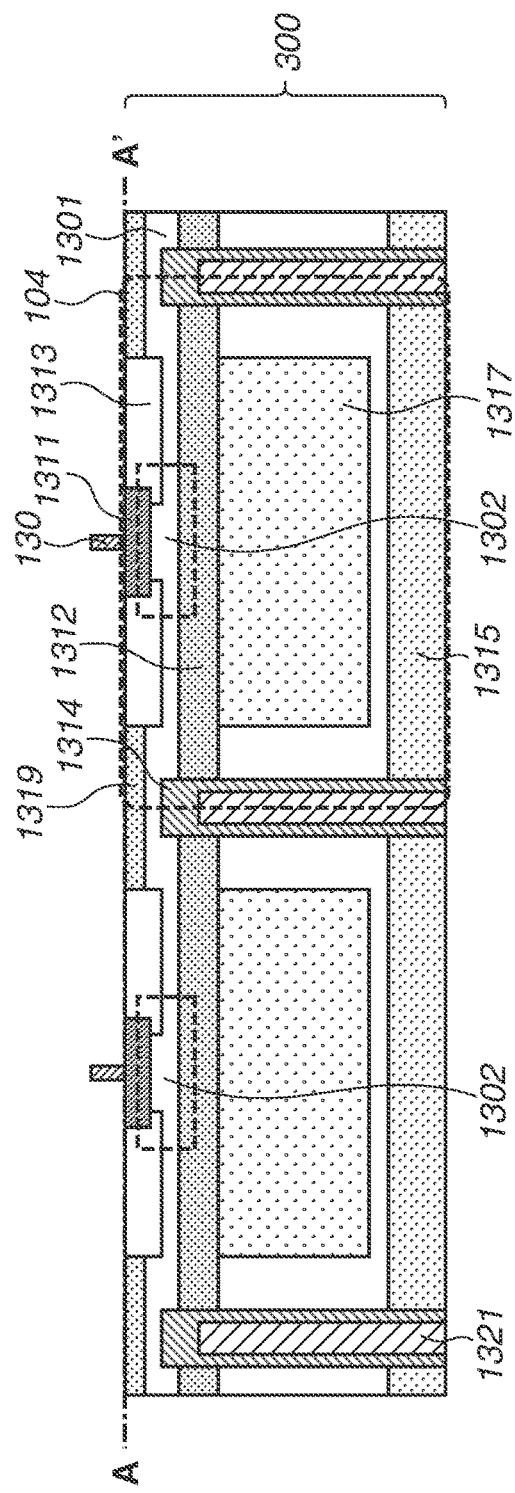
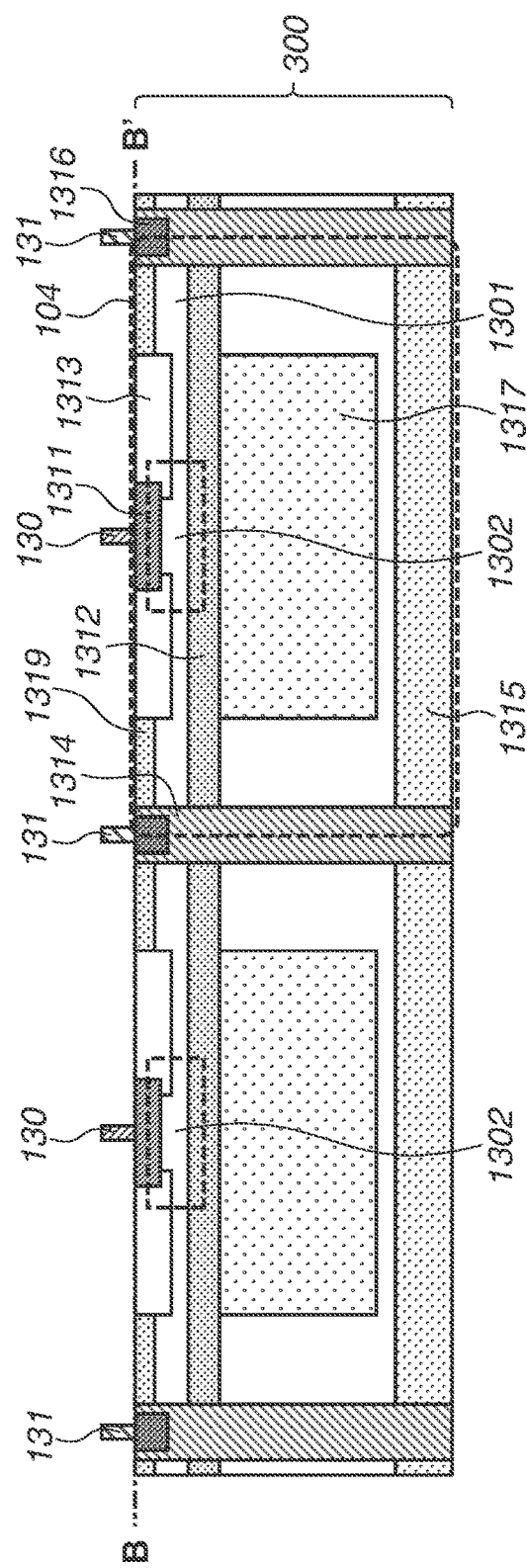
FIG.28A
FIG.28B

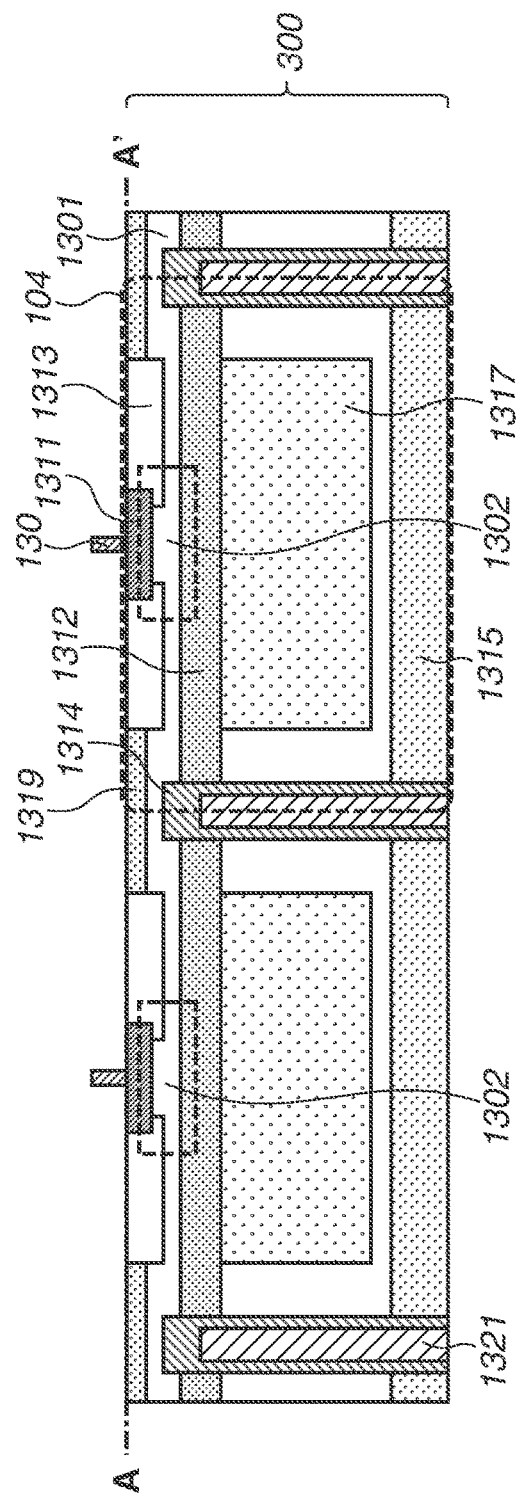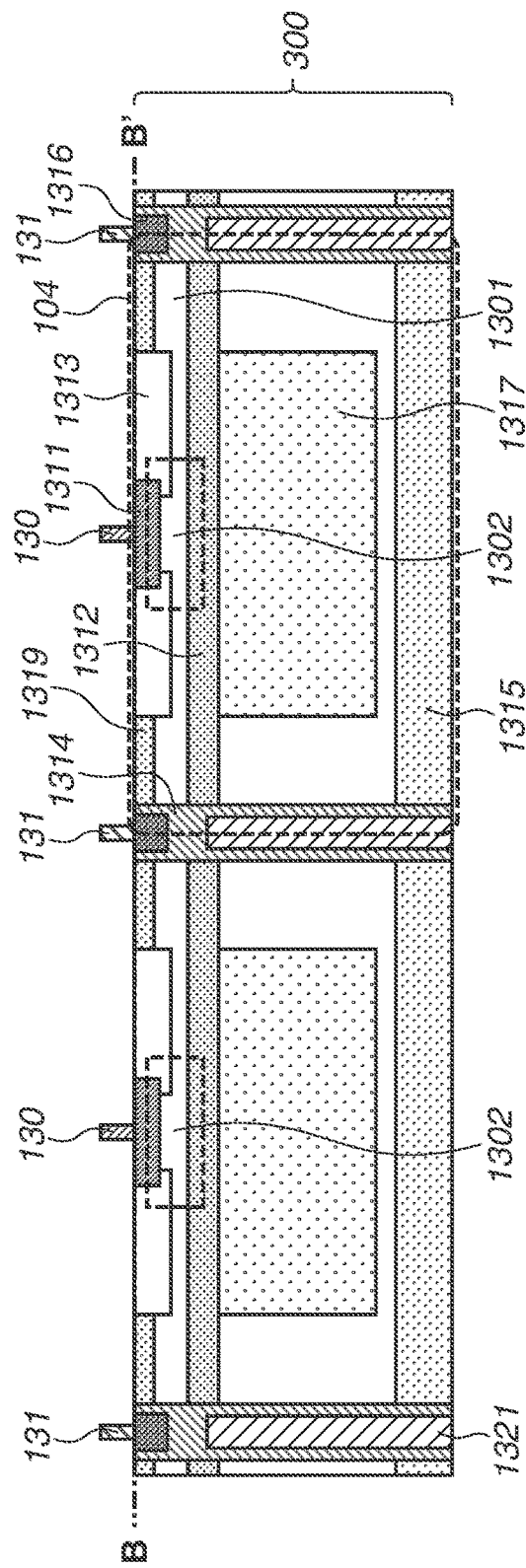

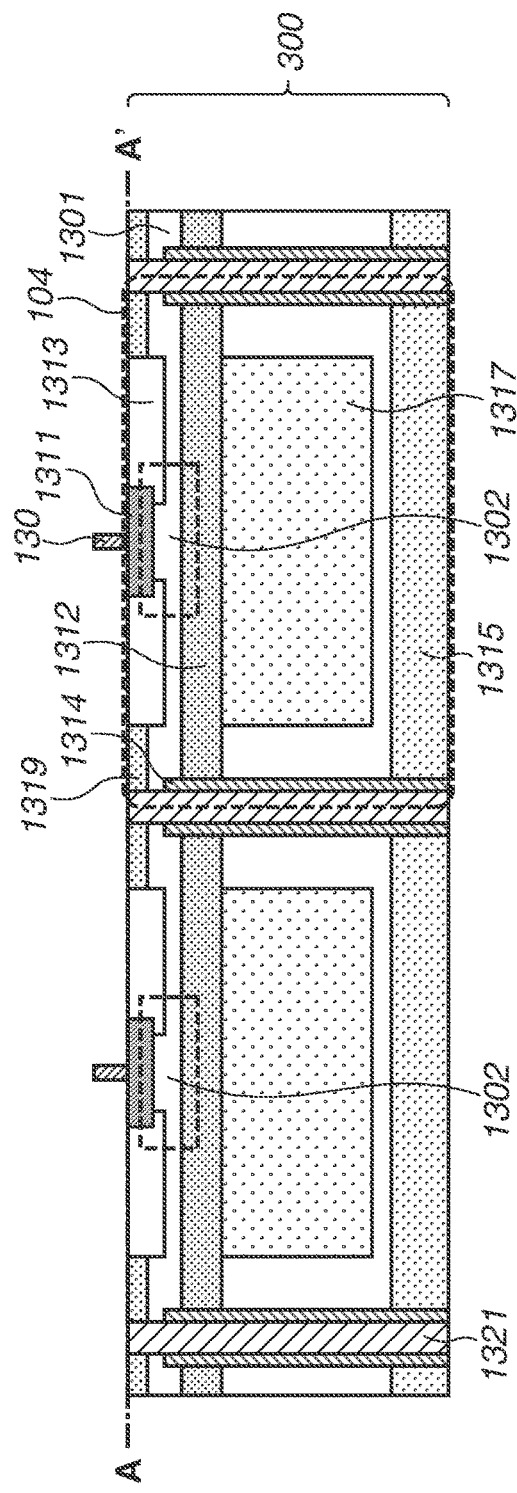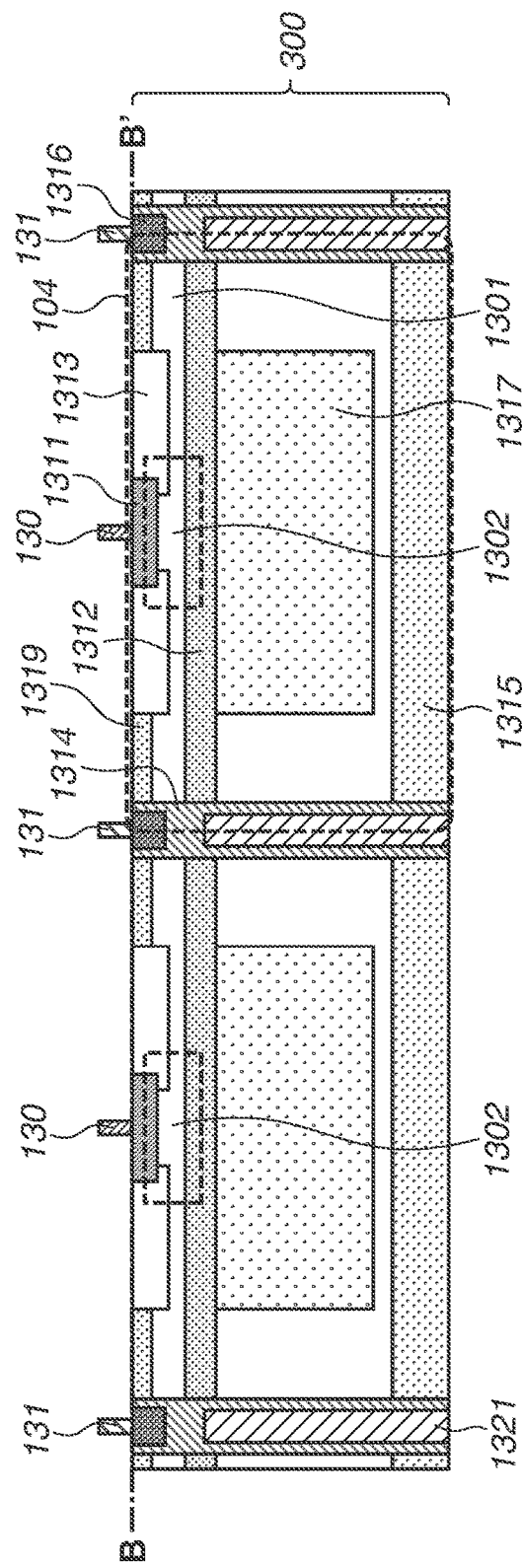

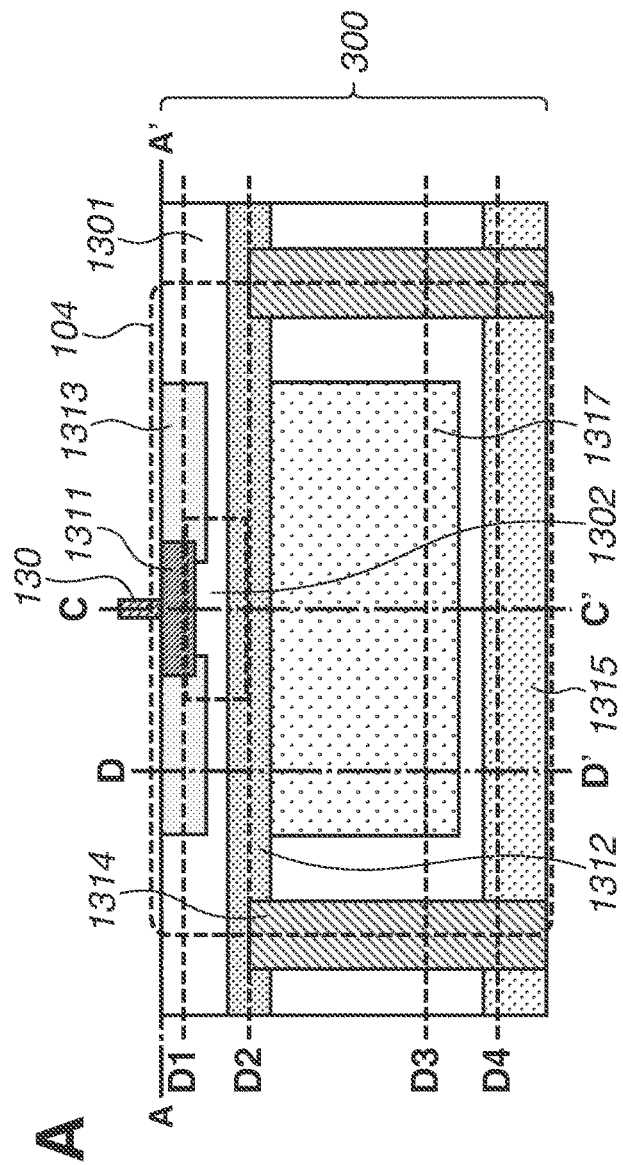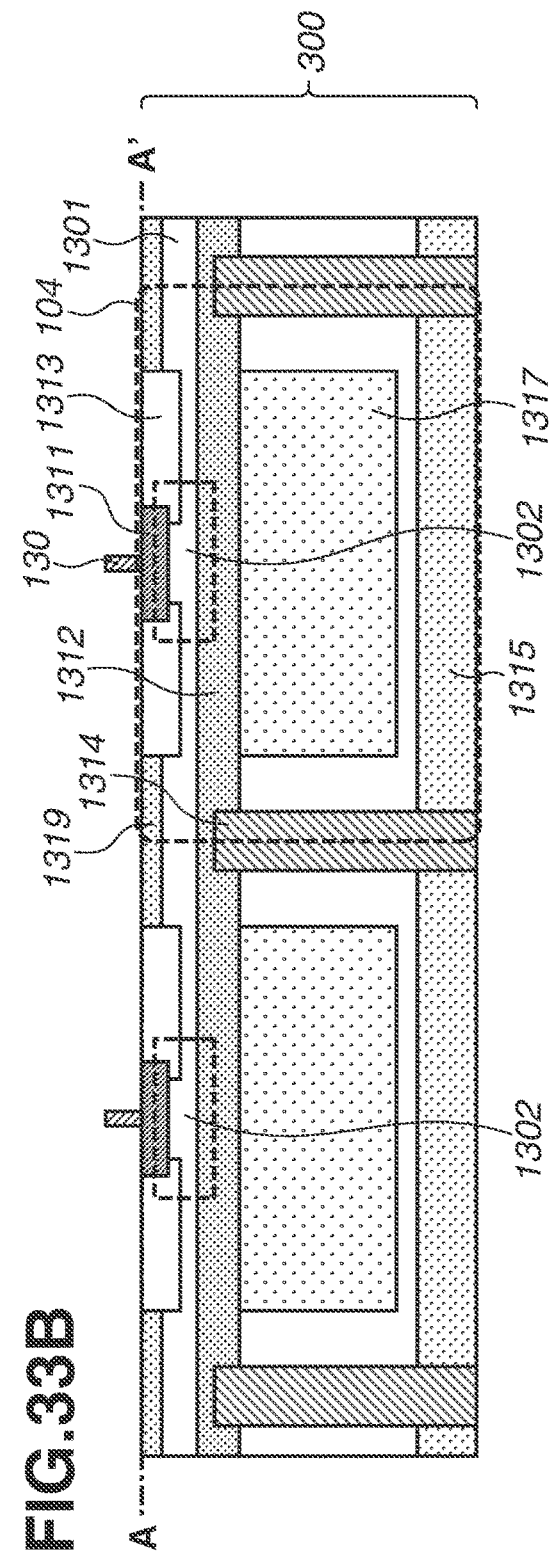
FIG.33A
FIG.33B

MANUFACTURING METHOD OF PRESENT EXEMPLARY EMBODIMENT
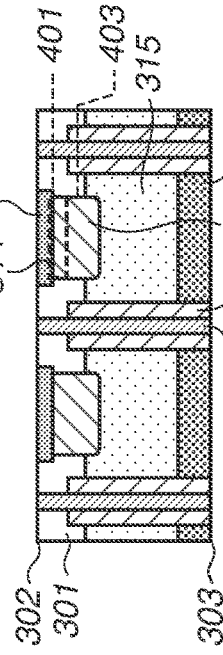
FIG.34A
FIG.34B
FIG.34C
FIG.34D
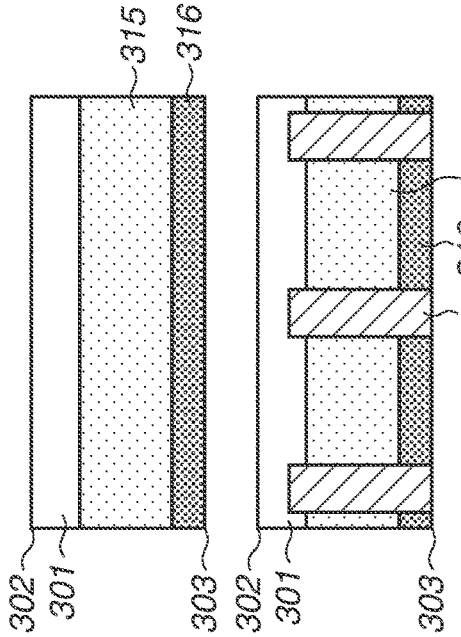
FIG.34E
FIG.34F
FIG.34G

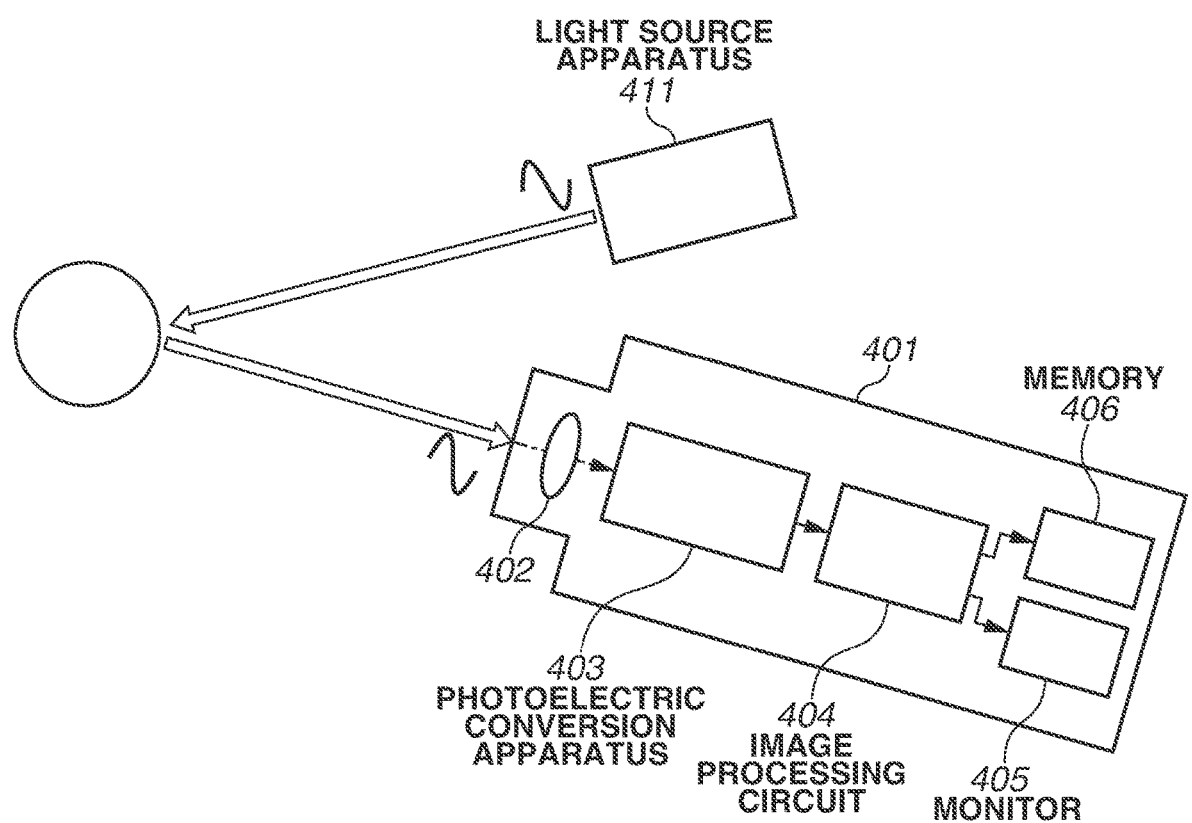

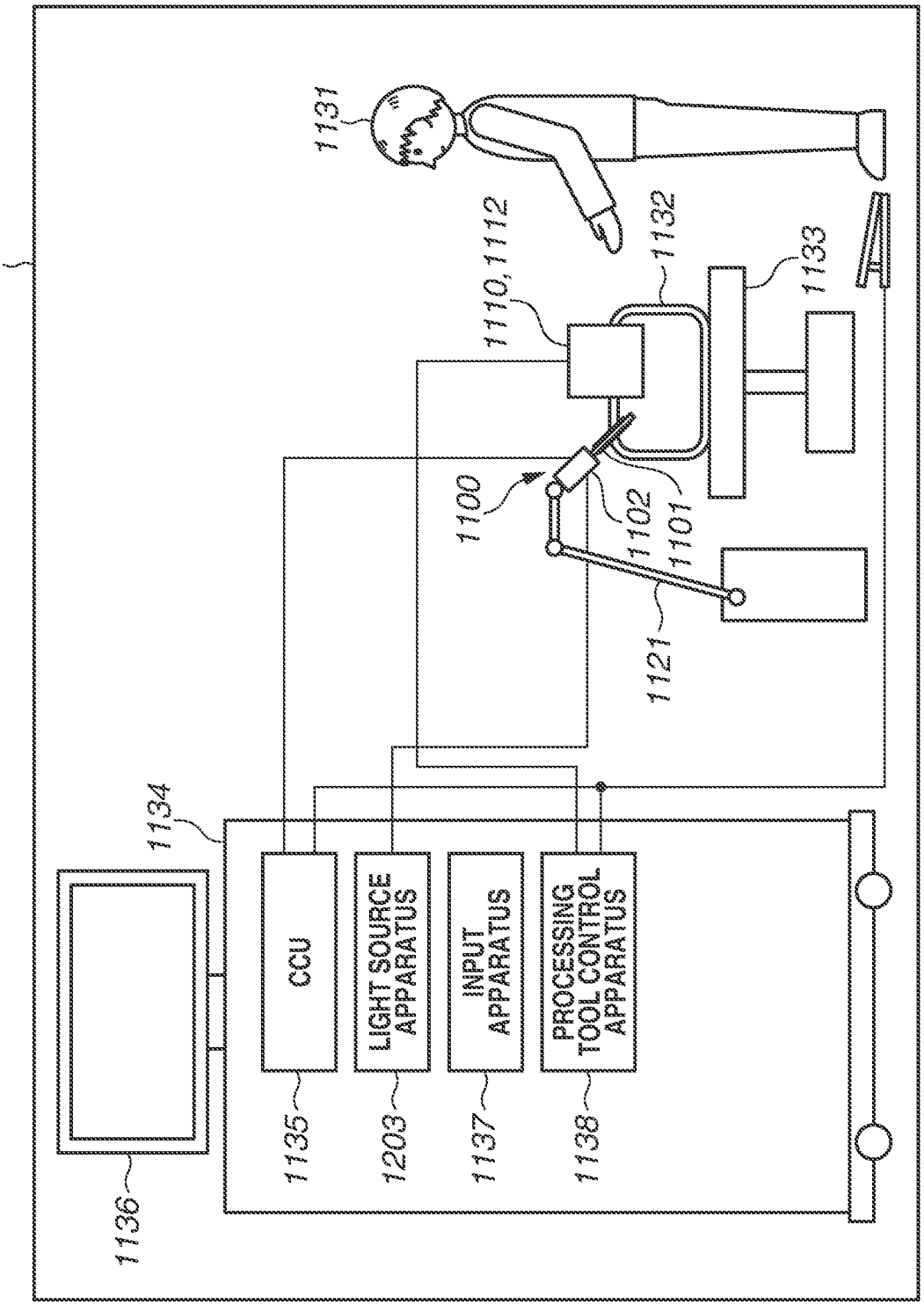

PHOTOELECTRIC CONVERSION APPARATUS AND PHOTOELECTRIC CONVERSION SYSTEM

BACKGROUND OF THE INVENTION

Field of the Invention

The present invention relates to a photoelectric conversion apparatus and a photoelectric conversion system.

Description of the Related Art

There has been known a photodetection apparatus including an avalanche photodiode (APD) that can detect a weak signal of a single photon level by using avalanche (electronic avalanche) multiplication. The APD forms a high electric field region (avalanche multiplication unit) by a first semiconductor region of a first conductivity type having the same polarity as a signal charge, and a second semiconductor region of a second conductivity type having a polarity different from a signal charge.

In Japanese Patent Application Laid-Open No. 2018-201005, a third semiconductor region isolating pixels is provided up to a position at the same depth as an avalanche multiplication unit in a cross-sectional view, and arranged in such a manner as to surround the avalanche multiplication unit in a planar view.

If a pixel size is miniaturized, a distance between the third semiconductor region and the avalanche multiplication unit gets closer. A local high electric field region is accordingly formed between the third semiconductor region and a first semiconductor region, and a dark count rate (hereinafter, DCR) worsens.

SUMMARY OF THE INVENTION

According to an aspect of the present invention, a photoelectric conversion apparatus includes a semiconductor layer, and a plurality of avalanche photodiodes arranged on the semiconductor layer and including a first avalanche photodiode and a second avalanche photodiode, wherein each of the plurality of avalanche photodiodes includes an avalanche multiplication unit formed by a first semiconductor region of a first conductivity type in which a carrier of a same conductivity type as a signal charge is regarded as a majority carrier and which is arranged at a first depth, and a second semiconductor region of a second conductivity type different from the first conductivity type and which is arranged at a second depth deeper than the first depth, wherein a third semiconductor region of the second conductivity type is arranged between the first avalanche photodiode and the second avalanche photodiode, wherein a fourth semiconductor region at least one of a conductivity type and an impurity concentration of which is different from those of the third semiconductor region is arranged between the first avalanche photodiode and the second avalanche photodiode at a position shallower than the third semiconductor region, and wherein a depth of a boundary portion between the third semiconductor region and the fourth semiconductor region is deeper than the avalanche multiplication unit.

According to another aspect of the present invention, a photoelectric conversion apparatus includes a semiconductor layer including a plurality of photoelectric conversion elements and having a first surface and a second surface, the second surface being a surface opposite to the first surface and on which light enters, wherein each of the plurality of photoelectric conversion elements includes an avalanche photodiode, wherein the avalanche photodiode includes a first semiconductor region of a first conductivity type in which a charge of a same polarity as a signal charge is regarded as a majority carrier and a second semiconductor region of a second conductivity type, wherein the plurality of photoelectric conversion elements is isolated by an isolation portion including a third semiconductor region of the second conductivity type, wherein the second semiconductor region is arranged in contact with the third semiconductor region, wherein the plurality of photoelectric conversion elements includes a first photoelectric conversion element and a second photoelectric conversion element which are arranged in a first direction, the second photoelectric conversion element arranged adjacently to the first photoelectric conversion element, and wherein the third semiconductor region is arranged between the first photoelectric conversion element and the second photoelectric conversion element in such a manner that one end of the third semiconductor region is located closer to a side of the second surface than the first surface, and located closer to a side of the first surface than the second semiconductor region.

Further features of the present invention will become apparent from the following description of exemplary embodiments with reference to the attached drawings.

BRIEF DESCRIPTION OF THE DRAWINGS

FIG. 8 is a pixel plan view according to a second exemplary embodiment.

FIGS. 25A and 25B are schematic cross-sectional views of the photoelectric conversion apparatus according to the tenth exemplary embodiment.

FIGS. 28A and 28B are schematic cross-sectional views of the photoelectric conversion apparatus according to the eleventh exemplary embodiment.

FIGS. 30A and 30B are schematic cross-sectional views of the photoelectric conversion apparatus according to the eleventh exemplary embodiment.

FIGS. 32A and 32B are schematic cross-sectional views of the photoelectric conversion apparatus according to the twelfth exemplary embodiment.

FIGS. 33A and 33B are schematic cross-sectional views of a photoelectric conversion apparatus according to a thirteenth exemplary embodiment.

FIGS. 34A to 34G illustrate a manufacturing method of a photoelectric conversion apparatus according to a fourteenth exemplary embodiment.

FIG. 37 is a block diagram of a photoelectric conversion system according to a seventeenth exemplary embodiment.

FIG. 38 is a block diagram of a photoelectric conversion system according to an eighteenth exemplary embodiment.

DESCRIPTION OF THE EMBODIMENTS

Figure 1:
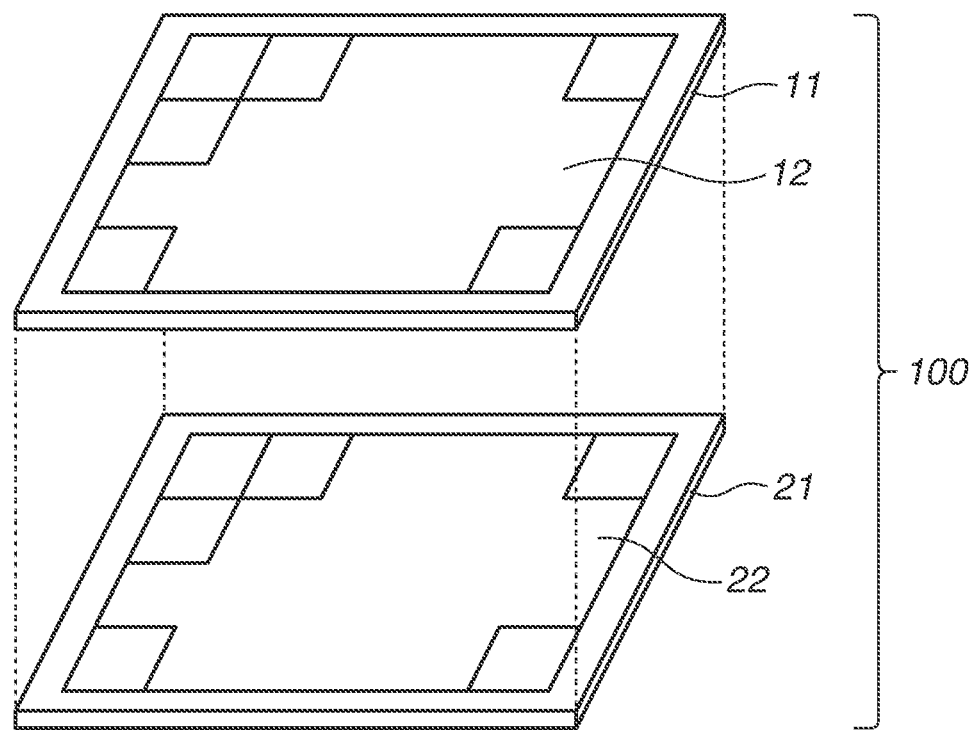
FIG. 1 is a diagram illustrating a configuration of a photoelectric conversion apparatus.

The following exemplary embodiments are provided for embodying the technical idea of the present invention, and are not intended to limit the present invention. The sizes and the positional relationship of members illustrated in the drawings are sometimes exaggerated for clarifying the description. In the following description, the same components are assigned the same reference numerals, and the description thereof will be sometimes omitted. In addition, configurations described in each exemplary embodiment can be replaced with or combined with configurations described in another exemplary embodiment, unless technical problems exist.

Hereinafter, exemplary embodiments of the present invention will be described in detail with reference to the drawings. In the following description, terms (e.g., "up", "down", "right", "left", and other terms including these terms) indicating specific directions and positions are used as necessary. These terms are used to facilitate the understanding of the invention described with reference to the drawings. The technical scope of the present invention is not limited by the meanings of these terms.

In the following description, an anode of an avalanche photodiode (APD) is set to a fixed potential, and a signal is taken out from a cathode side. Thus, a semiconductor region of a first conductivity type in which a charge of the same polarity as a signal charge is regarded as a majority carrier is an N-type semiconductor region, and a semiconductor region of a second conductivity type in which a charge of a polarity different from a signal charge is regarded as a majority carrier is a P-type semiconductor region. Even in a case where a cathode of an APD is set to a fixed potential and a signal is taken out from an anode side, the present invention can be realized. In this case, the semiconductor region of the first conductivity type in which a charge of the same polarity as a signal charge is regarded as a majority carrier is the P-type semiconductor region, and the semiconductor region of the second conductivity type in which a charge of a polarity different from a signal charge is regarded as a majority carrier is the N-type semiconductor region. The following description will be given of a case where one node of an APD is set to a fixed potential, but potentials of both nodes may be made variable.

In this specification, in a case where the term "impurity concentration" is simply used, the term means a net impurity concentration obtained by subtracting an amount compensated by an impurity of an opposite conductivity type. In short, the "impurity concentration" refers to a NET concentration. A region in which a P-type additive impurity concentration is higher than an N-type additive impurity concentration is the P-type semiconductor region. In contrast, a region in which an N-type additive impurity concentration is higher than a P-type additive impurity concentration is the N-type semiconductor region.

In this specification, a "planar view" refers to a view from a direction vertical to a light incidence surface of a semiconductor layer to be described below, or a surface on the opposite side of the light incidence surface. A cross-section refers to a surface in the direction vertical to the light incidence surface of the semiconductor layer. In a case where the light incidence surface of the semiconductor layer is a rough surface when viewed microscopically, a planar view is defined based on a light incidence surface of a semiconductor layer that is set when viewed macroscopically.

A semiconductor layer 301 has a first surface and a second surface which is a surface on the opposite side of the first surface. Light enters the second surface. In this specification, a depth direction is a direction heading for the second surface from the first surface of the semiconductor layer 301 on which an APD is arranged. Hereinafter, the "first surface" will be sometimes referred to as a "front surface", and the "second surface" will be sometimes referred to as a "back surface". A direction heading for a back surface direction of the semiconductor layer 301 from a predetermined position in the semiconductor layer 301 will be sometimes represented as "deep". In contrast, a direction heading for a front surface direction of the semiconductor layer 301 from a predetermined position in the semiconductor layer 301 will be sometimes represented as "shallow".

A configuration common to the exemplary embodiments will be described with reference to FIGS. 1 to 5A, 5B, and 5C.

FIG. 1 is a diagram illustrating a configuration of a stack-type photoelectric conversion apparatus 100. The photoelectric conversion apparatus 100 includes two substrates, a sensor substrate 11 and a circuit substrate 21, which are electrically connected. The sensor substrate 11 includes a first semiconductor layer (semiconductor layer 301) including a photoelectric conversion element 102 to be described below, and a first wiring structure. The circuit substrate 21 includes a second semiconductor layer including a circuit such as a signal processing unit 103 to be described below, and a second wiring structure. The photoelectric conversion apparatus 100 includes the second semiconductor layer, the second wiring structure, the first wiring structure, and the first semiconductor layer, which are stacked in this order. The photoelectric conversion apparatus described in each exemplary embodiment is a back-illuminated photoelectric conversion apparatus into which light enters from the second surface, and includes a circuit substrate arranged on the first surface.

Hereinafter, the sensor substrate 11 and the circuit substrate 21 will be described as singulated chips, but the sensor substrate 11 and the circuit substrate 21 are not limited to chips. For example, each substrate may be a wafer. Alternatively, substrates may be singulated after being stacked in a wafer state, or may be chipped from a wafer state and then jointed by stacking chips.

A pixel region 12 is arranged on the sensor substrate 11, and a circuit region 22 for processing a signal detected by the pixel region 12 is arranged on the circuit substrate 21.

Figure 2:
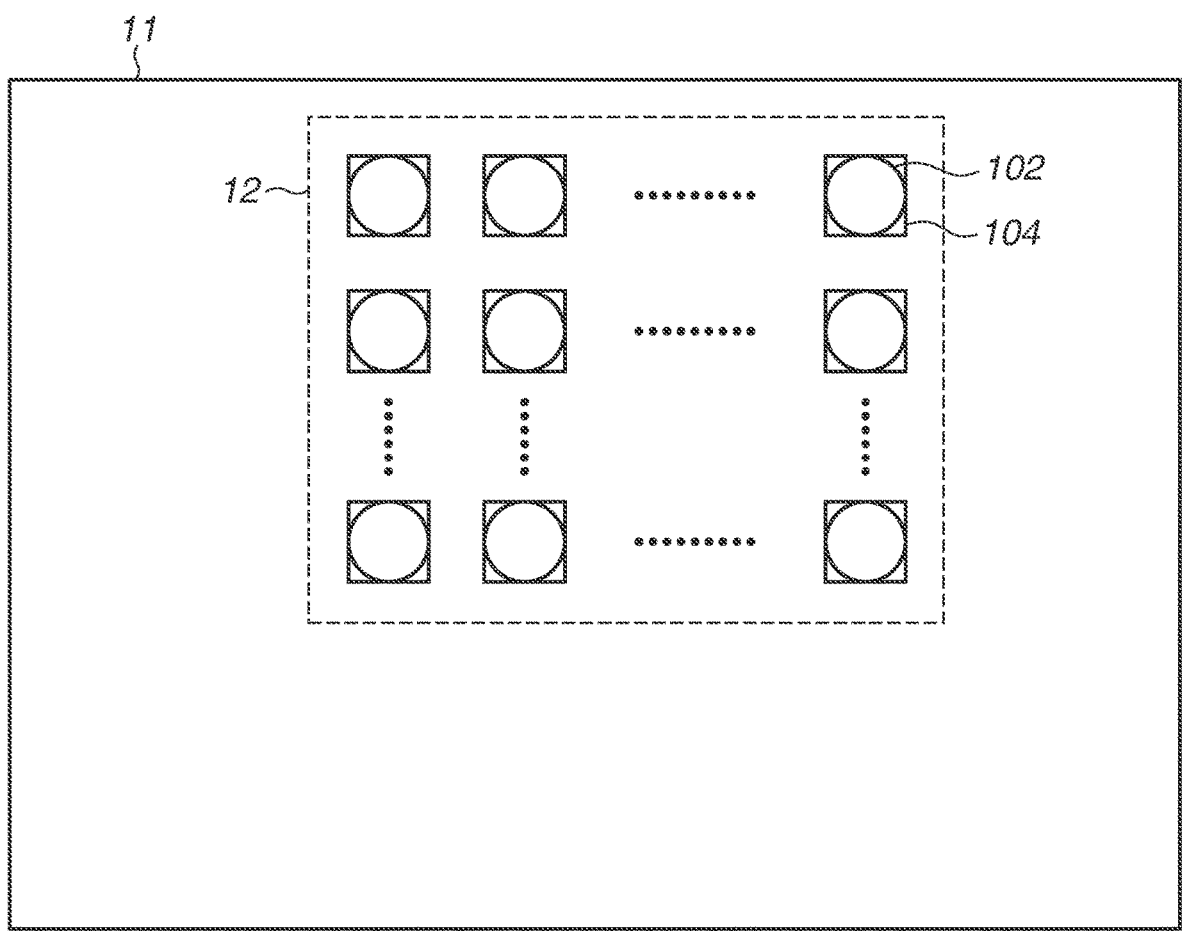
FIG. 2 illustrates an arrangement example of a sensor substrate.

FIG. 2 is a diagram illustrating an arrangement example of the sensor substrate 11. Pixels 104 each including the photoelectric conversion element 102 including an APD are arranged in a two-dimensional array in a planar view, and form the pixel region 12.

Typically, the pixel 104 is a pixel for forming an image. In a case where the pixel 104 is used in a time of flight (TOF) sensor, an image needs not be always formed. In other words, the pixel 104 may be used for measuring a time at which light reaches, and for measuring a light amount.

Figure 3:
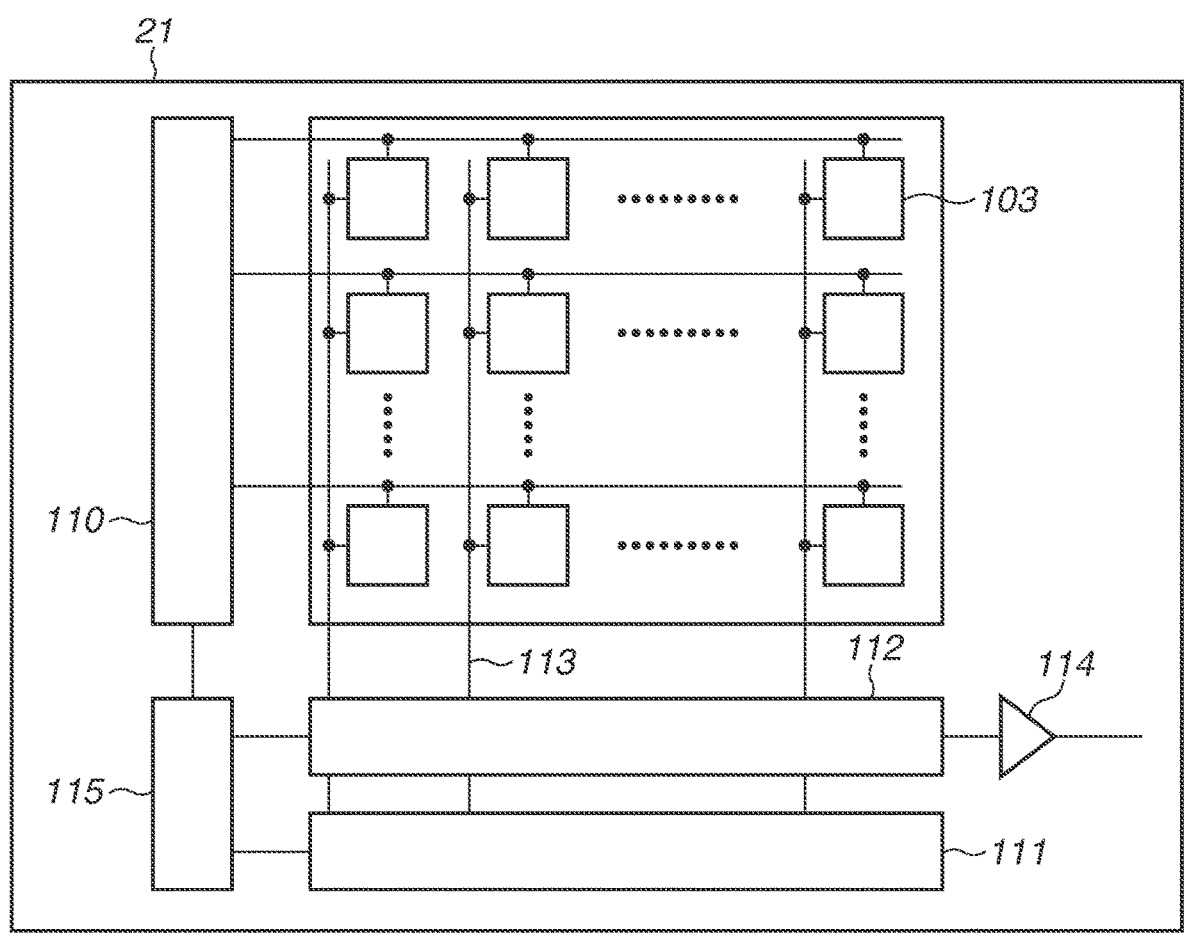
FIG. 3 illustrates an arrangement example of a circuit substrate.

FIG. 3 is a configuration diagram of the circuit substrate 21. The circuit substrate 21 includes the signal processing unit 103 that processes a charge photoelectrically-converted by the photoelectric conversion element 102 illustrated in FIG. 2, a readout circuit 112, a control pulse generation unit 115, a horizontal scanning circuit unit 111, a signal line 113, and a vertical scanning circuit unit 110.

The photoelectric conversion element 102 illustrated in FIG. 2, and the signal processing unit 103 illustrated in FIG. 3 are electrically connected via a connection wire provided for each pixel.

The vertical scanning circuit unit 110 receives a control pulse supplied from the control pulse generation unit 115, and supplies the control pulse to each pixel. A logic circuit such as a shift register or an address decoder is used as the vertical scanning circuit unit 110.

A signal output from the photoelectric conversion element 102 of a pixel is processed by the signal processing unit 103.

A counter and a memory are provided in the signal processing unit 103, and a digital value is stored in the memory.

The horizontal scanning circuit unit 111 inputs, to the signal processing unit 103, a control pulse for sequentially selecting each column, for reading out a signal from the memory of each pixel that stores a digital signal.

A signal is output to the signal line 113 from the signal processing unit 103 of a pixel on a selected column that has been selected by the vertical scanning circuit unit 110.

The signal output to the signal line 113 is output via an output circuit 114 to a recording unit or a signal processing unit that is provided on the outside of the photoelectric conversion apparatus 100.

In FIG. 2, photoelectric conversion elements in a pixel region may be one-dimensionally arrayed. The function of the signal processing unit needs not be provided for each of all photoelectric conversion elements. For example, one signal processing unit may be shared by a plurality of photoelectric conversion elements, and signal processing may be sequentially performed.

As illustrated in FIGS. 2 and 3, a plurality of signal processing units 103 is arranged in a region overlapping the pixel region 12 in a planar view. Then, the vertical scanning circuit unit 110, the horizontal scanning circuit unit 111, the readout circuit 112, the output circuit 114, and the control pulse generation unit 115 are arranged in such a manner as to overlap a space between the end of the sensor substrate 11 and the end of the pixel region 12 in a planar view. In other words, the sensor substrate 11 includes the pixel region 12, and a non-pixel region arranged around the pixel region 12. Then, the vertical scanning circuit unit 110, the horizontal scanning circuit unit 111, the readout circuit 112, output circuit 114, and the control pulse generation unit 115 are arranged in a region overlapping the non-pixel region in a planar view.

Figure 4:
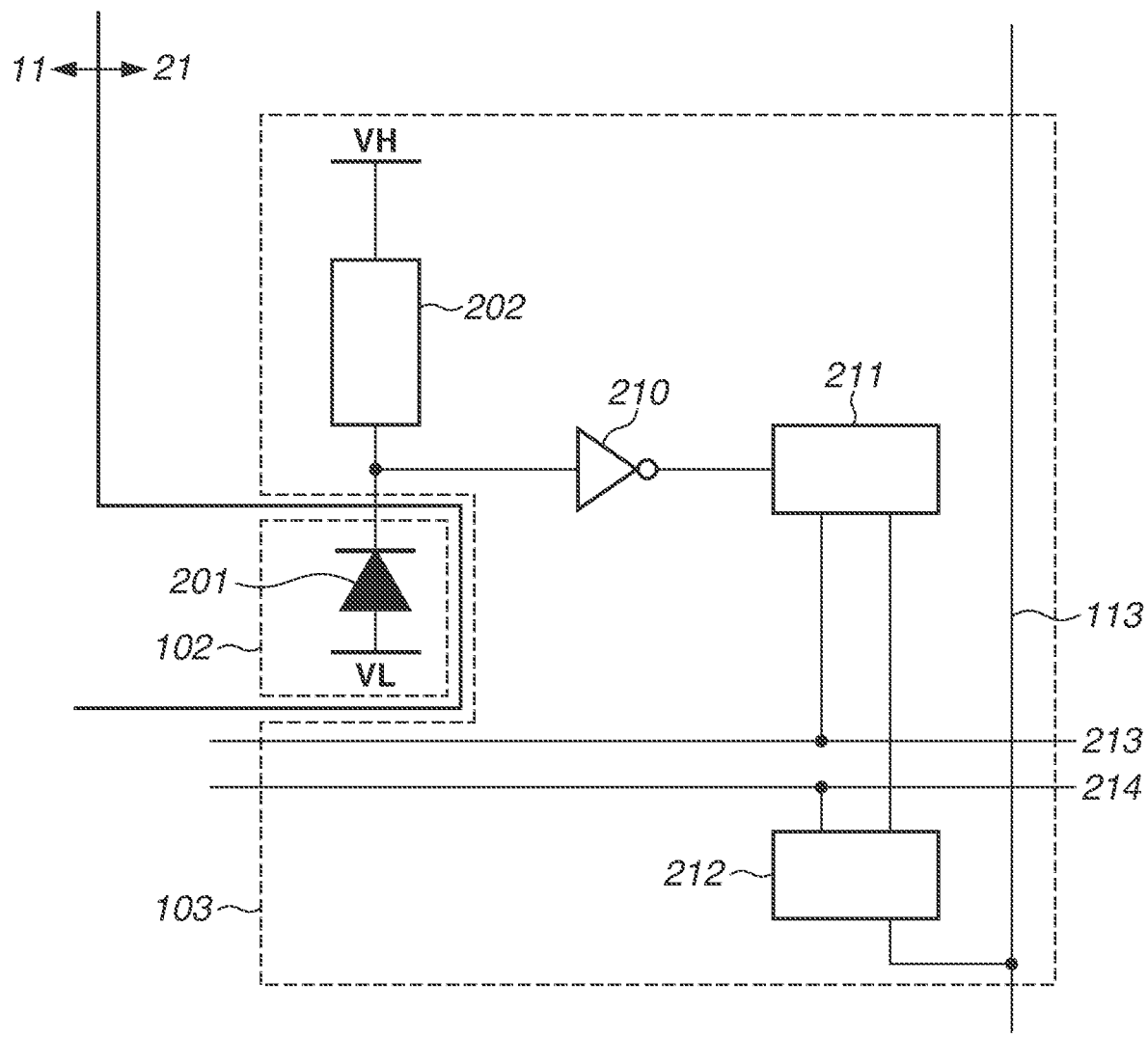
FIG. 4 is a block diagram including an equivalent circuit of a photoelectric conversion element.

FIG. 4 illustrates an example of a block diagram including an equivalent circuit of FIGS. 2 and 3.

In FIG. 2, the photoelectric conversion element 102 including an APD 201 is provided on the sensor substrate 11, and other members are provided on the circuit substrate 21.

The APD 201 generates a charge pair corresponding to incident light, by photoelectric conversion. A voltage VL (first voltage) is supplied to an anode of the APD 201. A voltage VH (second voltage) higher than the voltage VL supplied to the anode is supplied to a cathode of the APD 201. Inversely-biased voltages for causing the APD 201 to perform an avalanche multiplication operation are supplied to the anode and the cathode. By causing a state in which such voltages are supplied, a charge generated by incident light causes avalanche multiplication, and an avalanche current is generated.

In a case where inversely-biased voltages are supplied, the APD 201 is operated in a Geiger mode or a linear mode. In the Geiger mode, the APD 201 is operated with a potential difference between the anode and the cathode that is larger than a breakdown voltage. In the linear mode, the APD 201 is operated with a potential difference between the anode and the cathode that is near a breakdown voltage, or a voltage difference equal to or smaller than the breakdown voltage.

An APD operated in the Geiger mode will be referred to as a single photon avalanche photodiode (SPAD). For example, the voltage VL (first voltage) is −30 V and the voltage VH (second voltage) is 3 V. The APD 201 may be operated in the linear mode, or may be operated in the Geiger mode.

The quench element 202 is connected to the APD 201 and a power source that supplies the voltage VH. The quench element 202 functions as a load circuit (quench circuit) when a signal is multiplied by avalanche multiplication, and has a function of suppressing avalanche multiplication by reducing a voltage to be supplied to the APD 201 (quench operation). The quench element 202 also has a function of returning a voltage to be supplied to the APD 201, to the voltage VH (recharge operation) by flowing a current by an amount corresponding to a voltage drop caused by the quench operation.

The signal processing unit 103 includes a waveform shaping unit 210, a counter circuit 211, and a selection circuit 212. In this specification, the signal processing unit 103 is only required to include any of the waveform shaping unit 210, the counter circuit 211, and the selection circuit 212.

The waveform shaping unit 210 outputs a pulse signal by shaping a potential change of the cathode of the APD 201 that is obtained at the time of photon detection. For example, an inverter circuit is used as the waveform shaping unit 210. FIG. 4 illustrates an example in which one inverter is used as the waveform shaping unit 210, but a circuit in which a plurality of inverters is connected in series may be used, or another circuit having a waveform shaping effect may be used.

The counter circuit 211 counts the number of pulse signals output from the waveform shaping unit 210, and stores a count value. When a control pulse pRES is supplied via a drive line 213, the number of pulse signals that is stored in the counter circuit 211 is reset.

A control pulse pSEL is supplied to the selection circuit 212 from the vertical scanning circuit unit 110 illustrated in FIG. 3, via a drive line 214 illustrated in FIG. 4 (not illustrated in FIG. 3), and electric connection and disconnection between the counter circuit 211 and the signal line 113 are switched. The selection circuit 212 includes a buffer circuit for outputting a signal, for example.

Electric connection may be switched by arranging a switch such as a transistor between the quench element 202 and the APD 201, or between the photoelectric conversion element 102 and the signal processing unit 103. Similarly, the supply of the voltage VH or the voltage VL to be supplied to the photoelectric conversion element 102 may be electrically switched using a switch such as a transistor.

In the present exemplary embodiment, the configuration that uses the counter circuit 211 has been described. Nevertheless, the photoelectric conversion apparatus 100 may acquire a pulse detection timing using a time to digital converter (hereinafter, TDC) and a memory in place of the counter circuit 211. At this time, the generation timing of a pulse signal output from the waveform shaping unit 210 is converted into a digital signal by the TDC. For measuring the timing of a pulse signal, a control pulse pREF (reference signal) is supplied via a drive line to the TDC from the vertical scanning circuit unit 110 illustrated in FIG. 1. Based on the control pulse pREF, the TDC acquires a digital signal indicating an input timing of a signal output from each pixel via the waveform shaping unit 210, as a relative time.

Figure 5A:
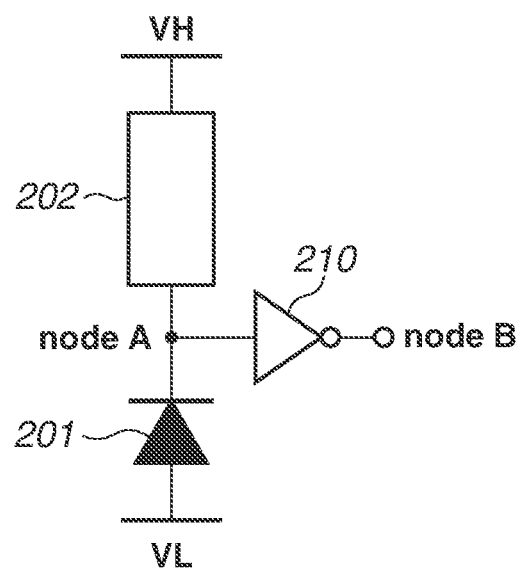
FIGS. 5A, 5B, and 5C are diagrams illustrating a relationship between an operation of an avalanche photodiode (APD) and an output signal.
Figure 5B:
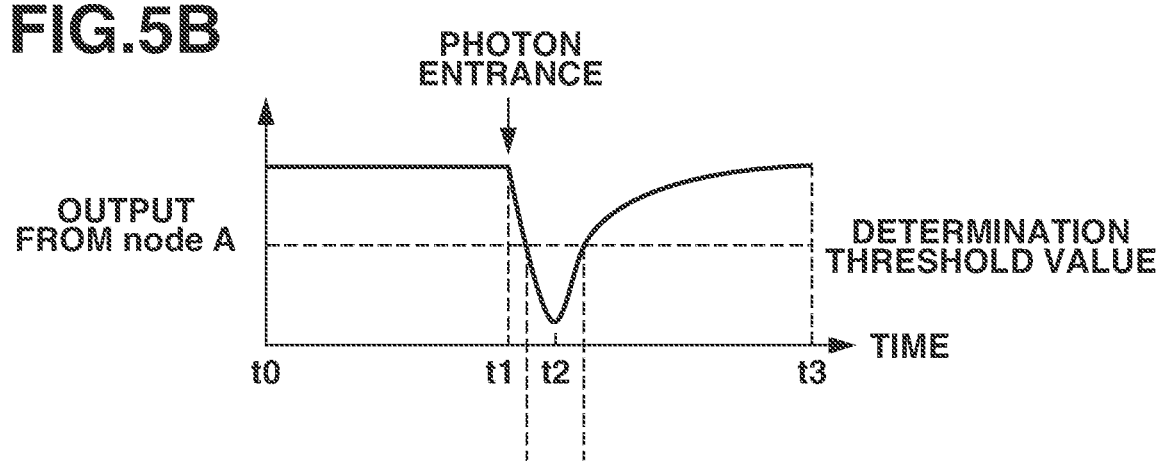
Figure 5C:
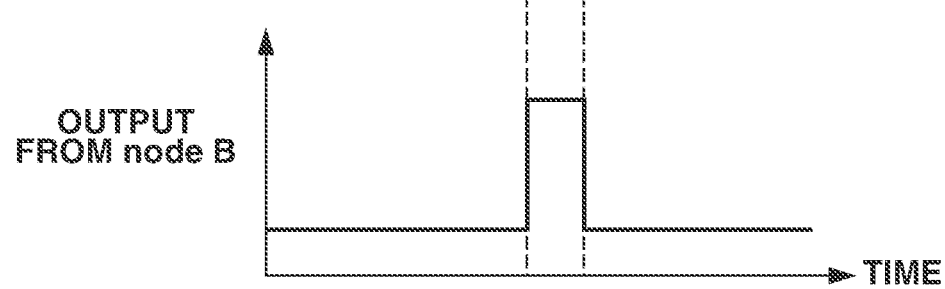

FIGS. 5A, 5B, and 5C are diagrams schematically illustrating a relationship between an operation of an APD and an output signal.

FIG. 5A is a diagram extracting the APD 201, the quench element 202, and the waveform shaping unit 210 illustrated in FIG. 4. In FIG. 5A, an input side of the waveform shaping unit 210 is regarded as a node A and an output side is regarded as a node B. FIG. 5B illustrates a waveform change of the node A in FIGS. 5A, and 5C illustrates a waveform change of the node B in FIG. 5A.

During a period from a time t0 to a time t1, a potential difference VH-VL is applied to the APD 201 in FIG. 5A. If a photon enters the APD 201 at the time t1, avalanche multiplication occurs in the APD 201, an avalanche multiplication current flows in the quench element 202, and a voltage at the node A drops. If a voltage drop amount further increases, and a potential difference applied to the APD 201 becomes smaller, avalanche multiplication of the APD 201 stops at a time t2, and a voltage level at the node A stops dropping from a certain fixed value. After that, during a period from the time t2 to a time t3, a current compensating for a voltage drop from the voltage VL flows to the node A, and the potential level of the node A is statically settled at the original potential level at the time t3. At this time, a portion with an output waveform exceeding a certain threshold value at the node A is subjected to waveform shaping performed by the waveform shaping unit 210, and output as a signal at the node B.

The arrangement of the signal lines 113, and the arrangement of the readout circuit 112 and the output circuit 114 are not limited to those illustrated in FIG. 3. For example, the signal lines 113 may be arranged by being extended in a row direction, and the readout circuit 112 may be arranged at the ends of the extending signal lines 113.

Hereinafter, a photoelectric conversion apparatus of each exemplary embodiment will be described.

Figure 6:
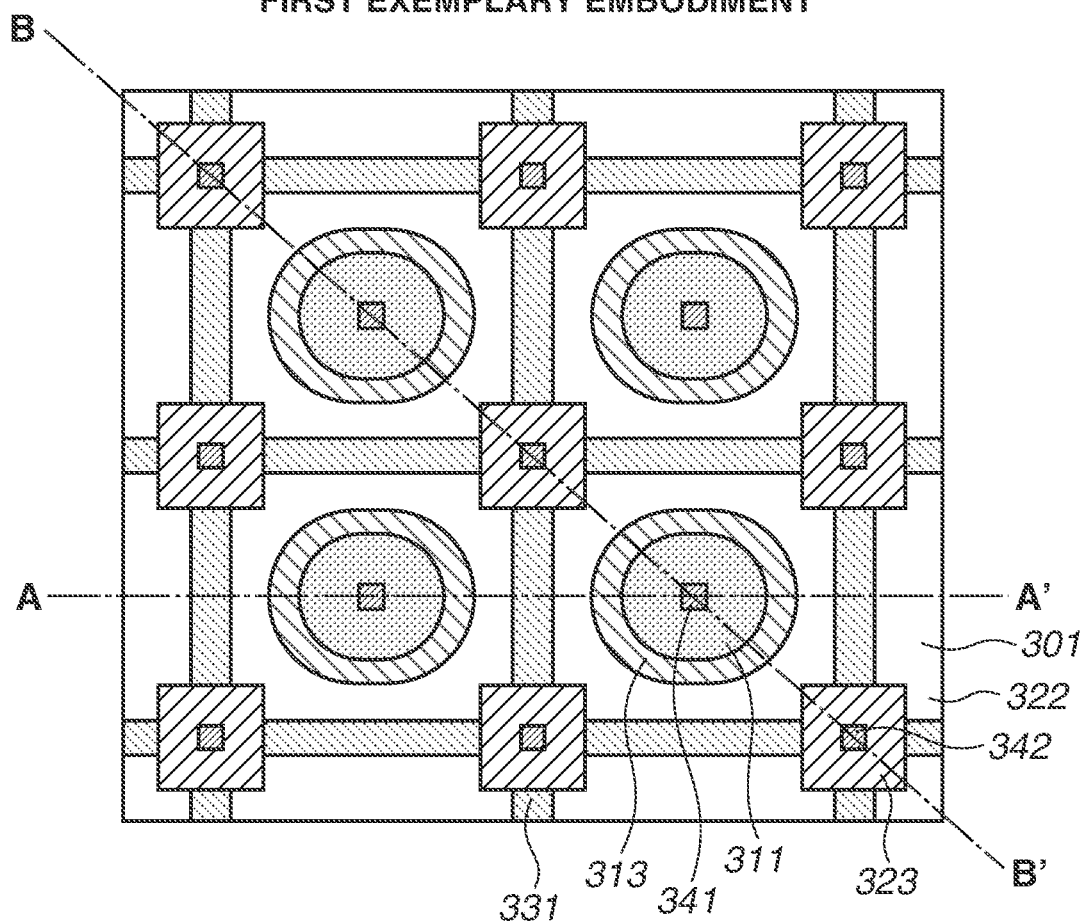
FIG. 6 is a pixel plan view according to a first exemplary embodiment.
Figure 7A:
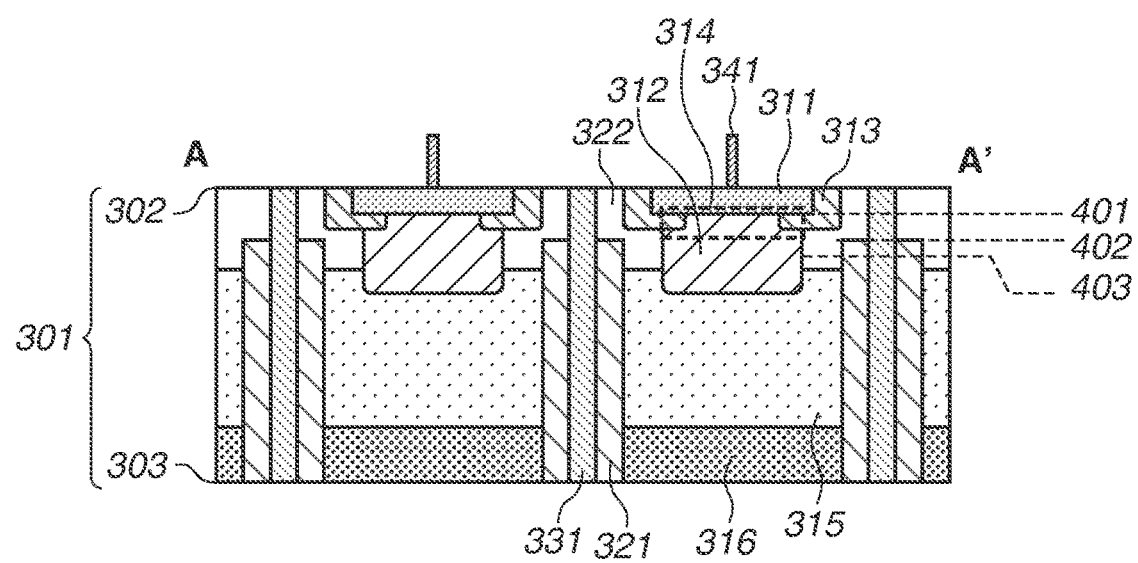
FIGS. 7A and 7B are pixel cross-sectional views according to the first exemplary embodiment.
Figure 7B:
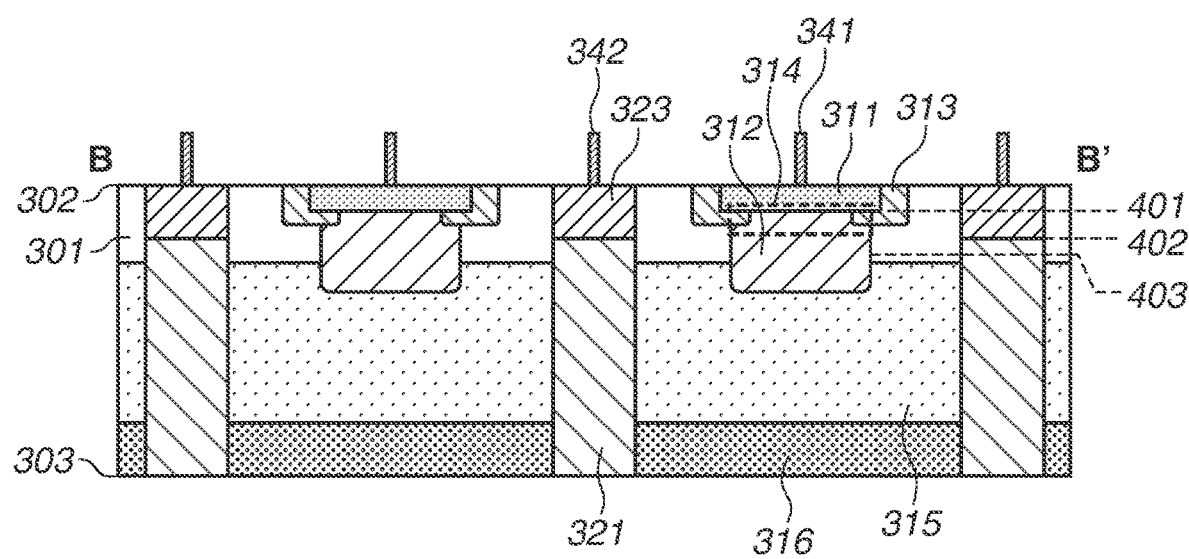

A first exemplary embodiment will be described. FIG. 6 is an enlarged plan view of a pixel portion of a photoelectric conversion apparatus according to the first exemplary embodiment. FIG. 6 is a diagram illustrating APDs arrayed on a two-dimensional plane. In the present exemplary embodiment, because each pixel includes one APD, FIG. 6 is a plan view of a pixel portion in which 2×2 pixels are arrayed. FIG. 7A illustrates a cross-sectional view taken along a broken line A-A' in FIG. 6, and FIG. 7B illustrates a cross-sectional view taken along a broken line B-B' in FIG. 6. The reference numerals allocated in FIG. 6 correspond to the reference numerals allocated in FIGS. 7A and 7B. The details of each portion will be described with reference to FIGS. 7A and 7B.

In a planar view, a first APD and a third APD are arranged in a first direction, and the third APD and a second APD are arranged in a second direction orthogonal to the first direction. In FIG. 6, the first APD and the third APD are arranged in a side facing direction, and the first APD and the second APD are arranged in a diagonal direction. For example, in FIG. 6, the top-left APD is the first APD, the top-right APD is the third APD, and the bottom-right APD is the second APD. In FIG. 6, a distance between a first semiconductor region 311 of the first APD and the first semiconductor region 311 of the second APD is longer than a distance between the first semiconductor region 311 of the first APD and the first semiconductor region 311 of the third APD.

In the semiconductor layer 301 illustrated in FIG. 7A, the first semiconductor region 311 of the first conductivity type and a second semiconductor region 312 of the second conductivity type are arranged. The first semiconductor region 311 and the second semiconductor region 312 form PN junction, and form an APD which forms an avalanche multiplication unit. A contact plug 341 that supplies the voltage VL is formed in the first semiconductor region 311. The semiconductor layer 301 has a surface (first surface) 302 on which the contact plug 341 is formed, and a surface (second surface) 303 opposite to the first surface 302. In the present exemplary embodiment, the second surface 303 serves as a light incidence surface. As described above, the light incidence surface is a surface viewed macroscopically, and the first surface 302 and the second surface 303 need not be parallel surfaces.

An isolation region 331 for preventing avalanche crosstalk is formed between neighboring pixels in FIG. 7A. The isolation region 331 includes a trench structure. It is desirable that the inside of the trench structure is formed of material that increases a reflectance with respect to a photon generated by an avalanche multiplication unit 314, or material absorbing the generated photon. The isolation region 331 includes, for example, a deep trench isolation (DTI), and insulating material arranged inside the DTI. The isolation region 331 including the insulating material prevents a photon emitted in a high electric field region of the avalanche multiplication unit 314, from getting mixed into a neighboring pixel. The material of the isolation region 331 is not limited to this. The isolation region 331 in which metal material such as copper or tungsten is arranged inside the trench structure may be used. This can enhance a light shielding property between pixels. The isolation region 331 having a configuration in which a trench structure is arranged and air (e.g., void) exists inside the trench structure may be used.

The DTI may penetrate through the semiconductor layer 301 from the first surface 302 to the second surface 303. In a case where the DTI is formed from the second surface 303, the DTI may be arranged in such a manner that an end portion of the DTI is located at a position inside the semiconductor layer 301 without reaching the first surface 302. In this case, it is desirable that the end portion of the DTI is located at a position at least shallower than the depth of the avalanche multiplication unit 314. In this specification, a depth direction is a direction heading for the second surface 303 from the first surface 302. With such arrangement of the end portion of the DTI, avalanche crosstalk can be prevented. It is desirable that the DTI is provided in such a manner as to penetrate through the semiconductor layer 301. In the present exemplary embodiment, the description has been given of an example in which the trench structure including the DTI is provided as the isolation region 331, but the isolation region 331 is a member provided optionally, and the present invention encompasses a configuration in which the isolation region 331 is not provided.

A third semiconductor region 321 of the second conductivity type is arranged in a side wall portion of the isolation region 331. The third semiconductor region 321 has a function of isolating neighboring pixels. In a case where the isolation region 331 is provided, the third semiconductor region 321 also has a function of reducing a dark current generated in the side wall portion of the isolation region 331.

In the present exemplary embodiment, the third semiconductor region 321 is arranged on the second surface 303 side of a depth 402 serving as a boundary. In this manner, the first semiconductor region 311 of the first conductivity type and the third semiconductor region 321 of the second conductivity type are formed at different depths. The third semiconductor region 321 is arranged from the second surface 303 up to the depth 402 in such a manner as to contact a side wall of the isolation region 331, and is not arranged between the depth 402 to the first surface 302.

In a case where the first semiconductor region 311 of the first conductivity type and the third semiconductor region 321 of the second conductivity type are partially formed at the same depth, a distance between the first semiconductor region 311 and the third semiconductor region 321 becomes narrower in accordance with the miniaturization of a pixel size. Electric field concentration thereby occurs between the first semiconductor region 311 and the third semiconductor region 321, and a dark count rate (DCR) worsens.

In contrast to this, in the structure of the present exemplary embodiment, the first semiconductor region 311 of the first conductivity type and the third semiconductor region 321 of the second conductivity type are formed at different depths. For example, in FIG. 7A, the top surface of the third semiconductor region 321 of the second conductivity type is located inferior to the bottom surface of the first semiconductor region 311 of the first conductivity type. Thus, even in a case where a pixel size miniaturized, a distance between the two semiconductor regions can be made larger as compared with a case where the two semiconductor regions are formed at the same depth. DCR worsening caused by electric field concentration between the first semiconductor region 311 and the third semiconductor region 321 can be consequently prevented.

The depth 402 is located at a position deeper than a depth 401 corresponding to a PN junction surface of an APD. On the other hand, the depth 402 is located at a position shallower than a depth 403 at which the second semiconductor region 312 is arranged. The depth 403 indicates a position corresponding to a half of a depth occupied by the second semiconductor region 312.

Among dark currents generated in the side wall portion of the isolation region 331, a dark current charge generated at a position shallower than the depth 402 flows into the first semiconductor region 311 via a fifth semiconductor region 313 having a potential lower than that of the avalanche multiplication unit 314. The dark current component does not pass through the avalanche multiplication unit 314. Thus, the dark current charge is not subjected to avalanche multiplication, and not detected as a signal of the APD. The dark current charge is therefore not counted as a DCR. For this reason, even if the top surface of the second semiconductor region 312 does not reach the first surface 302, the problem of DCR does not occur.

The fifth semiconductor region 313 of the first conductivity type or the second conductivity type for easing electric field concentration is arranged at both end portions of the first semiconductor region 311. At this time, an impurity concentration of the fifth semiconductor region 313 is set to an impurity concentration lower than an impurity concentration of the first semiconductor region 311. For example, in a case where an impurity concentration of the first semiconductor region 311 is equal to or larger than $6.0 \times 10^{18}$ [atms/cm$^3$], an impurity concentration of the fifth semiconductor region 313 is equal to or larger than $1.0 \times 10^{16}$ [atms/cm$^3$] and equal to or smaller than $1.0 \times 10^{18}$ [atms/cm$^3$]. In this specification, an impurity concentration refers to a net impurity concentration of a predetermined impurity, and refers to a NET doping concentration.

A sixth semiconductor region 315 of the second conductivity type is arranged in a region deeper than the second semiconductor region 312, and a seventh semiconductor region 316 of the second conductivity type is arranged in a region deeper than the sixth semiconductor region 315. At this time, an impurity concentration of the second conductivity type of the seventh semiconductor region 316 is set to a higher impurity concentration than that of the sixth semiconductor region 315. With this configuration, a charge photoelectrically-converted by the sixth semiconductor region 315 passes through the avalanche multiplication unit 314 arranged on the first surface 302 side, without escaping toward the second surface 303 side. A signal charge can be thereby efficiently read out and counted as a signal of the APD.

FIG. 7B is a cross-sectional view taken along the broken line B-B' corresponding to the diagonal direction in FIG. 6. FIG. 7B is different from FIG. 7A in that the isolation region 331 is not arranged between neighboring avalanche multiplication units. Because avalanche crosstalk increases as a distance between neighboring avalanche multiplication units becomes closer, a prevention effect of avalanche crosstalk becomes higher by forming an isolation region between neighboring avalanche multiplication units in the side facing direction rather than forming an isolation region between neighboring avalanche multiplication units in the diagonal direction. As described above, the isolation region 331 is an isolation region including an insulating film such as an oxidized film. By employing a structure in which the isolation region 331 is not arranged between diagonally-arranged avalanche multiplication units, a contact plug 342 for supplying the voltage VH to the APD can be formed. Then, the contact plug 342 can be shared by different avalanche multiplication units.

When a carrier is subjected to avalanche multiplication, avalanche crosstalk of causing a photon emitted in the high electric field region to leak into a neighboring pixel sometimes occurs. Japanese Patent Application Laid-Open No. 2018-201005 discusses preventing avalanche crosstalk by providing a trench structure as an inter-pixel isolation region and arranging an insulator inside the trench structure. Japanese Patent Application Laid-Open No. 2018-201005 also discusses forming a third semiconductor region of the second conductivity type in a side wall portion of the inter-pixel isolation region, and supplying a voltage to the third semiconductor region from a contact connected to an anode.

For reducing contact resistance with the semiconductor layer 301, an eighth semiconductor region 323 of the second conductivity type is arranged below the contact plug 342. At this time, an impurity concentration of the eighth semiconductor region 323 may be a level equivalent to an impurity concentration of the third semiconductor region 321. Alternatively, an impurity concentration of the eighth semiconductor region 323 may be higher than an impurity concentration of the third semiconductor region 321. A distance between the eighth semiconductor region 323 and the first semiconductor region 311 in the diagonal direction becomes lager than that in the side facing direction. This can suppress the generation of electric field concentration between the first semiconductor region 311 and the eighth semiconductor region 323, and prevent DCR worsening attributed to the electric field concentration. In view of the foregoing, the contact plug 342 and the eighth semiconductor region 323 are arranged not between pixels in the side facing direction but between pixels in the diagonal direction in a planar view as illustrated in FIG. 6.

In FIG. 7B, the voltage VL is applied to the first semiconductor region 311 via the contact plug 341, and the voltage VH is applied to the eighth semiconductor region 323 via the contact plug 342. A potential applied to the eighth semiconductor region 323 is supplied to the second semiconductor region 312 via the third semiconductor region 321 and the sixth semiconductor region 315. Inversely-biased voltages are consequently applied to the first semiconductor region 311 of the first conductivity type and the second semiconductor region 312 of the second conductivity type, and the avalanche multiplication unit 314 can be formed.

In FIG. 7B, the contact plug 342 is arranged on the first surface 302 side, but a potential may be supplied to the third semiconductor region 321 from the second surface 303 side. In this case, because it becomes unnecessary to arrange the eighth semiconductor region 323, a distance between the avalanche multiplication units 314 in the diagonal direction can be made closer.

In FIG. 6, an avalanche multiplication unit is arranged in a circular shape, and the third semiconductor region 321 provided below the eighth semiconductor region 323 is arranged in a rectangle in a planar view, but the present exemplary embodiment is not limited to this. For example, shapes of the first semiconductor region 311 and the third semiconductor region 321 in a planar view may be made the same. In this case, the contact plug 342 is desirably arranged on the second surface 303 side.

A planarization layer, a filter layer, and a microlens, which are not illustrated, may be arranged on the back surface of the semiconductor layer 301. Various optical filters such as a color filter, an infrared light cut filter, and a monochrome filter can be used as a filter layer. An RGB color filter or an RGBW color filter can be used as a color filter.

With the above-described configuration, according to the first exemplary embodiment, it is possible to realize an APD that achieves miniaturization of a pixel size. Because the isolation region 331 is provided, it is also possible to prevent avalanche crosstalk.

Figure 9A:
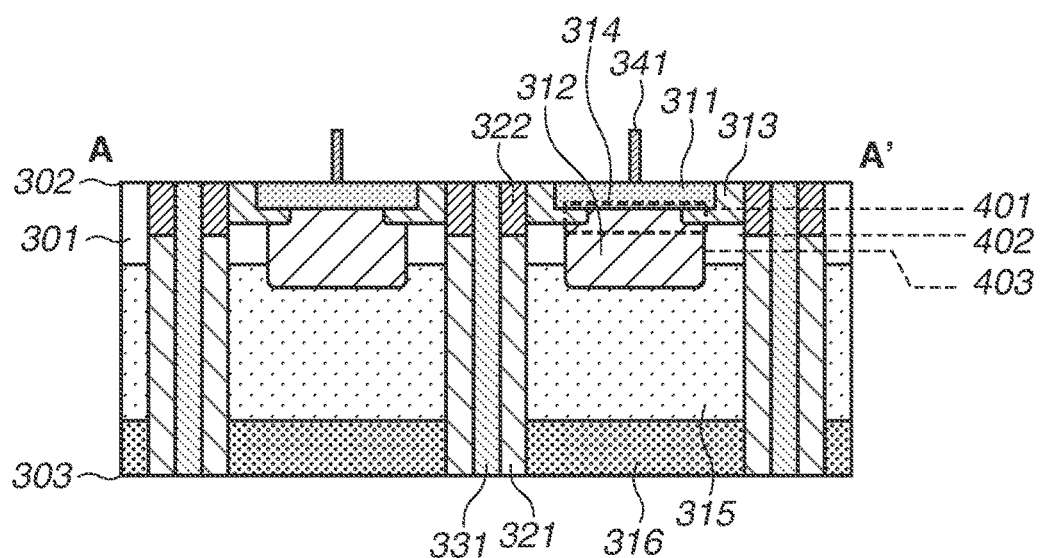
FIGS. 9A and 9B are pixel cross-sectional views according to the second exemplary embodiment.
Figure 9B:
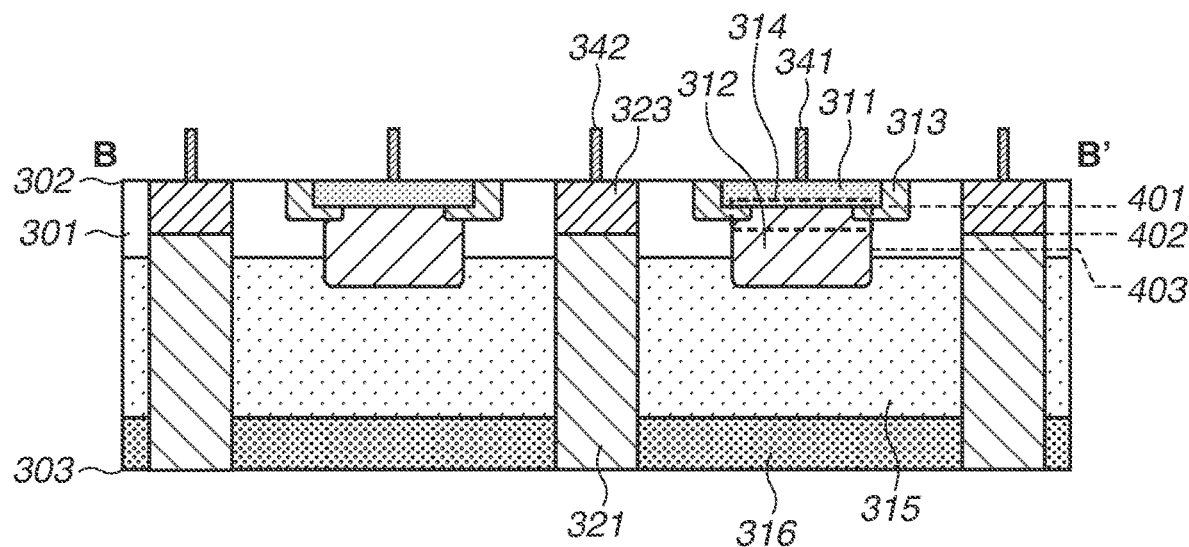

A photoelectric conversion apparatus according to a second exemplary embodiment will be described with reference to FIGS. 8, 9A, and 9B. FIG. 8 is a plan view of a photoelectric conversion apparatus according to the present exemplary embodiment, and is a diagram illustrating 2×2 APDs arrayed on a two-dimensional plane. FIG. 9A illustrates a cross-sectional view taken along a broken line A-A' in FIG. 8, and FIG. 9B illustrates a cross-sectional view taken along a broken line B-B' in FIG. 8.

The photoelectric conversion apparatus according to the present exemplary embodiment is different from that of the first exemplary embodiment in that a fourth semiconductor region 322 is arranged between the first surface 302 and the depth 402 in the side wall portion of the isolation region 331. Because the photoelectric conversion apparatus according to the present exemplary embodiment is substantially the same as that of the first exemplary embodiment except for this point and the point to be described below, the description will be omitted.

The fourth semiconductor region 322 is arranged on the first surface 302 side of the depth 402 serving as a boundary. At least one of a conductivity type and an impurity concentration of the fourth semiconductor region 322 is different from that of the third semiconductor region 321. The fourth semiconductor region 322 may be a semiconductor region of the first conductivity type, may be a semiconductor region of the second conductivity type, or may be an intrinsic semiconductor region. In a case where the fourth semiconductor region 322 is a semiconductor region of the second conductivity type, an impurity concentration of the second conductivity type of the fourth semiconductor region 322 is set to an impurity concentration lower than that of the third semiconductor region 321. For example, an impurity concentration of the third semiconductor region 321 and an impurity concentration of the fourth semiconductor region 322 are different by quadruple or more. As an example, in a case where an impurity concentration of the third semiconductor region 321 is $1.0 \times 10^{17}$ [atms/cm$^3$], an impurity concentration of the fourth semiconductor region 322 is $1.0 \times 10^{16}$ [atms/cm$^3$]. In a case where the fourth semiconductor region 322 is a semiconductor region of the first conductivity type, an impurity concentration of the first conductivity type of the fourth semiconductor region 322 is set to an impurity concentration lower than that of the first semiconductor region 311. For example, an impurity concentration of the fourth semiconductor region 322 and an impurity concentration of the first semiconductor region 311 are different by decuple or more. As an example, in a case where an impurity concentration of the first semiconductor region 311 is $6.0\times10^{18}$ [atms/cm$^3$], an impurity concentration of the fourth semiconductor region 322 is $1.0\times10^{16}$ [atms/cm$^3$]. An impurity concentration of the fourth semiconductor region 322 may be at a level equivalent to that of the semiconductor layer 301 irrespective of its polarity.

It is desirable that the fourth semiconductor region 322 is a semiconductor region of the second conductivity type. In a case where the depth 402 is arranged at a position deeper than the depth 403, among dark currents generated in the side wall portion of the isolation region 331, a part of dark currents generated at the depth at which the third semiconductor region 321 is not arranged pass through the avalanche multiplication unit 314. Thus, DCR worsening occurs.

Nevertheless, by arranging the depth 402 at a position shallower than the depth 403 as illustrated in FIG. 9A, among dark currents generated in the side wall portion of the isolation region 331, dark current charges generated at positions deeper than the depth 402 are recombined in the third semiconductor region 321 of the second conductivity type. Thus, DCR worsening can be prevented.

According to the present exemplary embodiment, it is possible to realize an APD that achieves miniaturization of a pixel size. Because the isolation region 331 is provided, it is also possible to prevent avalanche crosstalk.

Figure 10:
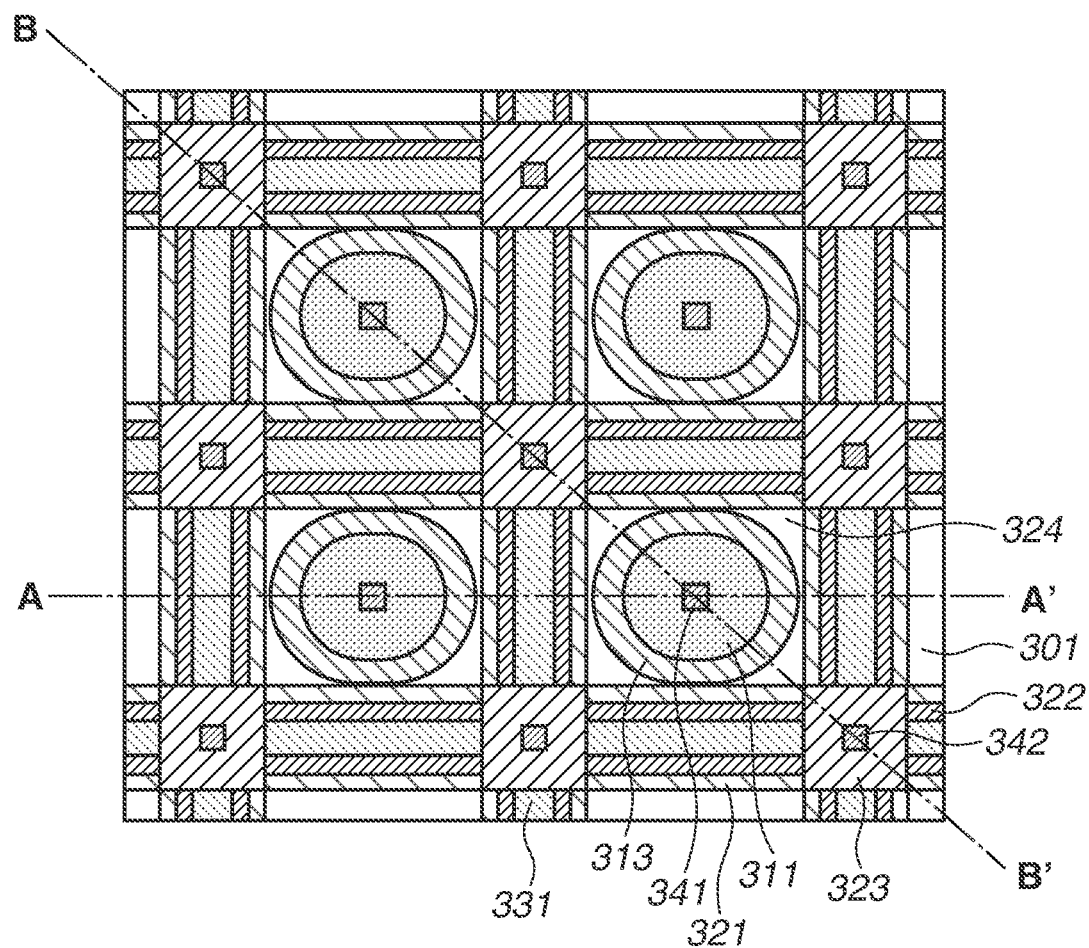
FIG. 10 is a pixel plan view according to a third exemplary embodiment.
Figure 11A:
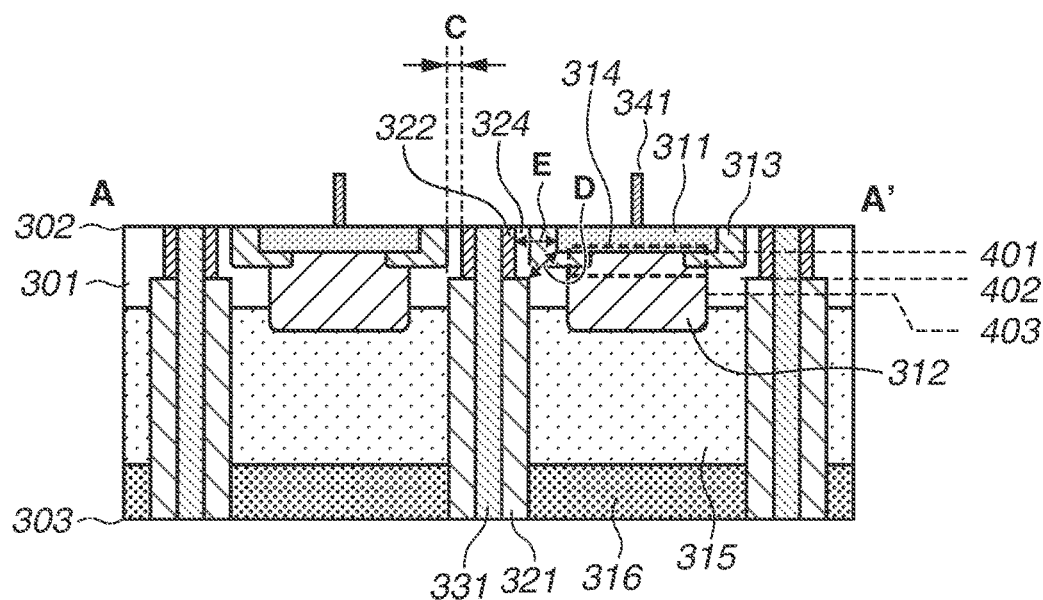
FIGS. 11A and 11B are pixel cross-sectional views according to the third exemplary embodiment.
Figure 11B:
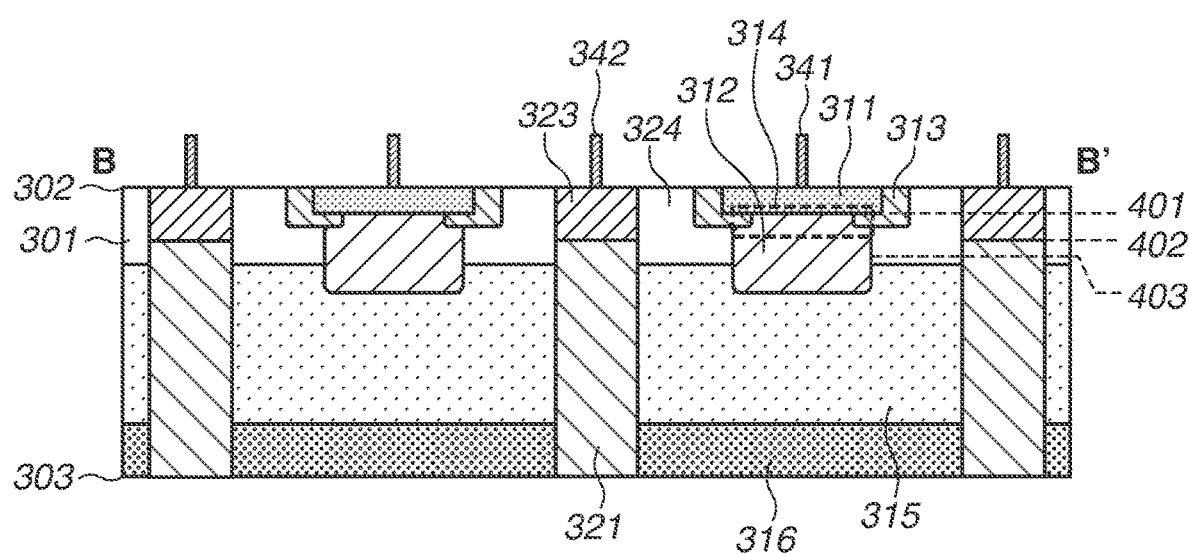

A photoelectric conversion apparatus according to a third exemplary embodiment will be described with reference to FIGS. 10, 11A, and 11B. FIG. 10 is a plan view of a photoelectric conversion apparatus according to the present exemplary embodiment, and is a diagram illustrating 2×2 APDs arrayed on a two-dimensional plane. FIG. 11A illustrates a cross-sectional view taken along a broken line A-A' in FIG. 10, and FIG. 11B illustrates a cross-sectional view taken along a broken line B-B' in FIG. 10.

The photoelectric conversion apparatus according to the present exemplary embodiment is different from that of the second exemplary embodiment in that a width of the fourth semiconductor region 322 is narrower than a width of the third semiconductor region 321 in a planar view. Because the photoelectric conversion apparatus according to the present exemplary embodiment is substantially the same as that of the second exemplary embodiment except for this point and the point to be described below, the description will be omitted.

In this specification, a "width of a semiconductor region" refers a length in a direction orthogonal to the depth direction. For example, a width of the fourth semiconductor region 322 in FIG. 11A refers a length in a direction heading for the first semiconductor region 311 from an interfacial surface between the isolation region 331 and the fourth semiconductor region 322 in one cross-section in the depth direction.

As illustrated in FIGS. 10 and 11A, a width (protruding amount) of the fourth semiconductor region 322 is smaller by an offset C than a width (protruding amount) of the third semiconductor region 321 with respect to the isolation region 331. More specifically, in a planar view, a distance from the isolation region 331 to an end on the first semiconductor region 311 side of the fourth semiconductor region 322 is smaller than a distance from the isolation region 331 to an end on the first semiconductor region 311 side of the third semiconductor region 321. The end on the first semiconductor region 311 side of the fourth semiconductor region 322 refers to an interfacial surface between the fourth semiconductor region 322 and a semiconductor region 324 located between the fifth semiconductor region 313 and the fourth semiconductor region 322. The semiconductor region 324 is a semiconductor region having a conductivity type and an impurity concentration, at least one of which is different from those of the fourth semiconductor region 322 and the fifth semiconductor region 313. For example, the semiconductor region 324 is a semiconductor region of the first conductivity type having an impurity concentration lower than that of the fifth semiconductor region 313. The end on the first semiconductor region 311 side of the third semiconductor region 321 refers to an interfacial surface between the third semiconductor region 321 and the sixth semiconductor region 315.

In the present exemplary embodiment, in a case where the fourth semiconductor region 322 is a semiconductor region of the first conductivity type, the fourth semiconductor region 322 may have an impurity concentration equivalent to that of the first semiconductor region 311. In the present exemplary embodiment, in a case where the fourth semiconductor region 322 is a semiconductor region of the second conductivity type, the fourth semiconductor region 322 may have an impurity concentration equivalent to that of the third semiconductor region 321.

Even when the fourth semiconductor region 322 has an impurity concentration equivalent to that of each semiconductor region, if a distance E between the first semiconductor region 311 and the fourth semiconductor region 322 is equivalent to a distance D between the first semiconductor region 311 and the third semiconductor region 321, an effect similar to that of the first exemplary embodiment can be obtained.

The fourth semiconductor region 322 may be an intrinsic semiconductor region, may be a semiconductor region of the first conductivity type having an impurity concentration lower than that of the first semiconductor region 311, or may be a semiconductor region of the second conductivity type having an impurity concentration lower than that of the third semiconductor region 321.

According to the present exemplary embodiment, it is possible to realize an APD that achieves miniaturization of a pixel size. Because the isolation region 331 is provided, it is also possible to prevent avalanche crosstalk. Furthermore, because a width of the fourth semiconductor region 322 is made smaller, further miniaturization of a pixel size can be achieved than the second exemplary embodiment.

Figure 12:
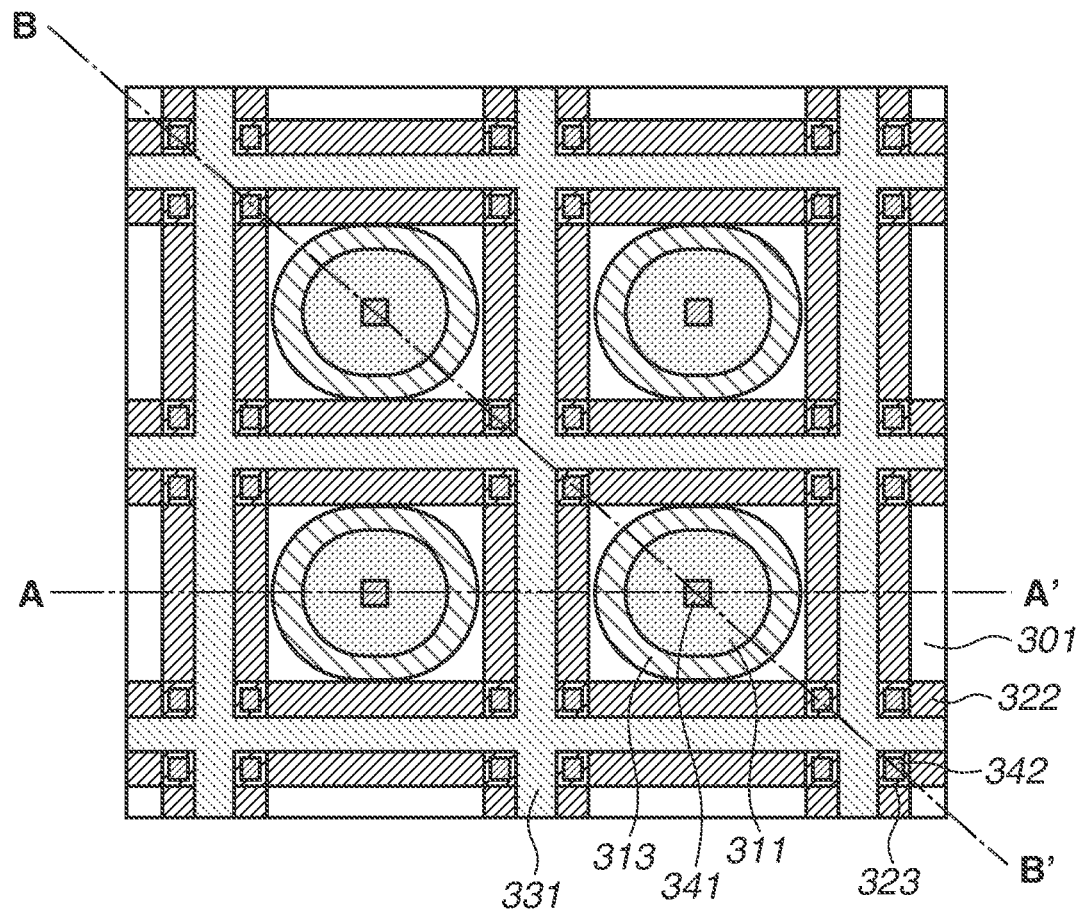
FIG. 12 is a pixel plan view according to a fourth exemplary embodiment.
Figure 13A:
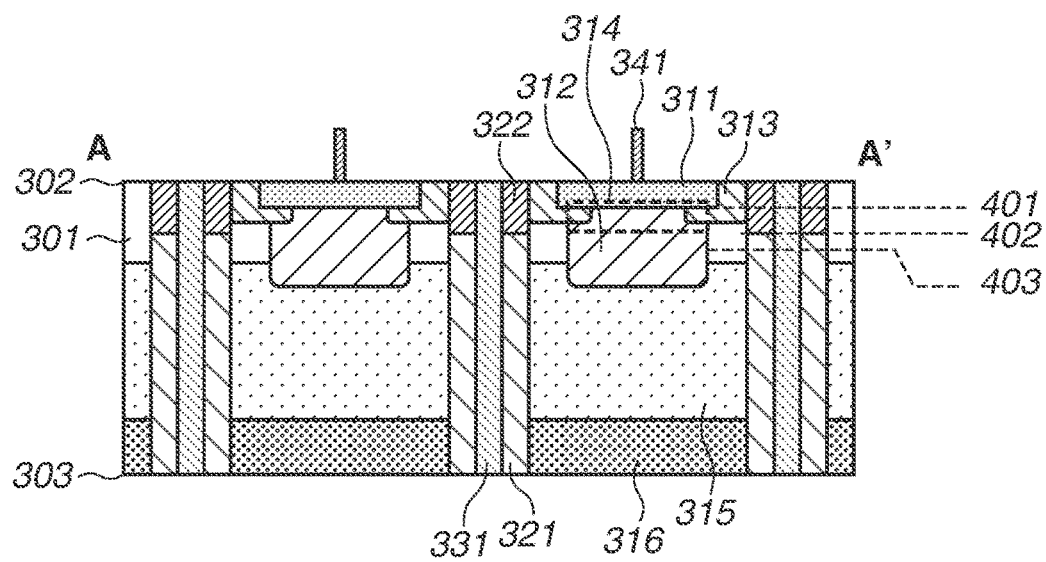
FIGS. 13A and 13B are pixel cross-sectional views according to the fourth exemplary embodiment.
Figure 13B:
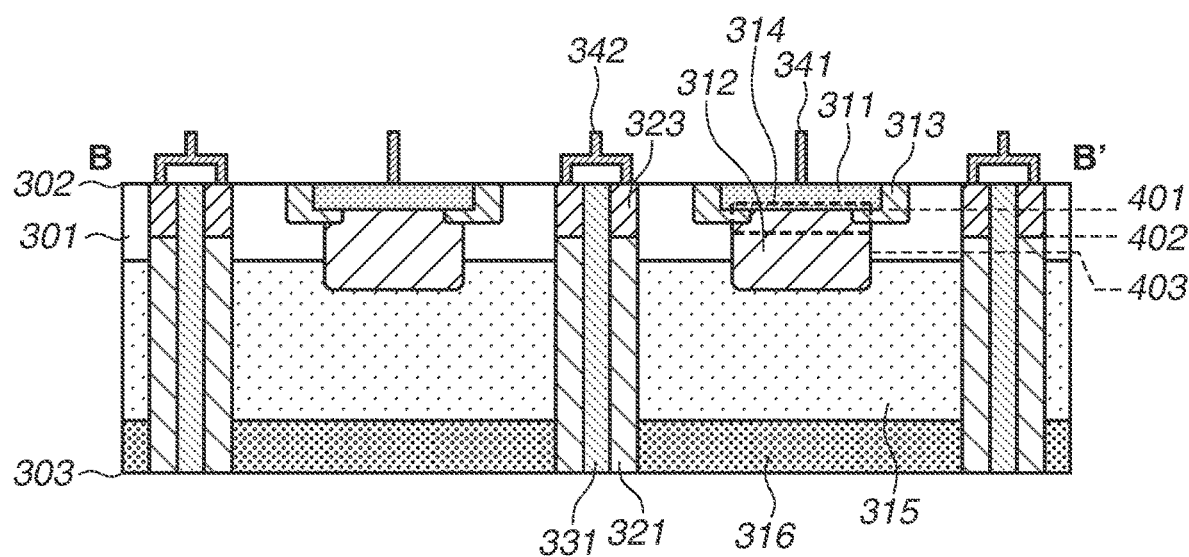

A photoelectric conversion apparatus according to a fourth exemplary embodiment will be described with reference to FIGS. 12, 13A, and 13B. FIG. 12 is a plan view of a photoelectric conversion apparatus according to the fourth exemplary embodiment, and is a diagram illustrating 2×2 APDs arrayed on a two-dimensional plane. FIG. 13A illustrates a cross-sectional view taken along a broken line A-A' in FIG. 12, and FIG. 13B illustrates a cross-sectional view taken along a broken line B-B' in FIG. 12. The reference numerals allocated in FIG. 12 correspond to the reference numerals allocated in FIGS. 13A and 13B.

The photoelectric conversion apparatus according to the present exemplary embodiment is different from that of the second exemplary embodiment in that the isolation region 331 is arranged also between neighboring pixels in the diagonal direction in a cross-section taken along the broken line B-B' in FIG. 12. Because the photoelectric conversion apparatus according to the present exemplary embodiment is substantially the same as that of the second exemplary embodiment except for this point and the point to be described below, the description will be omitted.

In the present exemplary embodiment, the isolation region 331 is arranged between pixels not only in the side facing direction but also in the diagonal direction in a planar view. In other words, the isolation region 331 is arranged between APDs also in the cross-section taken along the broken line B-B'.

In the second exemplary embodiment, the contact plug 342 arranged between neighboring pixels in the diagonal direction are shared by four pixels, and the number of contact plugs that supply the voltage VH is substantially one for one pixel. On the other hand, in the present exemplary embodiment, because the isolation region 331 including a buried insulating film is arranged between neighboring pixels in the diagonal direction, as illustrated in FIG. 12, APDs are to be arranged with an offset from the center between neighboring pixels in the diagonal direction in a planar view. In the example illustrated in FIG. 12, four contact plugs 342 are allocated to one pixel, but the number of contact plugs 342 needs not be always four. It is sufficient that one contact plug that supplies the voltage VH is provided for one pixel. Alternatively, one contact plug that supplies the voltage VH may be shared by a plurality of pixels.

In the second exemplary embodiment, among photons emitted by the avalanche multiplication unit 314, photons progressing in the diagonal direction corresponding to the broken line B-B' in FIG. 12 might cause avalanche crosstalk. In the present exemplary embodiment, the isolation region 331 is arranged between pixels also in the diagonal direction. It is therefore possible to prevent avalanche crosstalk between neighboring pixels in the diagonal direction.

According to the present exemplary embodiment, it is possible to realize an APD that achieves miniaturization of a pixel size. Because an isolation region is provided, it is also possible to prevent avalanche crosstalk. In particular, it is also possible to prevent avalanche crosstalk between neighboring pixels in the diagonal direction.

Figure 14:
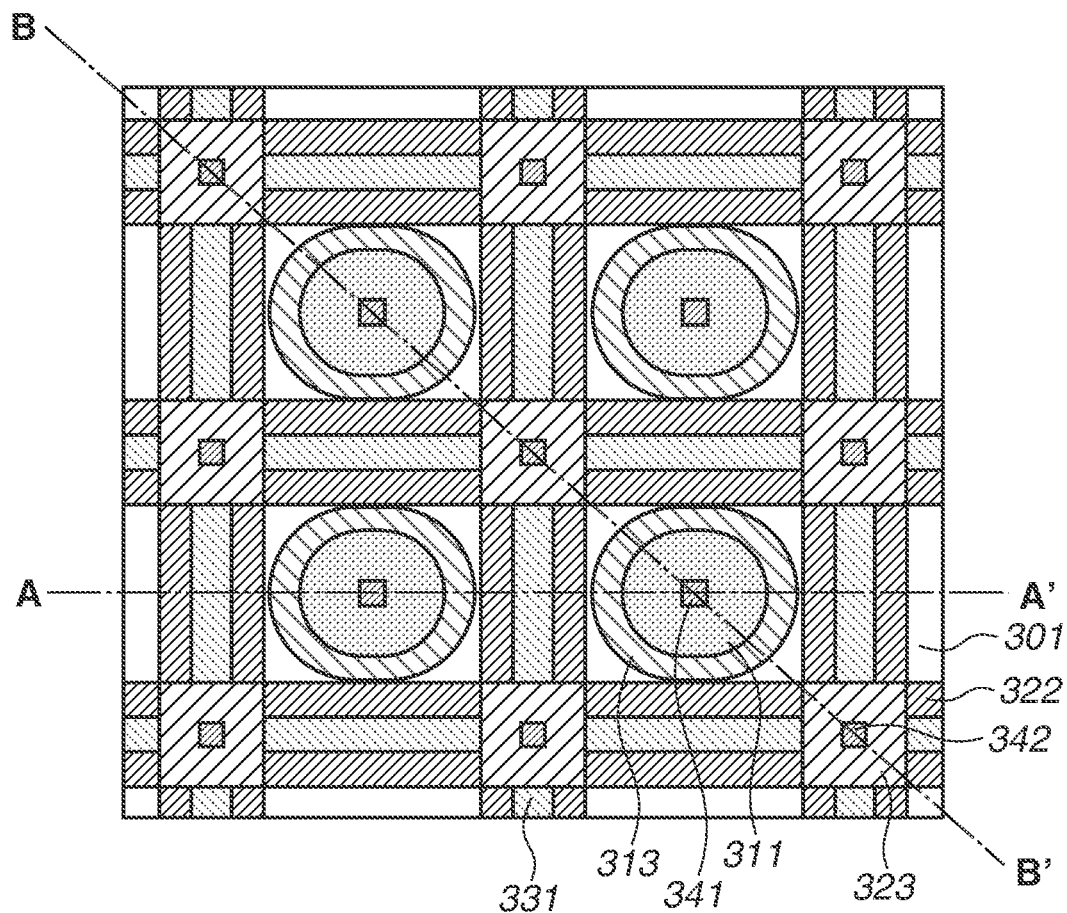
FIG. 14 is a pixel plan view according to a fifth exemplary embodiment.
Figure 15A:
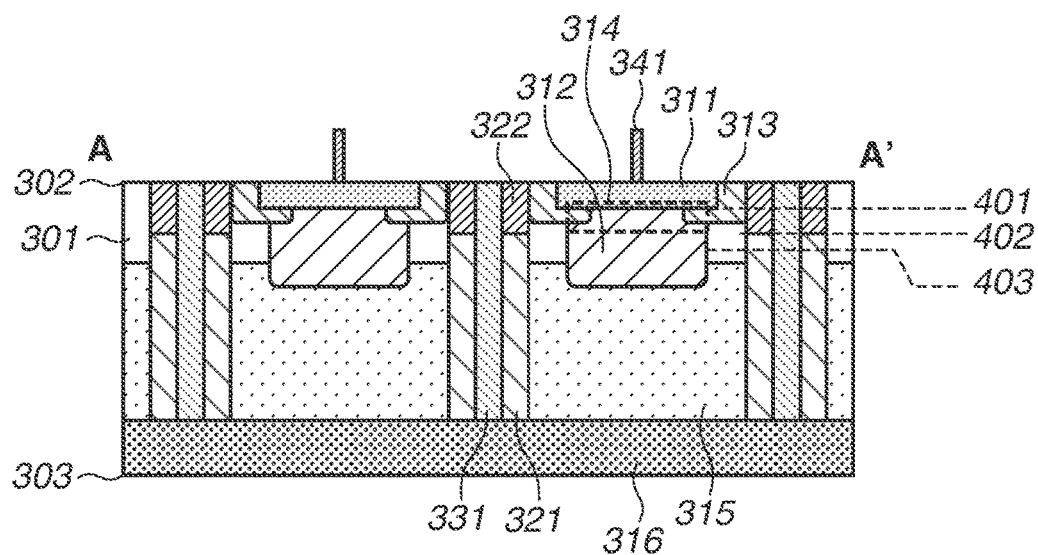
FIGS. 15A and 15B are pixel cross-sectional views according to the fifth exemplary embodiment.
Figure 15B:
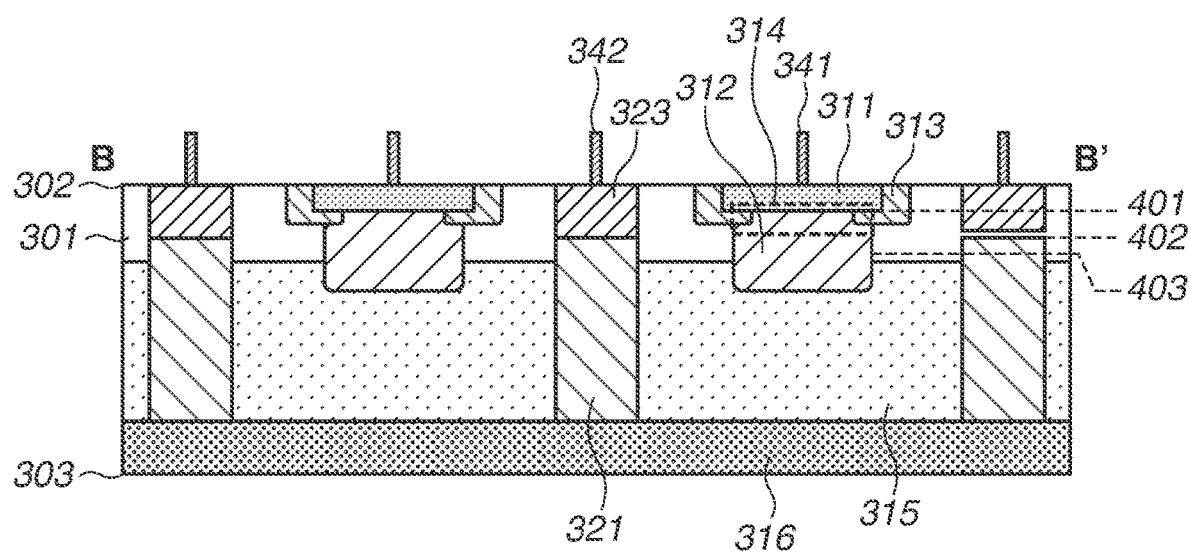

A photoelectric conversion apparatus according to a fifth exemplary embodiment will be described with reference to FIGS. 14, 15A, and 15B. FIG. 14 is a plan view of a photoelectric conversion apparatus according to the fifth exemplary embodiment, and is a diagram illustrating 2×2 APDs arrayed on a two-dimensional plane. FIG. 15A illustrates a cross-sectional view taken along a broken line A-A' in FIG. 14, and FIG. 15B illustrates a cross-sectional view taken along a broken line B-B' in FIG. 14. The reference numerals allocated in FIG. 14 correspond to the reference numerals allocated in FIGS. 15A and 15B.

The photoelectric conversion apparatus according to the present exemplary embodiment is different from that of the second exemplary embodiment in that the isolation region 331 does not reach the second surface 303. Because the photoelectric conversion apparatus according to the present exemplary embodiment is substantially the same as that of the second exemplary embodiment except for this point and the point to be described below, the description will be omitted.

As an example, in FIG. 15A, the isolation region 331 is arranged up to a boundary portion of the sixth semiconductor region 315 and the seventh semiconductor region 316. A depth from the first surface 302 at which the seventh semiconductor region 316 is arranged is 2.5 μm or more, for example.

A generation source of a photon causing avalanche crosstalk is the avalanche multiplication unit 314, and a photon generated by the avalanche multiplication unit 314 is less likely to leak into a neighboring pixel via the seventh semiconductor region 316 arranged on the second surface 303 side. Accordingly, the isolation region 331 needs not reach the second surface 303, and may be formed up to a halfway position in the depth direction as illustrated in FIG. 15A. In this case, it is possible to reduce a degree of difficulty in a process step of forming the isolation region 331 and the third semiconductor region 321.

According to the present exemplary embodiment, it is possible to realize an APD that achieves miniaturization of a pixel size. Because the isolation region 331 is provided, it is also possible to prevent avalanche crosstalk. It is possible to reduce a degree of difficulty in a process step.

Figure 16:
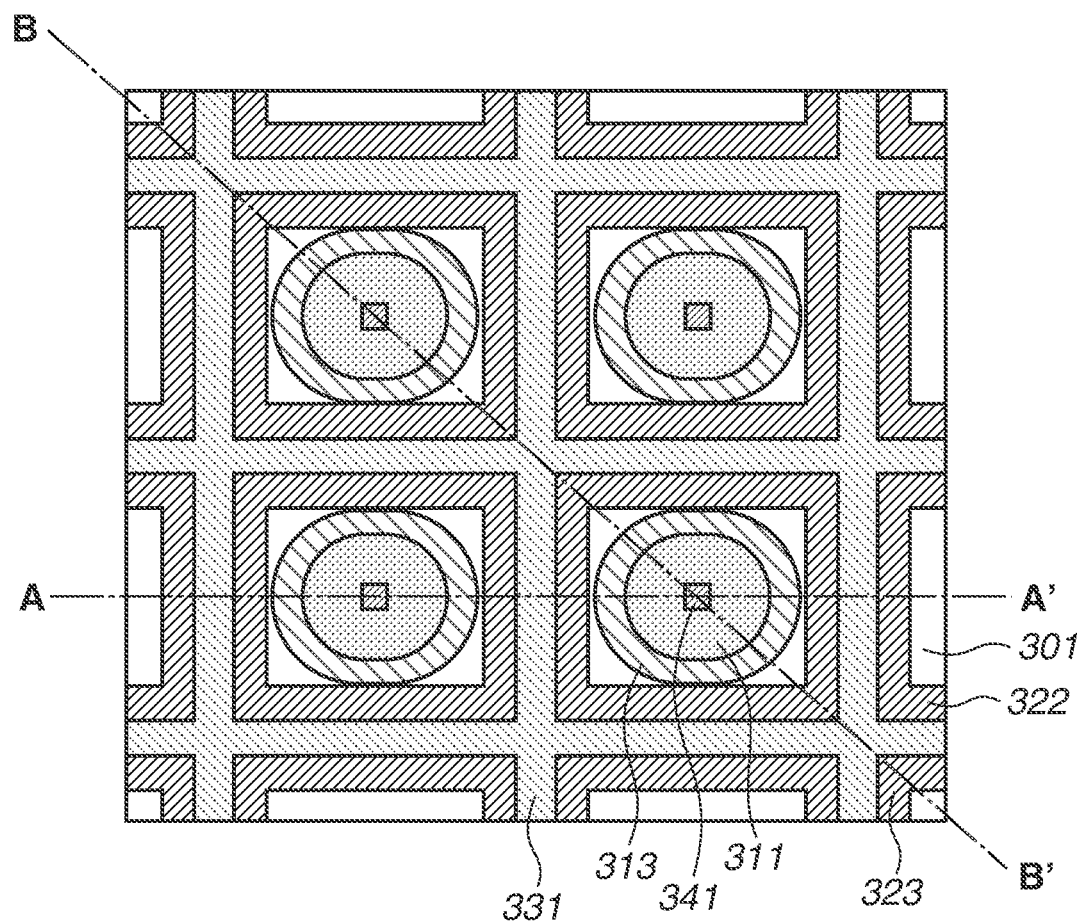
FIG. 16 is a pixel plan view according to a sixth exemplary embodiment.
Figure 17A:
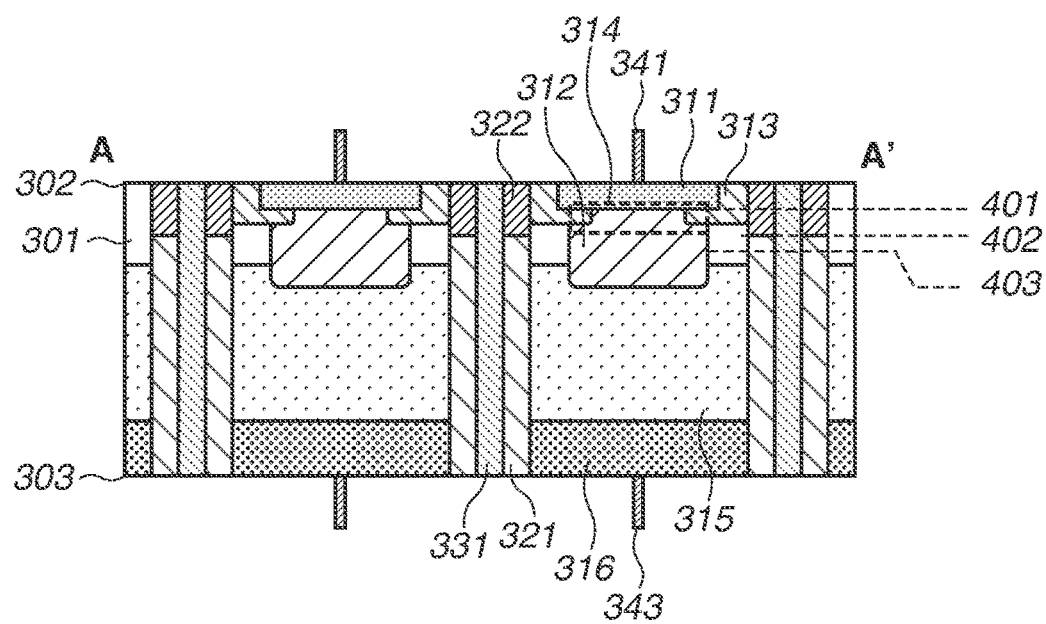
FIGS. 17A and 17B are pixel cross-sectional views according to the sixth exemplary embodiment.
Figure 17B:
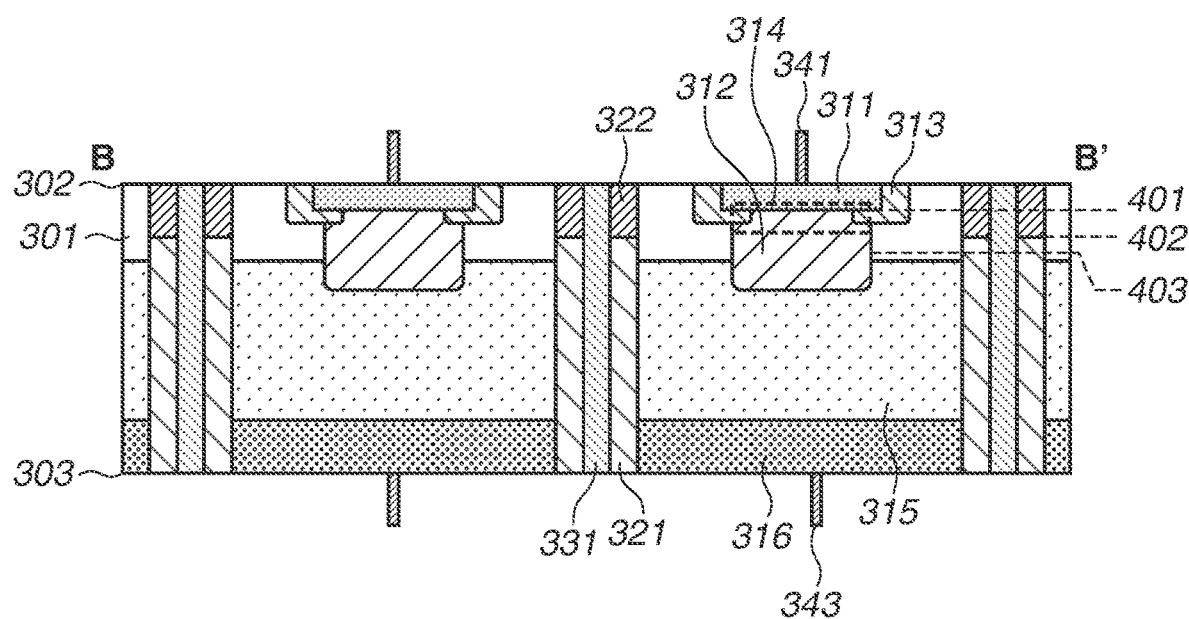

A photoelectric conversion apparatus according to a sixth exemplary embodiment will be described with reference to FIGS. 16, 17A, and 17B. FIG. 16 is a plan view of a photoelectric conversion apparatus according to the present exemplary embodiment, and is a diagram illustrating 2×2 APDs arrayed on a two-dimensional plane. FIG. 17A illustrates a cross-sectional view taken along a broken line A-A' in FIG. 16, and FIG. 17B illustrates a cross-sectional view taken along a broken line B-B' in FIG. 16. The reference numerals allocated in FIG. 16 correspond to the reference numerals allocated in FIGS. 17A and 17B.

The photoelectric conversion apparatus according to the present exemplary embodiment is different from that of the fourth exemplary embodiment in that a contact plug that supplies the voltage VH to an APD is not arranged on the first surface 302 side, and the voltage VH is supplied via a contact plug 343 arranged on the second surface 303 side. Because the photoelectric conversion apparatus according to the present exemplary embodiment is substantially the same as that of the fourth exemplary embodiment except for this point and the point to be described below, the description will be omitted.

The voltage VH applied from the contact plug 343 is supplied to the second semiconductor region 312 via the seventh semiconductor region 316 and the sixth semiconductor region 315. Inversely-biased voltages are consequently applied to the first semiconductor region 311 and the second semiconductor region 312, and the avalanche multiplication unit 314 can be formed.

Because a contact plug that supplies the voltage VH is not provided on the first surface 302 side in the present exemplary embodiment, there is no need to form the eighth semiconductor region 323 on the first surface 302 side. Thus, in FIGS. 17A and 17B, the fourth semiconductor region 322 is arranged in place of the eighth semiconductor region 323. In a case where the isolation region 331 is not arranged, the fourth semiconductor region 322 needs not be arranged.

The contact plug 343 is arranged in FIGS. 17A and 17B, but an electrode such as a metal film may be formed in place of the contact plug 343, and a potential may be supplied via the electrode.

In FIGS. 17A and 17B, the contact plug 343 is arranged at a position overlapping the avalanche multiplication unit 314 in a planar view, but the contact plug 343 may be arranged at a position not overlapping the avalanche multiplication unit 314. With this configuration, incident light from the second surface 303 side can enter the semiconductor layer without being blocked by the contact plug 343.

According to the present exemplary embodiment, it is possible to realize an APD that achieves miniaturization of a pixel size. Because the isolation region 331 is provided, it is also possible to prevent avalanche crosstalk.

Figure 18:
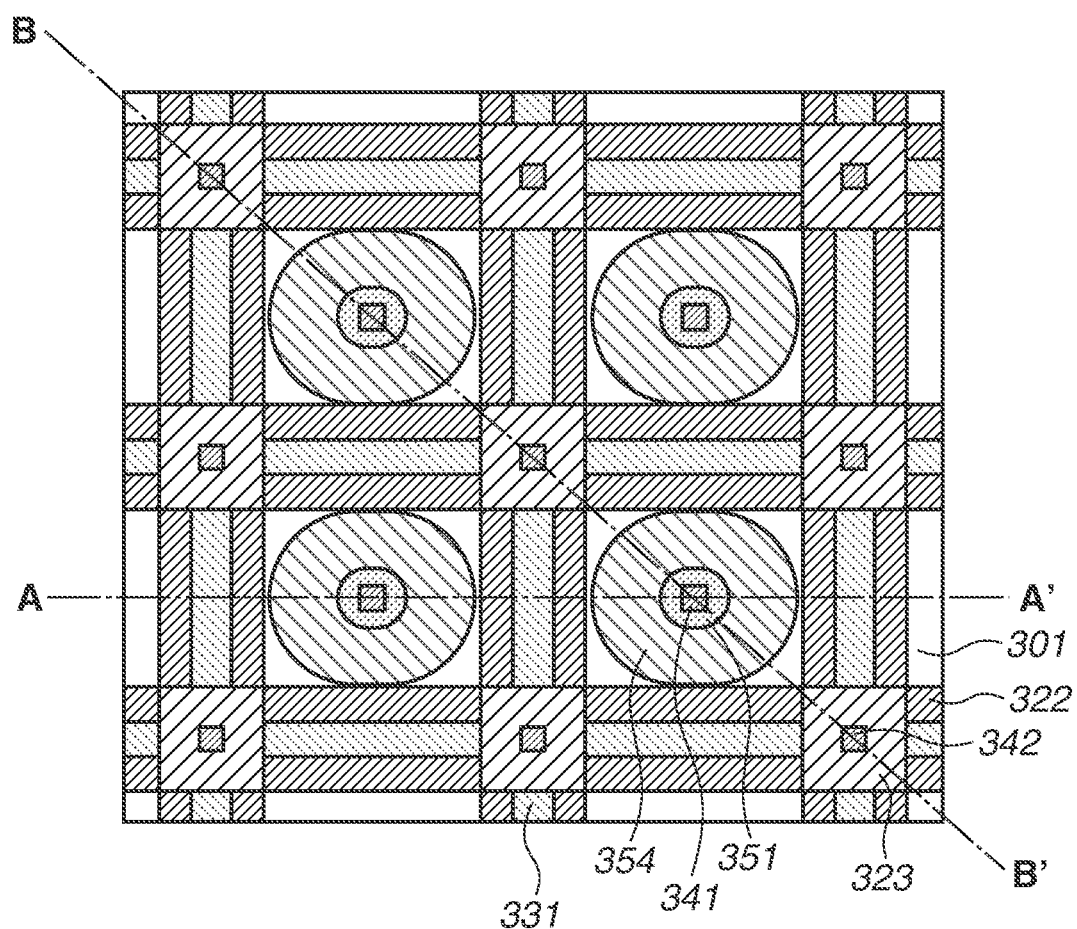
FIG. 18 is a pixel plan view according to a seventh exemplary embodiment.
Figure 19A:
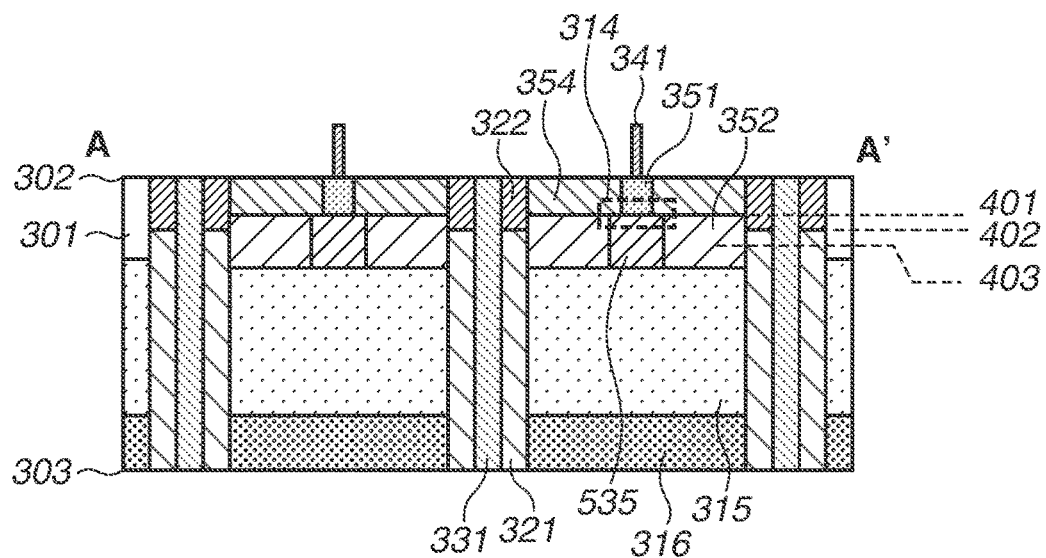
FIGS. 19A and 19B are pixel cross-sectional views according to the seventh exemplary embodiment.
Figure 19B:
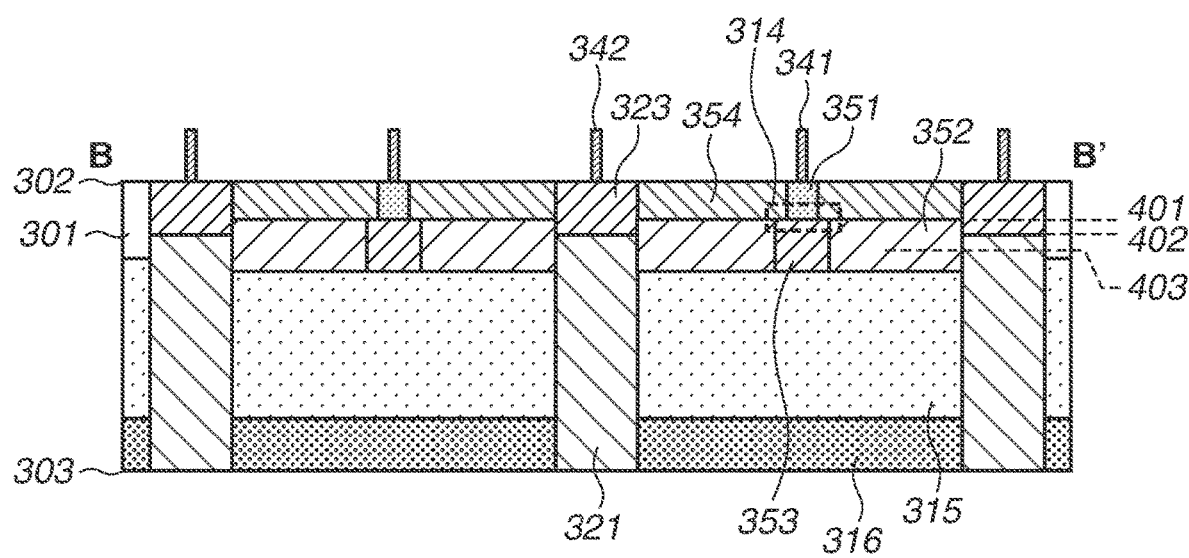

A photoelectric conversion apparatus according to a seventh exemplary embodiment will be described with reference to FIGS. 18, 19A, and 19B. FIG. 18 is a plan view of a photoelectric conversion apparatus according to the seventh exemplary embodiment, and is a diagram illustrating 2×2 APDs arrayed on a two-dimensional plane. FIG. 19A illustrates a cross-sectional view taken along a broken line A-A' in FIG. 18, and FIG. 19B illustrates a cross-sectional view taken along a broken line B-B' in FIG. 18. The reference numerals allocated in FIG. 18 correspond to the reference numerals allocated in FIGS. 19A and 19B.

The photoelectric conversion apparatus according to the present exemplary embodiment is different from that of the first exemplary embodiment in the configuration of a semiconductor region for forming the avalanche multiplication unit 314. Because the photoelectric conversion apparatus according to the present exemplary embodiment is substantially the same as that of the first exemplary embodiment except for this point and the point to be described below, the description will be omitted.

In FIG. 19A, PN junction is formed between a ninth semiconductor region 351 of the first conductivity type and a tenth semiconductor region 352 of the second conductivity type, and the avalanche multiplication unit 314 is formed. An impurity concentration of the ninth semiconductor region 351 is at a level equivalent to the first semiconductor region 311 in FIG. 5A, for example, and an impurity concentration of the tenth semiconductor region 352 is at a level equivalent to the second semiconductor region 312 in FIG. 5A, for example. In FIG. 19A, an eleventh semiconductor region 535 is arranged at the same depth as the tenth semiconductor region 352. In a case where the eleventh semiconductor region 535 is a semiconductor region of the second conductivity type, an impurity concentration of the eleventh semiconductor region 535 is lower than that of the tenth semiconductor region 352. In a case where the eleventh semiconductor region 535 is a semiconductor region of the first conductivity type, an impurity concentration of the eleventh semiconductor region 535 is lower than that of the ninth semiconductor region 351. Furthermore, a twelfth semiconductor region 354 is arranged at the same depth as the ninth semiconductor region 351. In a case where the twelfth semiconductor region 354 is a semiconductor region of the first conductivity type, an impurity concentration of the twelfth semiconductor region 354 is lower than that of the ninth semiconductor region 351. In a case where the twelfth semiconductor region 354 is a semiconductor region of the second conductivity type, an impurity concentration of the twelfth semiconductor region 354 is lower than that of the tenth semiconductor region 352.

The avalanche multiplication unit 314 is formed by an electric field between the ninth semiconductor region 351 and the tenth semiconductor region 352. According to the configuration of the present exemplary embodiment, it becomes possible to keep an area of the ninth semiconductor region 351 constant irrespective of a pixel size. A potential magnitude for a signal charge is set to a lower potential in the eleventh semiconductor region 535 than that in the tenth semiconductor region 352. With this configuration, charges photoelectrically-converted by the sixth semiconductor region 315 are collected by the avalanche multiplication unit 314 via the eleventh semiconductor region 535. By designing potential as such, an area of the avalanche multiplication unit 314 which is a noise generation source can be suppressed to a requisite minimum.

In FIG. 19A, the ninth semiconductor region 351 and the tenth semiconductor region 352 do not overlap each other in a planar view, but the ninth semiconductor region 351 and the tenth semiconductor region 352 may partially overlap each other.

Furthermore, if a potential magnitude for a signal charge is lower in the eleventh semiconductor region 535 than that in the tenth semiconductor region 352, impurity concentrations of the second conductivity type of the tenth semiconductor region 352 and the eleventh semiconductor region 535 may be the same. This point will be described also in a ninth exemplary embodiment.

In FIG. 19A, in a case where a PN junction depth of the ninth semiconductor region 351 and the tenth semiconductor region 352 is set to the depth 401, and a depth at which the tenth semiconductor region 352 is arranged is set to the depth 403, a relationship of each depth with respect to the depth 402 is the same as that in the first exemplary embodiment.

According to the present exemplary embodiment, it is possible to realize an APD that achieves miniaturization of a pixel size. Because the isolation region 331 is provided, it is also possible to prevent avalanche crosstalk. Furthermore, it is possible to collect signal charges to the avalanche multiplication unit 314 while reducing an area of the avalanche multiplication unit 314 as compared with the first exemplary embodiment. Thus, it becomes possible to enhance photodetection efficiency while reducing noise.

Figure 20:
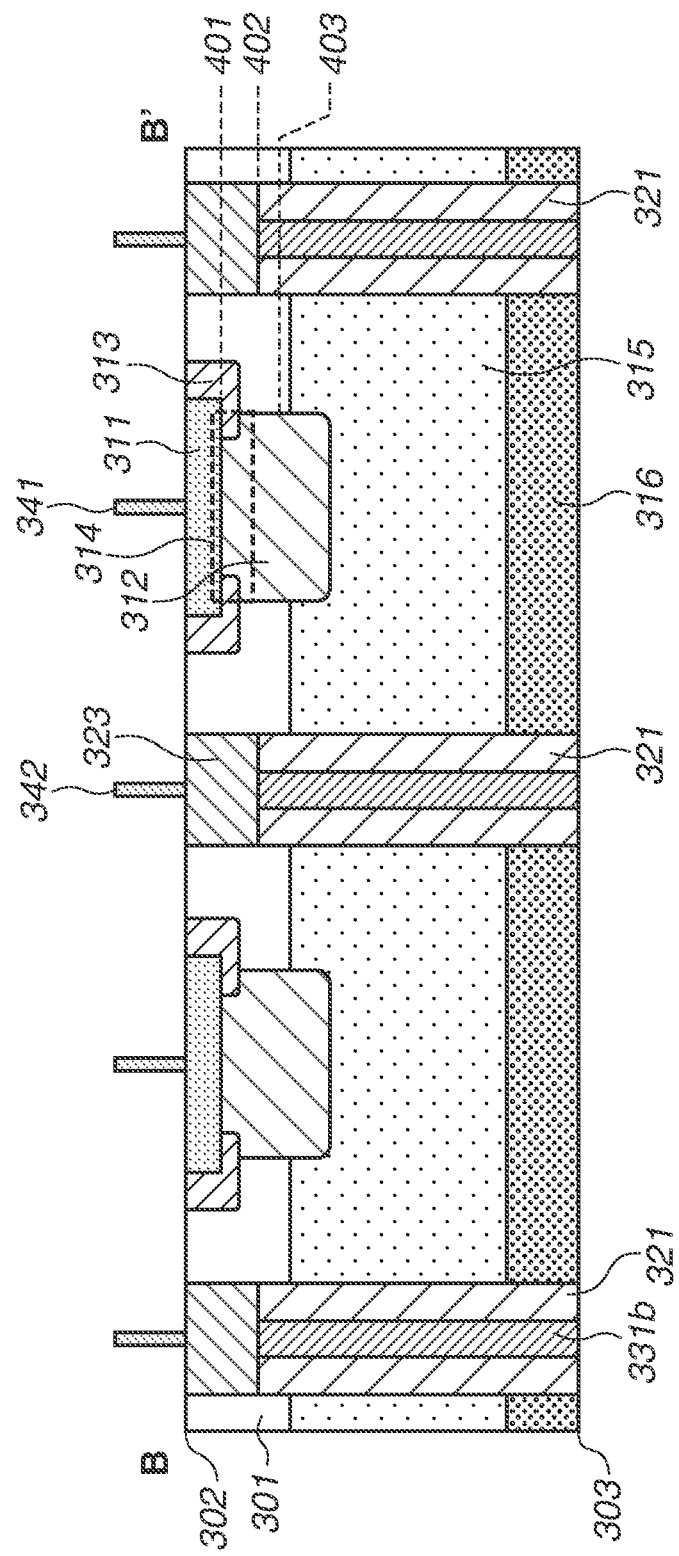
FIG. 20 illustrates a photoelectric conversion system according to an eighth exemplary embodiment.

A photoelectric conversion apparatus according to an eighth exemplary embodiment will be described with reference to FIG. 20. In the photoelectric conversion apparatus according to the present exemplary embodiment, an isolation region 331b not reaching the first surface 302 is arranged between neighboring pixels in the diagonal direction. The isolation region 331 of the fourth exemplary embodiment that has been described with reference to FIGS. 13A and 13B is provided between neighboring pixels in the diagonal direction as well, but reaches the first surface 302, and is different from that of the present exemplary embodiment in that the isolation region 331 reaches the first surface 302. Because the photoelectric conversion apparatus according to the present exemplary embodiment is substantially the same as that of the above-described exemplary embodiment except for this point and the point to be described below, the description will be omitted.

It is desirable that the isolation region 331b is formed up to a depth close to the depth 401 at which the avalanche multiplication unit 314 is arranged. With this configuration, it is possible to prevent avalanche crosstalk between neighboring pixels in the diagonal direction.

According to the present exemplary embodiment, it is possible to realize an APD that achieves miniaturization of a pixel size. Because an isolation region is provided, it is also possible to prevent avalanche crosstalk. In particular, it is possible to prevent avalanche crosstalk between neighboring pixels in the diagonal direction.

A photoelectric conversion apparatus according to the ninth exemplary embodiment will be described with reference to FIGS. 21 to 23.

Figure 21:
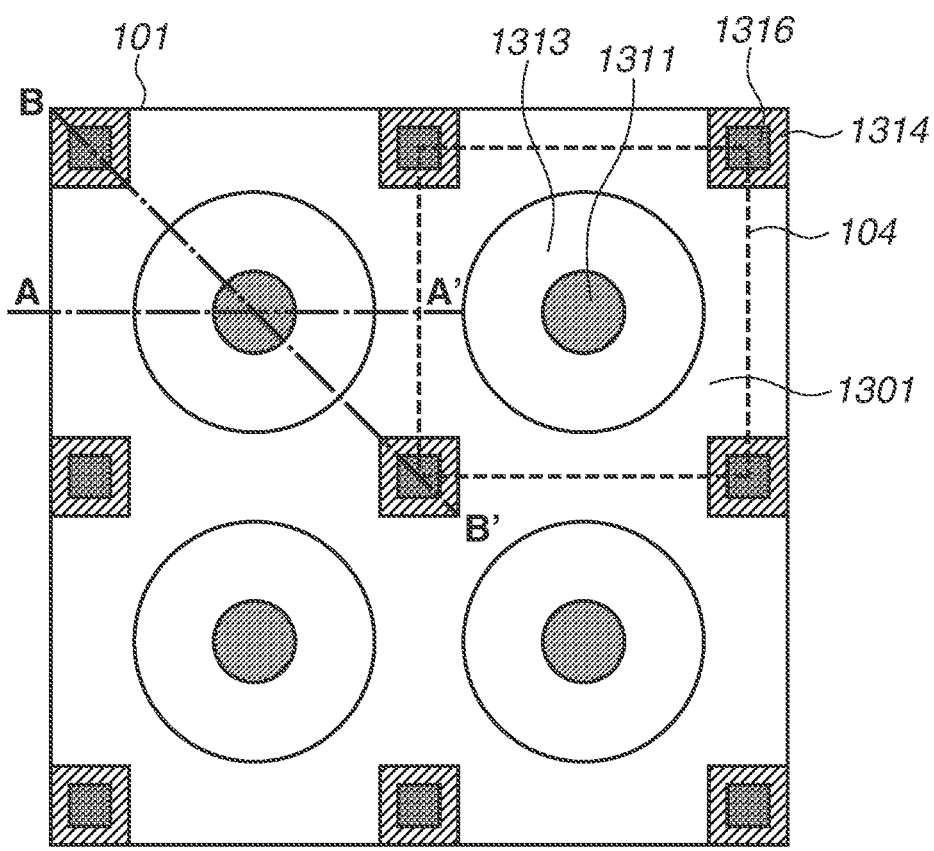
FIG. 21 is a schematic plan view of a photoelectric conversion apparatus according to a ninth exemplary embodiment.

FIG. 21 is a schematic plan view of 2×2 (four) pixels among a plurality of pixels included in the pixel region 12. FIG. 21 illustrates a plane on a first surface of a semiconductor layer 300.

Figure 22A:
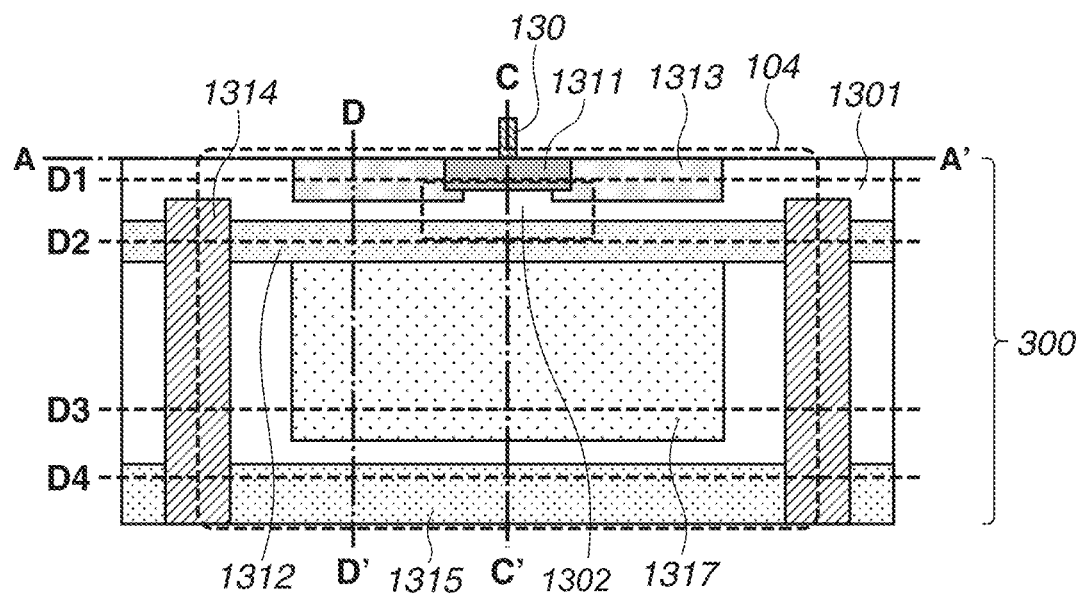
FIGS. 22A and 22B are schematic cross-sectional views of the photoelectric conversion apparatus according to the ninth exemplary embodiment.
Figure 22B:
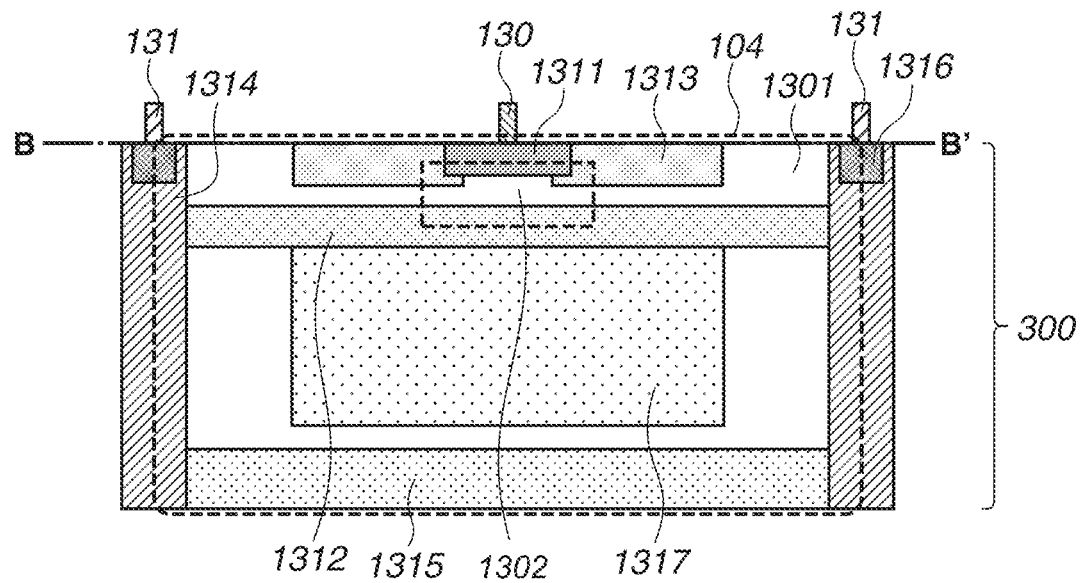

FIG. 22A is a schematic cross-sectional view taken along a broken line A-A' in FIG. 21 that extends in a first direction, and FIG. 22B is a schematic cross-sectional view taken along a broken line B-B' in FIG. 21 that extends in a second direction intersecting with the first direction. In FIG. 22, the first direction corresponds to the side facing direction, and the second direction corresponds to the diagonal direction. FIGS. 22A and 22B illustrate the semiconductor layer 300 included in the sensor substrate 11, and a part of a contact plug connected to the semiconductor layer 300.

As illustrated in FIG. 21, each of the pixels 104 includes at least one APD. The following description will be given of a configuration in which the pixel 104 includes one APD, but the pixel 104 may include a plurality of APDs. Hereinafter, for the sake of convenience, an APD arranged adjacently to a first APD in the side facing direction will be referred to as a second APD, and an APD arranged adjacently to a first APD in the diagonal direction will be referred to as a third APD.

The details of each semiconductor region will be described below. FIG. 21 illustrates a first semiconductor region 1311 of the first conductivity type (e.g., N-type) for forming an avalanche multiplication region of an APD. A third semiconductor region 1313 is arranged around the first semiconductor region 1311.

In FIG. 21, a sixth semiconductor region 1316 of the second conductivity type (e.g., P-type) to which a contact plug is connected is arranged between the first semiconductor region 1311 of the first APD and the first semiconductor region 1311 of the third APD.

An isolation portion (isolation region) including a fourth semiconductor region 1314 of the second conductivity type is arranged between pixels. In the above-described exemplary embodiments, the description has been given of an example in which an isolation portion (isolation region) includes a trench structure and a semiconductor region. On the other hand, in the present exemplary embodiment, the description will be given of an example in which an isolation portion (isolation region) includes only a semiconductor region. The fourth semiconductor regions 1314 of the second conductivity type are arranged in such a manner as to isolate APDs in the side facing direction and the diagonal direction. In a planar view, the sixth semiconductor region 1316 is arranged in such a manner as to overlap the fourth semiconductor region 1314.

As illustrated in FIG. 22A, semiconductor regions included in the pixel 104 are arranged in the semiconductor layer 300. An APD at least includes the first semiconductor region 1311 of the first conductivity type and a second semiconductor region 1312 of the second conductivity type. The first semiconductor region 1311 and the second semiconductor region 1312 form PN junction. An impurity concentration of the first semiconductor region 1311 is higher than an impurity concentration of the second semiconductor region 1312. By applying predetermined inversely-biased voltages to the first semiconductor region 1311 and the second semiconductor region 1312, an avalanche multiplication region 1302 is formed. The first semiconductor region 1311 is connected with a contact plug 1130, and a voltage is applied via the contact plug 1130. A plurality of contact plugs 1130 may be arranged.

A semiconductor region 1301 of the first conductivity type that has an impurity concentration lower than that of the first semiconductor region 1311 may be arranged between the first semiconductor region 1311 and the second semiconductor region 1312. The semiconductor region 1301 may be a semiconductor region of the first conductivity type, or may be a semiconductor region of the second conductivity type.

The third semiconductor region 1313 of the first conductivity type is arranged at an end portion of the first semiconductor region 1311 for easing an electric field. The third semiconductor region 1313 may be a semiconductor region of the second conductivity type as long as the purpose of easing an electric field can be achieved. In a case where the third semiconductor region 1313 is a semiconductor region of the first conductivity type, an impurity concentration of the third semiconductor region 1313 is lower than that of the first semiconductor region 1311, and in a case where the third semiconductor region 1313 is a semiconductor region of the second conductivity type, an impurity concentration of the third semiconductor region 1313 is lower than that of the second semiconductor region 1312. Impurity concentrations of the third semiconductor region 1313 and the first semiconductor region 1311 or the second semiconductor region 1312 are different by double or more. The third semiconductor region 1313 is an additional semiconductor region, and needs not be provided.

In FIGS. 22A and 22B, the fourth semiconductor regions 1314 of the second conductivity type are arranged to isolate pixels in the side facing direction and the diagonal direction. The second semiconductor region 1312 of the second conductivity type is arranged in contact with the fourth semiconductor regions 1314.

A fifth semiconductor region 1315 of the second conductivity type is arranged at a position deeper than the second semiconductor region 1312. The fifth semiconductor region 1315 of the second conductivity type is arranged in contact with the fourth semiconductor regions 1314. In a planar view, the fifth semiconductor region 1315 may be arranged over the entire surface of the pixel 104 and partially overlap the fourth semiconductor regions 1314. In FIGS. 22A and 22B, the fifth semiconductor region 1315 is arranged in contact with the back surface of the semiconductor layer 300, but may be arranged at a distance. FIGS. 22A and 22B illustrate an example in which the fifth semiconductor region 1315 of the second conductivity type is formed by ion implantation, but the configuration is not limited to this. For example, an example in which a pinning film is arranged on the back surface of the semiconductor layer 300 and the fifth semiconductor region 1315 is not formed by ion implantation may be employed. Known material can be employed for the pinning film.

A planarization layer, a filter layer, and a microlens, which are not illustrated, may be arranged on the back surface of the semiconductor layer 300. Various optical filters such as a color filter, an infrared light cut filter, and a monochrome filter can be used as a filter layer. An RGB color filter or an RGBW color filter can be used as a color filter.

A seventh semiconductor region 1317 of the first conductivity type is provided between the second semiconductor region 1312 and the fifth semiconductor region 1315. An impurity concentration of the seventh semiconductor region 1317 is higher than an impurity concentration of the semiconductor region 1301 provided around the seventh semiconductor region 1317. With this configuration, for a signal charge, a potential of the seventh semiconductor region 1317 becomes lower than a potential of the semiconductor region 1301, and it becomes possible to collect a larger amount of charges to the avalanche multiplication region 1302. The seventh semiconductor region 1317 is a semiconductor region to be provided as necessary, and needs not be provided. In cross-sectional views in FIGS. 22A and 22B, a part of the seventh semiconductor region 1317 and the second semiconductor region 1312 are in contact with each other, but the seventh semiconductor region 1317 may be provided at a distance from the second semiconductor region 1312.

In FIG. 22A, one end (top surface) of the fourth semiconductor region 1314 of the second conductivity type is arranged at a position shallower than the second semiconductor region 1312 and deeper than the first surface of the semiconductor layer 300. In other words, between a first photoelectric conversion element including a first APD and a second photoelectric conversion element including a second APD, one end of the fourth semiconductor region 1314 is located closer to the second surface than the first surface and closer to the first surface than the second semiconductor region 1312. As illustrated in FIG. 22A, the fourth semiconductor region 1314 is not arranged continuously in the side facing direction from the second surface up to the first surface, and one end of the fourth semiconductor region 1314 is arranged at a distance from the first surface.

In a case where the fourth semiconductor region 1314 is arranged continuously from the second surface up to the first surface between the first APD and the second APD, electric field concentration in a traverse direction might be generated by the fourth semiconductor region 1314 and the first semiconductor region 1311 or the third semiconductor region 1313. On the other hand, if one end of the fourth semiconductor region 1314 is located inferior to the top surface of the second semiconductor region 1312, a depletion layer can spread in the traverse direction between the first semiconductor region 1311 of the first APD and the first semiconductor region 1311 of the second APD. Punch-through might consequently occur between pixels by the connection of depletion layers.

In contrast to this, according to the present exemplary embodiment, in the side facing direction, an upper end of the fourth semiconductor region 1314 is arranged at a position deeper than the first surface and shallower than the second semiconductor region 1312. It is therefore possible to suppress the occurrence of punch-through while preventing electric field concentration in the traverse direction.

As illustrated in FIG. 22B, in the diagonal direction, the fourth semiconductor region 1314 is continuously arranged from the first surface down to the same depth as the depth at which the fifth semiconductor region 1315 is arranged. In the diagonal direction, it is easier to ensure a distance between the fourth semiconductor region 1314 and the first semiconductor region 1311 or the third semiconductor region 1313 as compared with the side facing direction. Thus, a distance between the fourth semiconductor region 1314 and the first semiconductor region 1311 or the third semiconductor region 1313 becomes longer than that in the side facing direction. For this reason, in the diagonal direction, electric field concentration in the traverse direction is less likely to occur as compared with the side facing direction even if the fourth semiconductor region 1314 is arranged up to the first surface. As illustrated in FIG. 22B, in the diagonal direction, because a voltage is to be applied to the second semiconductor region 1312 via a contact plug 131 as described below, the fourth semiconductor region 1314 is continuously arranged up to the first surface in the diagonal direction. Because the fourth semiconductor region 1314 is only required to be in contact with the sixth semiconductor region 1316, the fourth semiconductor region 1314 needs not be continuously formed up to the first surface. It is sufficient that at least the fourth semiconductor region 1314 and the sixth semiconductor region 1316 are in contact with each other.

The sixth semiconductor region 1316 of the second conductivity type is provided on the first surface side of the semiconductor layer 300. As illustrated in FIGS. 21 and 22B, the sixth semiconductor region 1316 is encompassed in the fourth semiconductor region 1314 of the second conductivity type.

An impurity concentration of the sixth semiconductor region 1316 is higher than an impurity concentration of the fourth semiconductor region 1314. With this configuration, it becomes possible to make contact resistance between metal and semiconductor lower than contact resistance generated in a case where the fourth semiconductor region 1314 and the contact plug 131 are connected by connecting the sixth semiconductor region 1316 and the contact plug 131.

By applying predetermined inversely-biased voltages to the contact plug 131 connected with the sixth semiconductor region 1316, and the contact plug 1130 connected with the first semiconductor region 1311, an avalanche multiplication region 1302 can be formed.

(Organization of Semiconductor Regions at Positions and Relationship Between Potentials)

At a first depth D1, the first semiconductor region 1311 of the first conductivity type, the third semiconductor region 1313 of the first conductivity type or the second conductivity type, the semiconductor region 1301 of the first conductivity type or the second conductivity type, the fourth semiconductor region 1314 of the second conductivity type, and the sixth semiconductor region 1316 of the second conductivity type are arranged.

The first semiconductor region 1311 and the third semiconductor region 1313 are in contact with each other in a planar view. In addition, the third semiconductor region 1313 and the semiconductor region 1301 are in contact with each other in a planar view.

A state in which each semiconductor region is arranged at the first depth D1 refers to a state in which a concentration peak of an ion-implanted impurity is arranged at the first depth D1, for example. Nevertheless, the peak needs not be always arranged at the first depth D1, and it is sufficient that a region in which dispersion of impurity is recognizable is provided at the first depth D1.

A second depth D2 is a position deeper than the first depth D1. In other words, the second depth D2 is a position closer to the back surface of the semiconductor layer 300 than the first depth D1. The second semiconductor region 1312 and the fourth semiconductor region 1314 are arranged at the second depth D2.

A third depth D3 is a position deeper than the second depth D2. In other words, the third depth D3 is a position closer to the back surface of the semiconductor layer 300 than the second depth D2. The seventh semiconductor region 1317, the semiconductor region 1301, and the fourth semiconductor region 1314 are arranged at the third depth D3.

A fourth depth D4 is a position deeper than the third depth D3. In other words, the fourth depth D4 is a position closer to the back surface of the semiconductor layer 300 than the third depth D3. The fifth semiconductor region 1315 and the fourth semiconductor region 1314 are arranged at the fourth depth D4.

Figure 23:
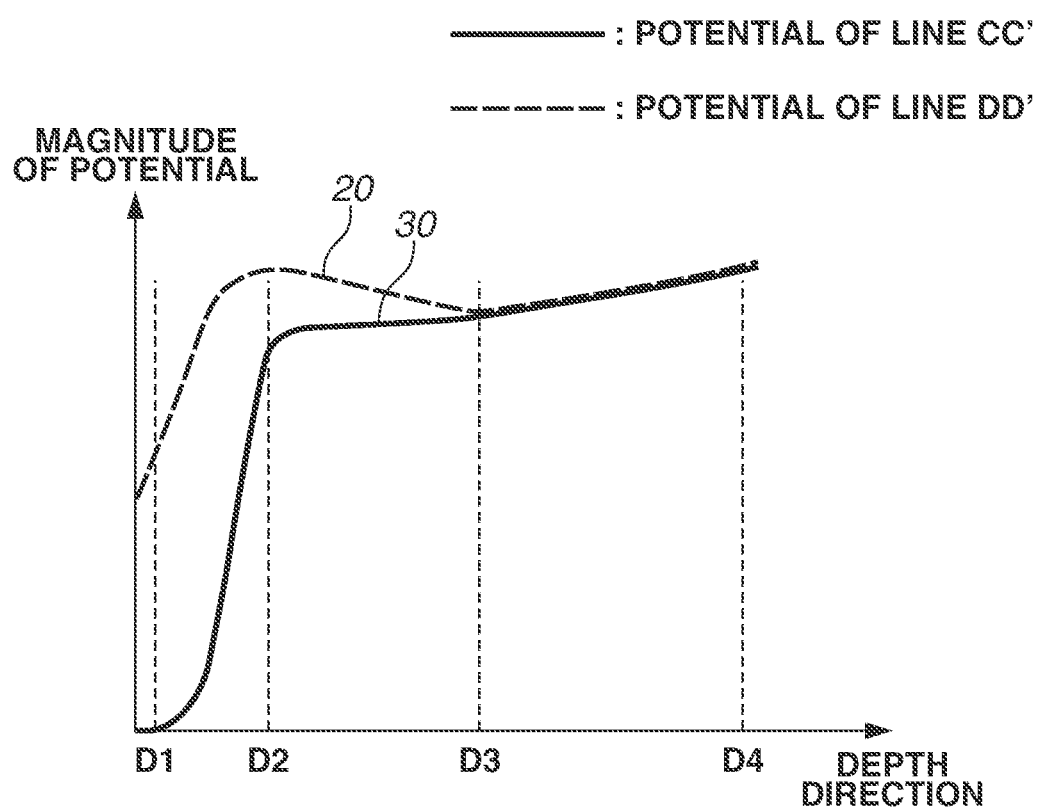
FIG. 23 is a potential diagram of a pixel of the photoelectric conversion apparatus according to the ninth exemplary embodiment.

FIG. 23 illustrates a potential diagram of an APD in FIGS. 21, 22A, and 22B.

In FIG. 23, a dotted line 20 indicates a potential distribution of a line DD', and a solid line 30 indicates a potential distribution of a line CC'. Depths D1 to D4 in the depth direction on a horizontal axis of FIG. 23 respectively correspond to the depths D1 to D4 in FIG. 22A.

As indicated by the dotted line 20 in FIG. 23, a potential gradually declines from the fourth depth D4 toward the third depth D3. In addition, a potential gradually rises from the third depth D3 toward the second depth D2 because the seventh semiconductor region 1317 arranged at the third depth D3 is a semiconductor region of the first conductivity type, and the second semiconductor region 1312 arranged at the second depth D2 is a semiconductor region of the second conductivity type. On the other hand, the third semiconductor region 1313 arranged at the first depth D1 is a semiconductor region of the first conductivity type or a semiconductor region of the second conductivity type with an impurity concentration lower than that of the second semiconductor region 1312. Thus, a potential declines from the second depth D2 toward the first depth D1.

On the other hand, the solid line 30 indicates the same tendency as the dotted line 20 in that a potential gradually declines from the fourth depth D4 toward the third depth D3. Nevertheless, the solid line 30 indicates that a potential gradually declines from the third depth D3 toward the second depth D2. In addition, a potential steeply declines from the second depth D2 toward the first depth D1. From the fourth depth D4 to the third depth D3, potential gradients of the dotted line 20 and the solid line 30 indicate almost the same tendency, and potential gradients become gentle and lower. Thus, a charge generated in a photodetection apparatus moves to a front surface side (first surface side) of the semiconductor layer 300 by a gentle potential gradient.

As described above, the first semiconductor region 1311 and the second semiconductor region 1312 form PN junction, but an impurity concentration of the second semiconductor region 1312 is lower than an impurity concentration of the first semiconductor region 1311. For this reason, if inversely-biased potentials are supplied to the first semiconductor region 1311 and the second semiconductor region 1312, a depletion layer region is formed on the second semiconductor region 1312 side. In this case, while a large electric field is applied to a central portion of the second semiconductor region 1312 around the avalanche multiplication region 1302, only a small electric field is applied to a peripheral portion of the second semiconductor region 1312. Thus, at the position of the second depth D2, a potential of the solid line 30 is lowered drastically, and at the second depth D2, a potential of the solid line 30 becomes lower than a potential of the dotted line 20. On the other hand, because only a small electric field is applied to the peripheral portion of the second semiconductor region 1312, a relationship of potentials that corresponds to a difference in conductivity type or a difference in impurity concentration between semiconductor regions is maintained.

With such a structure, as indicated by the dotted line 20 and the solid line 30 at the second depth D2 in FIG. 23, a potential magnitude for an electron, which is a signal charge, becomes lower in the central portion than that in the peripheral portion of the second semiconductor region 1312. As a result, it becomes easier for a photoelectrically-converted charge to move toward the direction of the central portion of the second semiconductor region 1312.

A charge that has moved to the vicinity of the central portion of the second semiconductor region 1312 is subjected to avalanche multiplication to be performed by the avalanche multiplication region 1302, by being accelerated by a steep potential gradient from the second depth D2 toward the first depth D1 of the solid line 30 in FIG. 23.

In contrast to this, from the second depth D2 to the first depth D1, the dotted line 20 in FIG. 23 indicates a potential distribution not causing avalanche multiplication. It is therefore possible to count a generated charge as a signal charge without increasing an area of the avalanche multiplication region 1302 with respect to a pixel size.

Hereinafter, an example of an impurity concentration of each semiconductor region will be specifically described. In this example, the first conductivity type is assumed to be an N-type and the second conductivity type is assumed to be a P-type.

An impurity concentration of the sixth semiconductor region 1316 in FIG. 22B is about $1 \times 10^{19}$ to $10^{20}$ [atoms/cm$^3$].

The first semiconductor region 1311 of the N-type is a region having a higher impurity concentration than the seventh semiconductor region 1317 of the N-type. For example, an impurity concentration of the first semiconductor region 1311 of the N-type is $1 \times 10^{18}$ [atoms/(cm$^3$)] or more, and a potential biased inversely to the fourth semiconductor region 1314 is supplied to the first semiconductor region 1311 of the N-type.

An impurity concentration of the third semiconductor region 1313 of the N-type is made lower than that of the first semiconductor region 1311 of the N-type. For example, an impurity concentration of the third semiconductor region 1313 of the N-type is about $1 \times 10^{16}$ to $5 \times 10^{17}$ [atoms/cm$^3$]. If the third semiconductor region 1313 is a semiconductor region of the P-type, an avalanche multiplication electric field is formed between the first semiconductor region 1311 and the third semiconductor region 1313 depending on the impurity concentration of the third semiconductor region 1313, and this causes noise deterioration.

An impurity concentration of the second semiconductor region 1312 of the P-type is made lower than that of the fourth semiconductor region 1314 of the P-type. For example, an impurity concentration the second semiconductor region 1312 of the P-type is about $1 \times 10^{16}$ to $5 \times 10^{17}$ [atoms/cm$^3$].

In FIGS. 22A and 22B, it is assumed that the seventh semiconductor region 1317 of the N-type that has a lower impurity concentration than that of the first semiconductor region 1311 of the N-type is arranged immediately below the first semiconductor region 1311 of the N-type without providing the second semiconductor region 1312 of the P-type. In this case, a charge is generated in the seventh semiconductor region 1317, and the charge can be read out from the first semiconductor region 1311 of the N-type.

Nevertheless, it is difficult to cause avalanche multiplication under a voltage condition equivalent to the present exemplary embodiment. This is because a potential difference applied to an avalanche multiplication region near the first semiconductor region 1311 of the N-type becomes smaller by a most part of an inversely-biased potential difference being applied to a depletion layer region of the seventh semiconductor region 1317 of the N-type. On the other hand, in the present exemplary embodiment, because the seventh semiconductor region 1317 of the N-type is surrounded by a P-type semiconductor region in each direction, a potential of the seventh semiconductor region 1317 of the N-type becomes a level closer to the surrounding P-type semiconductor region than the first semiconductor region 1311 of the N-type. In other words, by preventing a depletion layer from excessively spreading to deep portion of a semiconductor layer in the second semiconductor region 1312 of the P-type, it becomes possible to concentrate a most part of the above-described potential difference to be applied, on the avalanche multiplication region near the first semiconductor region 1311 of the N-type. As a result, it is possible to cause avalanche multiplication of a photocarrier at a lower voltage. At this time, an impurity concentration of the seventh semiconductor region 1317 of the N-type is to be made lower than an impurity concentration of the first semiconductor region 1311 of the N-type.

FIGS. 22A and 22B illustrate a region having the same impurity concentration as an example of the seventh semiconductor region 1317 of the N-type. Nevertheless, the seventh semiconductor region 1317 of the N-type desirably has a gradient of an impurity concentration in such a manner that a potential structure of a charge moving to the first surface side of the semiconductor layer 300 is obtained. By employing such a gradient of an impurity concentration, it becomes possible to cause a charge to easily move to the seventh semiconductor region 1317 of the N-type.

FIGS. 22A and 22B illustrate, as the second semiconductor region 1312 of the P-type, an impurity region having the same impurity concentration. Nevertheless, any configuration can be employed as long as a potential of the central portion of the second semiconductor region 1312 is made lower than a potential of the peripheral portion. For example, a configuration of making an impurity concentration of the peripheral portion of the second semiconductor region 1312 higher than an impurity concentration of the central portion of the second semiconductor region 1312 of the P-type can be employed. Furthermore, the central portion of the second semiconductor region 1312 may be a semiconductor region of the N-type.

According to the present exemplary embodiment, it is possible to realize an APD that achieves miniaturization of a pixel size. It is possible to prevent punch-through between the first semiconductor region 1311 of the first APD and the first semiconductor region 1311 of the second APD while preventing the generation of an electric field between the fourth semiconductor region 1314 and the first semiconductor region 1311 or the third semiconductor region 1313.

Figure 24:
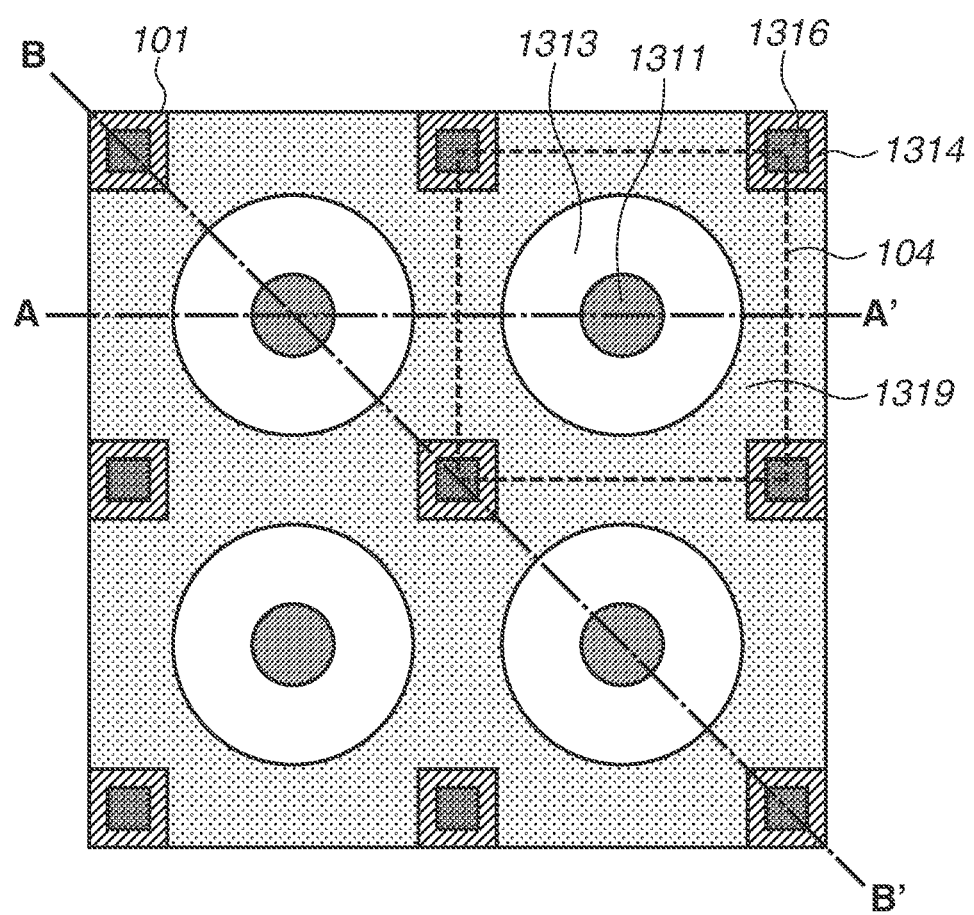
FIG. 24 is a schematic plan view of a photoelectric conversion apparatus according to a tenth exemplary embodiment.

A photoelectric conversion apparatus according to a tenth exemplary embodiment will be described with reference to FIGS. 24, 25A, and 25B. FIG. 24 is a schematic plan view of the semiconductor layer 300 on which an APD of the photoelectric conversion apparatus according to the present exemplary embodiment is arranged. FIG. 25A is a schematic cross-sectional view taken along a broken line A-A' in FIG. 24, and FIG. 25B is a schematic cross-sectional view taken along a broken line B-B' in FIG. 24. The photoelectric conversion apparatus according to the present exemplary embodiment is different from that of the ninth exemplary embodiment in that a ninth semiconductor region 1319 of the first conductivity type is arranged near the first surface of the semiconductor layer 300. Because the photoelectric conversion apparatus according to the present exemplary embodiment is substantially similar to that of the ninth exemplary embodiment except for this point and the matters to be described below, the description will be sometimes omitted by allocating the same reference numerals to the components similar to those in the ninth exemplary embodiment.

As illustrated in FIG. 24, in a planar view, the ninth semiconductor region 1319 is arranged in such a manner as to surround the first semiconductor region 1311 and the third semiconductor region 1313. It is desirable that an impurity concentration of the ninth semiconductor region 1319 is equal to or smaller than that of the third semiconductor region 1313. For example, in a case where impurity concentrations of the ninth semiconductor region 1319 and the third semiconductor region 1313 are different, it is desirable that an impurity concentration of the ninth semiconductor region 1319 is lower than that of the third semiconductor region 1313 by double or more.

By arranging the ninth semiconductor region 1319, it is possible to reduce noise in a signal caused by a dark electron that can be generated by a defective level on the interfacial surface of the first surface of the semiconductor layer 300, or near the first surface. If the ninth semiconductor region 1319 is arranged, a region in which a potential becomes lower with respect to a dark electron is formed from the ninth semiconductor region 1319 toward the first semiconductor region 1311. In other words, a dark electron generated near the interfacial surface of the first surface of the semiconductor layer 300 becomes more likely to move to the first semiconductor region 1311, and becomes less likely to move to the semiconductor region 1301 and the seventh semiconductor region 1317. It therefore becomes possible to prevent the dark electron from passing through the avalanche multiplication region 1302 and reduce noise. A dark electron that has moved to the first semiconductor region 1311 via the third semiconductor region 1313 is read out without passing through the avalanche multiplication region 1302, and is not determined as a signal. Thus, even if the dark electron is read out, the dark electron is not regarded as noise.

The ninth semiconductor region 1319 may be arranged in such a manner that an impurity concentration becomes lower farther away from the first semiconductor region 1311, or may be arranged in such a manner that an impurity concentration remains the same. The ninth semiconductor region 1319 may have a concentration gradient in the depth direction.

As illustrated in FIG. 25A, the ninth semiconductor region 1319 is desirably arranged between neighboring pixels in the side facing direction continuously from the third semiconductor region 1313 of a certain pixel 104 to the third semiconductor region 1313 of a neighbor pixel. As illustrated in FIG. 24, the ninth semiconductor region 1319 is desirably arranged in such a manner as to surround the first semiconductor region 1311, the third semiconductor region 1313, the sixth semiconductor region 1316, and the fourth semiconductor region 1314 in a planar view. For example, the ninth semiconductor region 1319 is desirably arranged in a region excluding the first semiconductor region 1311, the third semiconductor region 1313, the sixth semiconductor region 1316, and the fourth semiconductor region 1314 in a planar view. With this configuration, it becomes easier to reduce the influence of signal noise deterioration caused by a dark electron.

The ninth semiconductor region 1319 is desirably arranged at a position shallower than a lower end of the first semiconductor region 1311. It is desirable that a length of the ninth semiconductor region 1319 in an up-down direction is shorter than a length of the third semiconductor region 1313 in the up-down direction. It is also desirable that the length of the ninth semiconductor region 1319 in the up-down direction is shorter than a length of the first semiconductor region 1311 in the up-down direction. With this configuration, it is possible to prevent a dark electron from unintentionally moving to the avalanche multiplication region 1302.

In the side facing direction, the ninth semiconductor region 1319 and the fourth semiconductor region 1314 may be in contact with each other, or may be separated from each other as illustrated in FIG. 25A. In a case where the ninth semiconductor region 1319 and the fourth semiconductor region 1314 are in contact with each other, it becomes difficult for a charge to move to a neighboring pixel. In a case where the ninth semiconductor region 1319 and the fourth semiconductor region 1314 are separated from each other, it becomes difficult for electric field concentration to be generated between the fourth semiconductor region 1314 and the first semiconductor region 1311. In the diagonal direction, the ninth semiconductor region 1319 and the fourth semiconductor region 1314 are in contact with each other as illustrated in FIG. 25B, but may be separated from each other. Nevertheless, as described above, it is desirable that the ninth semiconductor region 1319 is arranged in contact with the fourth semiconductor region 1314 for obtaining a noise reduction effect caused by the arrangement of the ninth semiconductor region 1319.

In FIG. 24, the ninth semiconductor region 1319 is arranged in such a manner as to constitute a part of the first surface of the semiconductor layer 300 in the present exemplary embodiment, but the ninth semiconductor region 1319 needs not be always arranged in this manner. For example, the ninth semiconductor region 1319 may be arranged at a position distant from the first surface.

Figure 26:
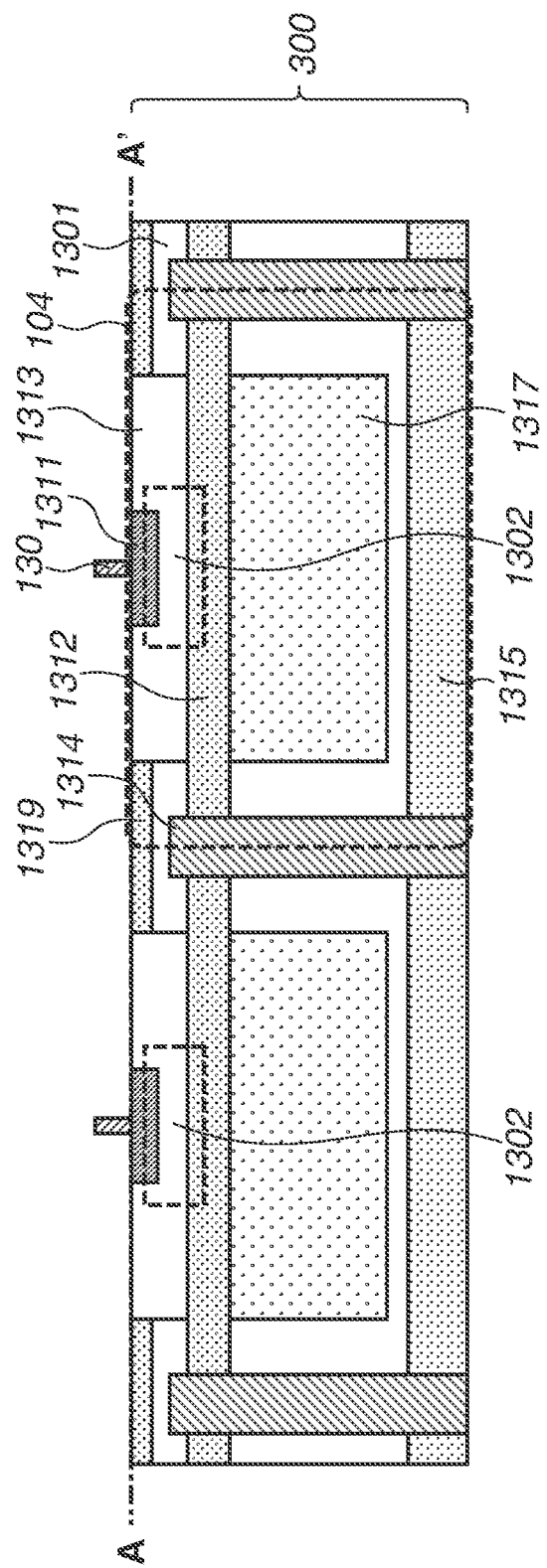
FIG. 26 is a schematic cross-sectional view of the photoelectric conversion apparatus according to the tenth exemplary embodiment.

As illustrated in FIG. 26, the third semiconductor region 1313 may be arranged in contact with the second semiconductor region 1312. While the third semiconductor region 1313 is arranged in a torus shape in FIGS. 24, 25A, and 25B, the third semiconductor region 1313 is arranged in a circular shape in FIG. 26. For example, as illustrated in FIG. 26, the third semiconductor region 1313 of the first conductivity type is arranged between the first semiconductor region 1311 and the second semiconductor region 1312. With this configuration, it is possible to deepen a PN junction surface, and prevent an electric field from being locally concentrated in the avalanche multiplication region 1302. Because a schematic plan view is similar to that in FIG. 24 and a schematic cross-sectional view in the diagonal direction is similar except that the third semiconductor region 1313 is arranged between the first semiconductor region 1311 and the second semiconductor region 1312, the drawings are omitted.

In FIG. 26, an impurity concentration of the third semiconductor region 1313 near the side surface of the first semiconductor region 1311 and an impurity concentration of the third semiconductor region 1313 near the bottom surface of the first semiconductor region 1311 may be the same. Alternatively, the third semiconductor region 1313 may be arranged in such a manner that an impurity concentration of the third semiconductor region 1313 becomes lower as getting closer to the second semiconductor region 1312 from the first semiconductor region 1311.

An impurity concentration of the third semiconductor region 1313 near the first semiconductor region 1311 may be lower than an impurity concentration near the ninth semiconductor region 1319. For example, an impurity concentration of the third semiconductor region 1313 may become gradually lower as getting away from the first semiconductor region 1311. With this configuration, electric field concentration in the traverse direction can be eased.

According to the present exemplary embodiment, it is possible to realize an APD that achieves miniaturization of a pixel size. It is possible to prevent punch-through between pixels while preventing the generation of an electric field in the traverse direction. Furthermore, it becomes easier to form an electric field distribution in the avalanche multiplication region 1302 spatially uniformly, and it is possible to reduce noise attributed to electric field concentration.

Figure 27:
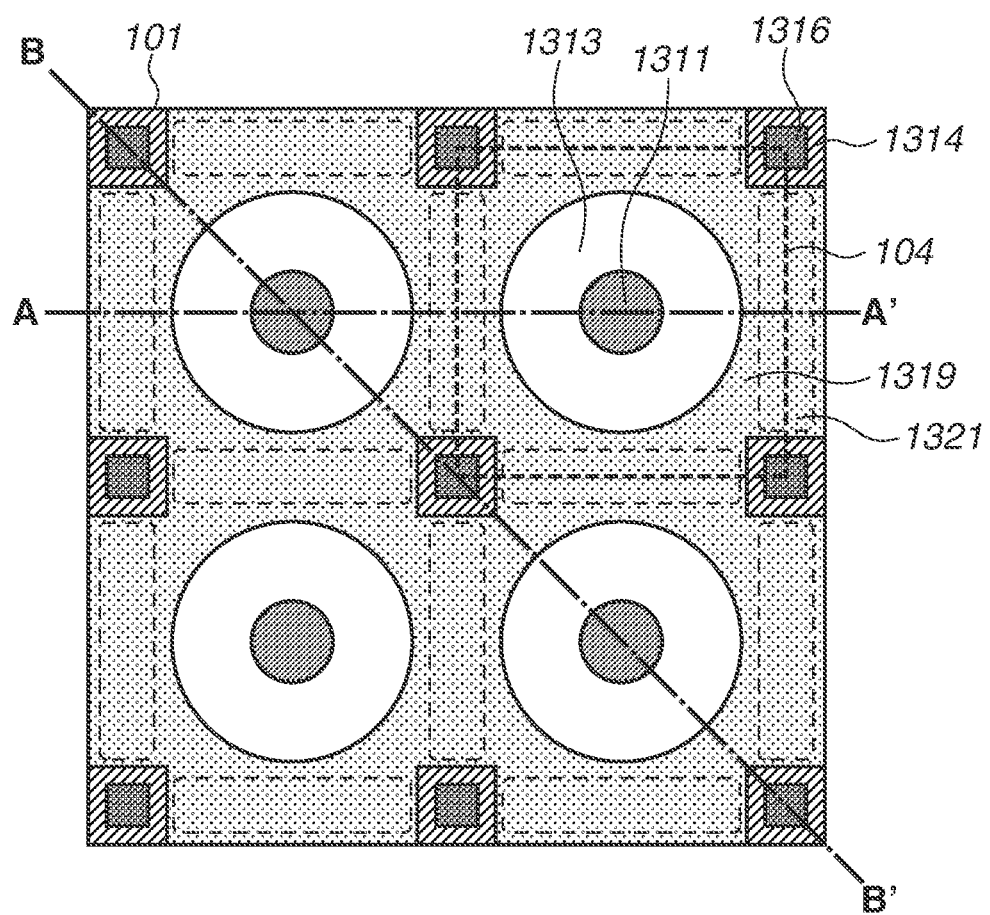
FIG. 27 is a schematic plan view of a photoelectric conversion apparatus according to an eleventh exemplary embodiment.

A photoelectric conversion apparatus according to an eleventh exemplary embodiment will be described with reference to FIGS. 27, 28A, and 28B. FIG. 27 is a schematic plan view of the semiconductor layer 300 in which an APD of the photoelectric conversion apparatus according to the present exemplary embodiment is arranged. FIG. 28A is a schematic cross-sectional view taken along a broken line A-A' in FIG. 27, and FIG. 28B is a schematic cross-sectional view taken along a broken line B-B' in FIG. 27. The photoelectric conversion apparatus according to the present exemplary embodiment is different from that of the tenth exemplary embodiment in that an isolation portion includes a trench structure 1321 in the side facing direction between pixels. Because the photoelectric conversion apparatus according to the present exemplary embodiment is substantially similar to that of the tenth exemplary embodiment except for this point and the matters to be described below, the description will be sometimes omitted by allocating the same reference numerals to the components similar to those in the tenth exemplary embodiment.

Although the trench structure 1321 is not arranged on the first surface of the semiconductor layer 300, a position at which the trench structure 1321 is arranged is indicated by a broken line in FIG. 27 to facilitate the understanding of planar arrangement of the trench structure 1321.

The trench structure 1321 desirably includes material different from the semiconductor layer 300. The trench structure 1321 desirably includes reflective material or light absorption material. The reflective material or the light absorption material is material reflecting or absorbing light by 20% or more, for example. For example, the trench structure 1321 includes at least any one of an insulating member, air, and metal. In a case where the semiconductor layer 300 is silicon, examples of the insulating member include a silicon oxide film and a silicon nitride film. With this configuration, it is possible to prevent crosstalk into a neighboring APD. More desirably, the trench structure 1321 includes at least one of an insulating member and metal. In the avalanche multiplication region 1302, a phenomenon called avalanche light emission sometimes occurs. This is a phenomenon by which a photon is generated by recombination of a hole and an electron, which is a hot carrier generated by avalanche multiplication. If a photon generated by the avalanche light emission leaks into a neighboring pixel and is photoelectrically-converted, an electron-hole pair is generated. In other words, aliasing is caused by a photon generated not by incident light but by avalanche light emission being read out as a signal from a neighboring pixel. It is possible to prevent a photon from getting mixed into a neighboring pixel even in a case where avalanche light emission occurs, by the trench structure 1321 including metal.

The trench structure 1321 is desirably arranged from the second surface of the semiconductor layer 300 up to the same depth as the second semiconductor region 1312 or a depth shallower than the second semiconductor region 1312. This is because this configuration can easily prevent crosstalk of a photon generated by avalanche light emission to get mixed into a neighboring pixel. Nevertheless, the trench structure 1321 may be arranged from the second surface up to a position deeper than the second semiconductor region 1312. This is because, also in this case, it is easier to prevent crosstalk attributed to avalanche light emission, as compared with a case where the trench structure 1321 is not arranged.

In FIG. 28A, the trench structure 1321 is formed from the back surface side of the semiconductor layer 300. The trench structure 1321 is provided by being encompassed within the fourth semiconductor region 1314. In other words, in the side facing direction, pixels are isolated by both of the trench structure 1321 and the fourth semiconductor region 1314 of the second conductivity type.

On the other hand, referring to FIG. 28B, in the diagonal direction, the trench structure 1321 is not provided, and pixels are isolated only by the fourth semiconductor region 1314.

According to the present exemplary embodiment, it is possible to realize an APD that achieves miniaturization of a pixel size. It is possible to prevent punch-through between pixels while preventing the generation of an electric field in the traverse direction. Furthermore, it becomes easier to form an electric field distribution in the avalanche multiplication region 1302 spatially uniformly, and it is possible to reduce noise attributed to electric field concentration. Moreover, it becomes easier to prevent crosstalk attributed to avalanche light emission.

Because the trench structure 1321 is not arranged between pixels in the diagonal direction, it is possible to reduce electric resistance from a contact plug 1131 toward the fifth semiconductor region 1315. With this configuration, it becomes easier to form a potential gradient in a direction vertical to the semiconductor layer 300, and it is possible to shorten a time taken for collecting signal charges to the avalanche multiplication region 1302.

Figure 29:
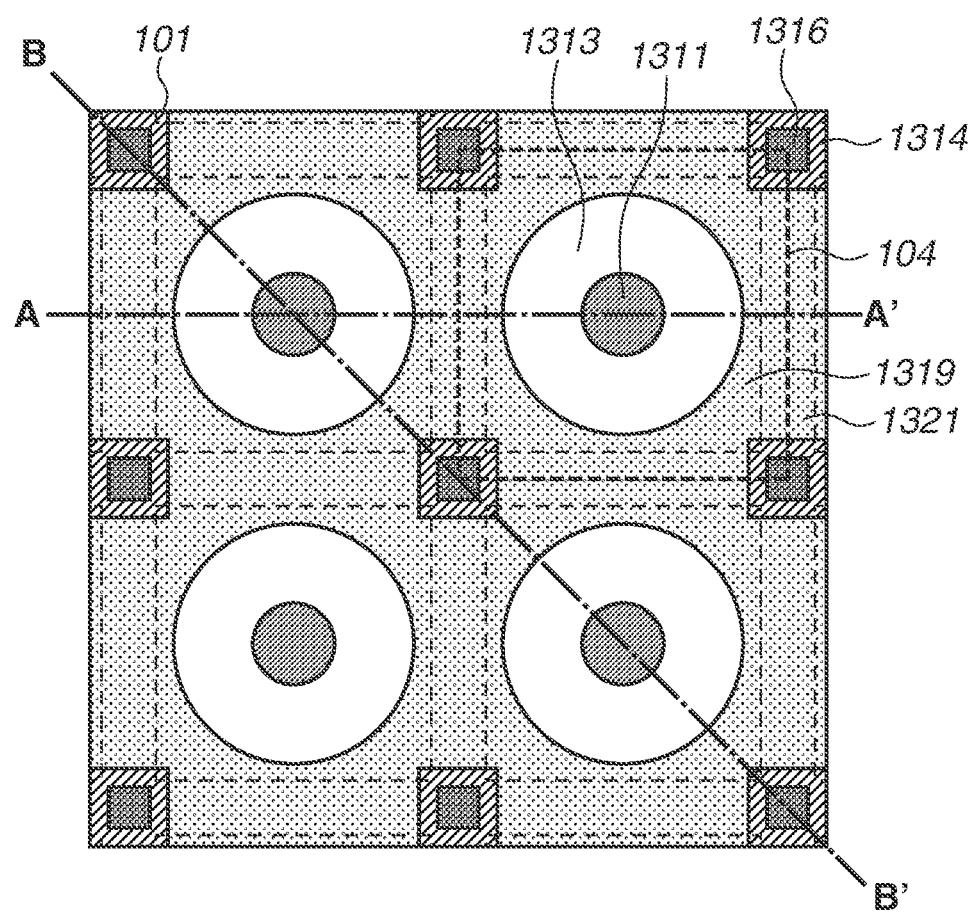
FIG. 29 is a schematic plan view of the photoelectric conversion apparatus according to the eleventh exemplary embodiment.

As illustrated in FIGS. 29, 30A, and 30B, the trench structure 1321 may be arranged between pixels in the side facing direction and the diagonal direction. Similarly to FIG. 27, a position at which the trench structure 1321 is arranged is indicated by a broken line in FIG. 29 to facilitate the understanding of planar arrangement of the trench structure 1321. In this case, as illustrated in FIG. 29, in a planar view, the trench structure 1321 is arranged in such a manner as to surround the entire circumference of the first semiconductor region 1311.

According to the configuration illustrated in FIGS. 29, 30A, and 30B, it is possible to prevent crosstalk attributed to avalanche light emission in the diagonal direction.

Figure 31:
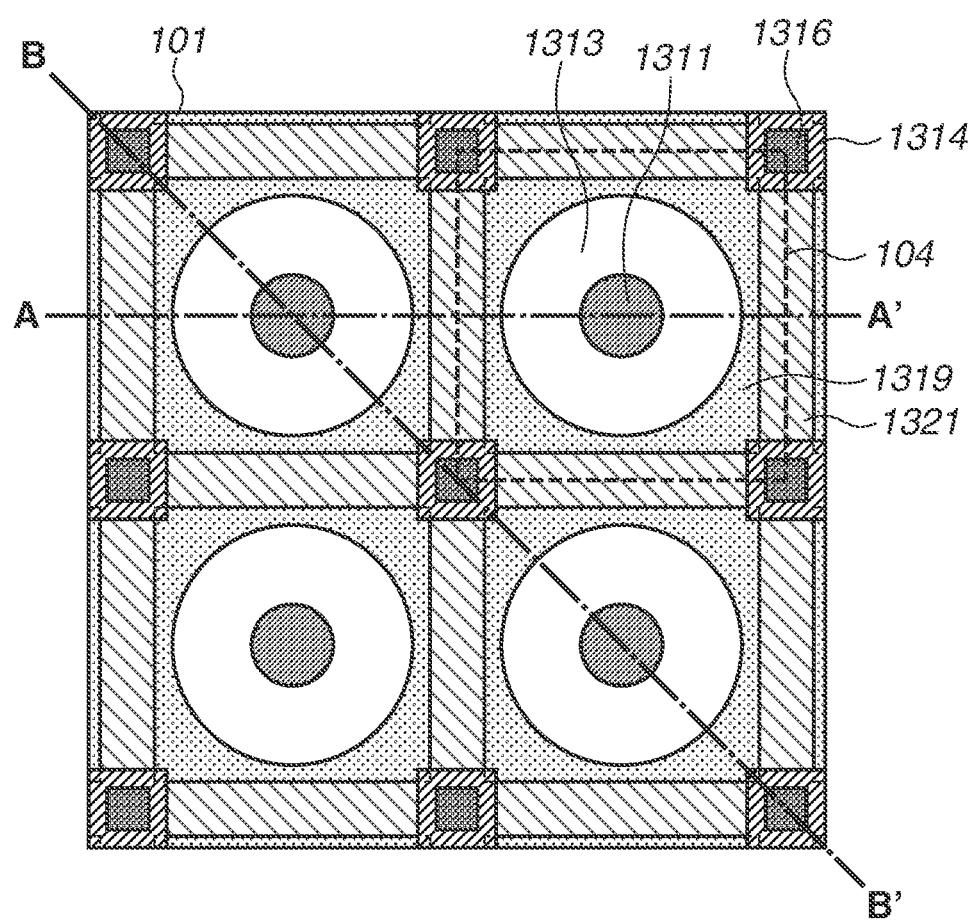
FIG. 31 is a schematic plan view of a photoelectric conversion apparatus according to a twelfth exemplary embodiment.

A photoelectric conversion apparatus according to a twelfth exemplary embodiment will be described with reference to FIGS. 31, 32A, and 32B. FIG. 31 is a schematic plan view of the semiconductor layer 300 on which an APD of the photoelectric conversion apparatus according to the present exemplary embodiment is arranged. FIG. 32A is a schematic cross-sectional view taken along a broken line A-A' in FIG. 31, and FIG. 32B is a schematic cross-sectional view taken along a broken line B-B' in FIG. 31. In the photoelectric conversion apparatus according to the present exemplary embodiment, the trench structure 1321 penetrating through the semiconductor layer 300 is provided in such a manner as to isolate pixels in the side facing direction. In addition, the trench structure 1321 not penetrating through the semiconductor layer 300 is provided in such a manner as to isolate pixels in the diagonal direction. Because the photoelectric conversion apparatus according to the present exemplary embodiment is substantially similar to that of the eleventh exemplary embodiment except for this point and the matters to be described below, the description will be sometimes omitted by allocating the same reference numerals to the components similar to those in the eleventh exemplary embodiment.

In the side facing direction between pixels, the fourth semiconductor region 1314 of the second conductivity type is arranged in contact with a part of the trench structure 1321 penetrating through the semiconductor layer 300, but the fourth semiconductor region 1314 is not arranged in the other part. For example, as illustrated in FIG. 32A, at a position shallower than the second semiconductor region 1312, a first portion of the trench structure 1321 is in contact with the fourth semiconductor region 1314. In addition, a second portion is in contact with the semiconductor region 1301 of the first conductivity type, and a third portion is in contact with the ninth semiconductor region 1319. The first portion, the second portion, and the third portion are closer to the first surface of the semiconductor layer 300 in this order. A part of the trench structure 1321 needs not be always in contact with the semiconductor region 1301. The trench structure 1321 is only required to be partially in contact with at least the fourth semiconductor region 1314 and the ninth semiconductor region 1319. In this manner, the trench structure 1321 includes a portion being in contact with a semiconductor region of the second conductivity type, and a portion being in contact with a semiconductor region of the first conductivity type. In FIG. 32A, even when an unnecessary charge is generated due to the trench structure 1321, the second semiconductor region 1312 and the fourth semiconductor region 1314 having high potentials are arranged in a lower part. In addition, the third semiconductor region 1313 and the ninth semiconductor region 1319 having lower potentials are arranged in an upper part. In other words, because a potential makes it difficult for the unnecessary charge to move to the avalanche multiplication region 1302, the unnecessary charge is less likely to affect a signal to be read out even if the unnecessary charge is generated.

As the material for the trench structure 1321, material similar to the material described in the above-described exemplary embodiment can be used. In a case where the trench structure 1321 includes a portion in contact with a semiconductor region of the first conductivity type, a pinning film is desirably arranged at least in the region in contact with the semiconductor region of the first conductivity type. Because holes gather to the vicinity of the trench structure 1321 due to the pinning film, the unnecessary charge is less likely to be read as a signal even if the unnecessary charge is generated as a result of the formation of the trench structure 1321. The pinning film may be continuously arranged from a lower end of the trench structure 1321 up to an upper end thereof.

Because the configuration in the diagonal direction between pixels is similar to the configuration described in the eleventh exemplary embodiment with reference to FIG. 30B, the description will be omitted. In the diagonal direction between pixels, the trench structure 1321 needs not be arranged as described with reference to FIG. 28B.

According to the present exemplary embodiment, it is possible to realize an APD that achieves miniaturization of a pixel size. It is possible to prevent punch-through between pixels while preventing the generation of an electric field in the traverse direction. Furthermore, it becomes easier to form an electric field distribution in the avalanche multiplication region 1302 spatially uniformly, and it is possible to reduce noise attributed to electric field concentration. Moreover, because the trench structure 1321 penetrating through the semiconductor layer 300 is arranged in the side facing direction between pixels, it becomes further easier to prevent crosstalk attributed to avalanche light emission.

A photoelectric conversion apparatus according to a thirteenth exemplary embodiment will be described with reference to FIGS. 33A and 33B. FIG. 33A illustrates a modified example of FIG. 22A, and FIG. 32B illustrates a modified example of FIG. 25A.

The present exemplary embodiment is different from the above-described exemplary embodiment in that the top surface of the fourth semiconductor region 1314 of the second conductivity type is provided at the same position as a position at which the second semiconductor region 1312 is provided. Also with such a configuration, because the top surface of the fourth semiconductor region 1314 of the second conductivity type is located inferior to the bottom surface of the first semiconductor region 1311 of the first conductivity type, electric field concentration in the traverse direction can be suppressed. With this configuration, it is possible to realize an APD that achieves miniaturization of a pixel size.

Because the other matters are substantially similar to the ninth and the tenth exemplary embodiments, the description will be omitted by allocating the same reference numerals to the components similar to those in these exemplary embodiments.

A manufacturing method of a photoelectric conversion apparatus according to a fourteenth exemplary embodiment will be described with reference to FIGS. 34A to 34G. For the sake of convenience of explanation, a manufacturing method of the photoelectric conversion apparatus according to the second exemplary embodiment will be described, but the photoelectric conversion apparatuses according to the other exemplary embodiments can also be manufactured using a similar manufacturing method. The description will be given with reference to FIGS. 34A to 34G using a cross-sectional view taken along the side facing direction of neighboring pixels, but a cross-sectional view taken along the diagonal direction can also be created based on a similar way of thinking. Furthermore, a known manufacturing method can be applied to steps not described with reference to FIGS. 34A to 34G.

First of all, as illustrated in FIG. 34A, the semiconductor layer 301 is prepared.

Next, as illustrated in FIG. 34B, ion implantation of an impurity of the second conductivity type is performed on a region to become the seventh semiconductor region 316, from a normal direction with respect to the first surface 302. The seventh semiconductor region 316 is thereby formed at a deep position with respect to the first surface 302 of the semiconductor layer 301. Similarly, ion implantation of an impurity of the second conductivity type is performed on a region to become the sixth semiconductor region 315. The sixth semiconductor region 315 is thereby formed at a depth in the semiconductor layer 301 that is shallower than the seventh semiconductor region 316.

Next, as illustrated in FIG. 34C, ion implantation of an impurity of the second conductivity type is performed on a region to become the third semiconductor region 321, from the normal direction with respect to the first surface 302. The third semiconductor region 321 is thereby formed.

Next, as illustrated in FIG. 34D, the isolation region 331 between neighboring pixels is formed. The isolation region 331 is formed in a region in which the third semiconductor region 321 is arranged. Accordingly, the side wall portion of the isolation region 331 is covered by the third semiconductor region 321.

Next, as illustrated in FIG. 34E, ion implantation of an impurity of the second conductivity type is performed on a region to become the second semiconductor region 312, from the normal direction with respect to the first surface 302. The second semiconductor region 312 is thereby formed. Similarly, ion implantation of an impurity of the first conductivity type is performed on a region to become the first semiconductor region 311, from the normal direction with respect to the first surface 302 in such a manner as to contact the second semiconductor region 312 in the depth direction. The first semiconductor region 311 is thereby formed. PN junction is consequently formed between the first semiconductor region 311 and the second semiconductor region 312. If the voltage VL and the voltage VH described in the first exemplary embodiment are applied to the PN junction portion, the avalanche multiplication unit 314 is formed.

Next, as illustrated in FIG. 34F, ion implantation of an impurity is performed on a region to become the fifth semiconductor region 313, from the normal direction with respect to the first surface 302. The fifth semiconductor region 313 is thereby formed.

Next, as illustrated in FIG. 34G, the contact plug 341 is formed in the first semiconductor region 311.

A pixel of the present exemplary embodiment can be manufactured by such a manufacturing method.

Figure 35:
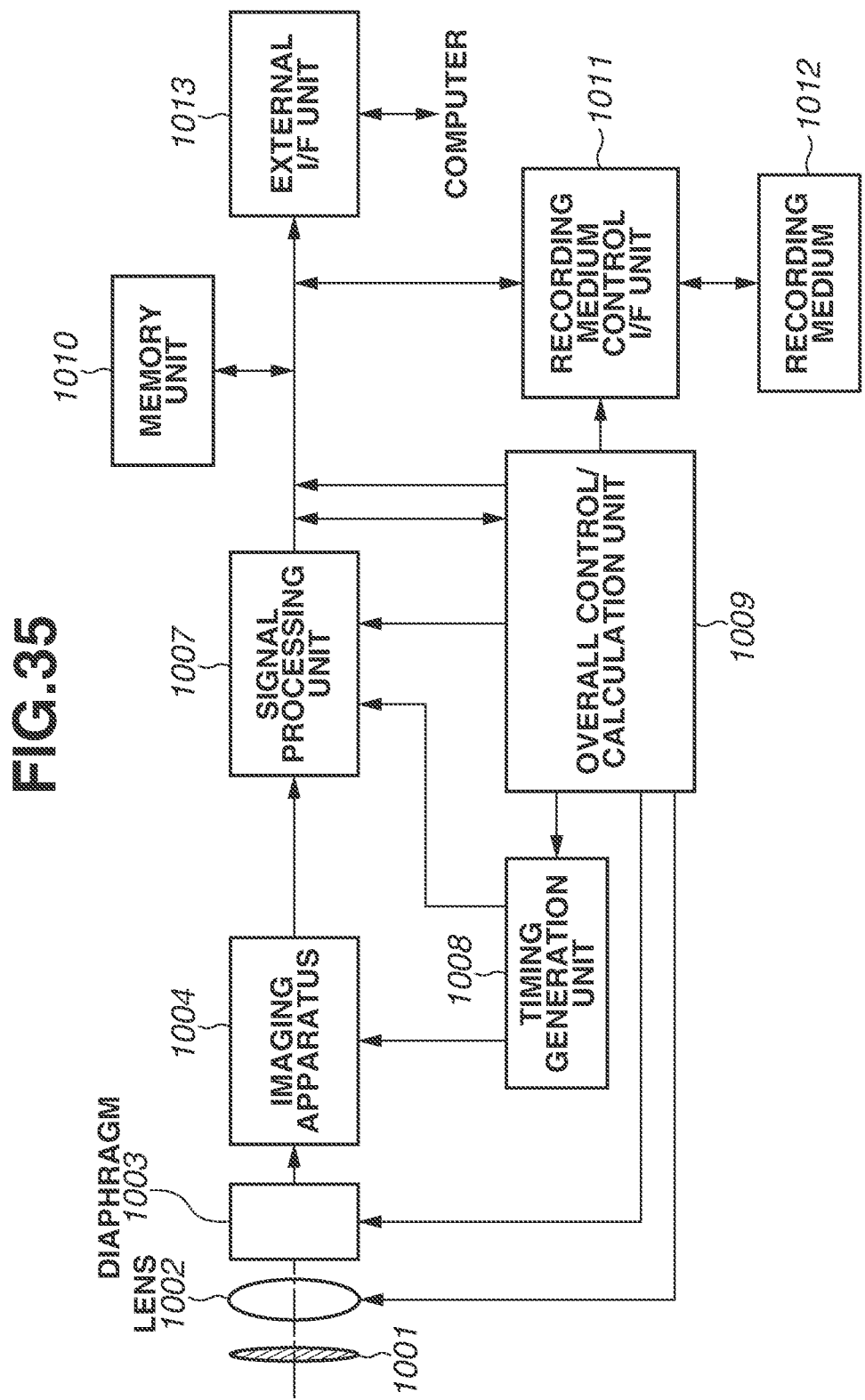
FIG. 35 is a block diagram of a photoelectric conversion system according to a fifteenth exemplary embodiment.

A photoelectric conversion system according to a fifteenth exemplary embodiment will be described with reference to FIG. 35. FIG. 35 is a block diagram illustrating a schematic configuration of a photoelectric conversion system according to the present exemplary embodiment.

The photoelectric conversion apparatus described in the above-described exemplary embodiments can be applied to various photoelectric conversion systems. Examples of photoelectric conversion systems to which the photoelectric conversion apparatus can be applied include a digital still camera, a digital camcorder, a monitoring camera, a copier, a facsimile machine, a mobile phone, an in-vehicle camera, and an observation satellite. A camera module including an optical system such as a lens and an imaging apparatus is also included in the photoelectric conversion system. FIG. 35 exemplarily illustrates a block diagram of a digital still camera as an example of these photoelectric conversion systems.

The photoelectric conversion system exemplified in FIG. 35 includes an imaging apparatus 1004, serving as an example of the photoelectric conversion apparatus, and a lens 1002 that forms an optical image of a subject on the imaging apparatus 1004. The photoelectric conversion system further includes a diaphragm 1003 for varying an amount of light passing through the lens 1002, and a barrier 1001 for protecting the lens 1002. The lens 1002 and the diaphragm 1003 serve as an optical system that condenses light onto the imaging apparatus 1004. The imaging apparatus 1004 is the photoelectric conversion apparatus according to any of the above-described exemplary embodiments, and converts an optical image formed by the lens 1002 into an electric signal.

The photoelectric conversion system further includes a signal processing unit 1007 serving as an image generation unit that generates an image by processing an output signal output by the imaging apparatus 1004. The signal processing unit 1007 performs an operation of outputting image data after performing various types of correction and compression as necessary. The signal processing unit 1007 may be formed in a semiconductor layer in which the imaging apparatus 1004 is provided, or may be formed in a semiconductor layer different from that of the imaging apparatus 1004. The imaging apparatus 1004 and the signal processing unit 1007 may be formed in the same semiconductor layer.

The photoelectric conversion system further includes a memory unit 1010 for temporarily storing image data, and an external interface unit (external I/F unit) 1013 for communicating with an external computer. The photoelectric conversion system further includes a recording medium 1012 such as a semiconductor memory for recording or reading out captured image data, and a recording medium control interface unit (recording medium control I/F unit) 1011 for performing recording onto or readout from the recording medium 1012. The recording medium 1012 may be built into the photoelectric conversion system, or may be detachably attached to the photoelectric conversion system.

The photoelectric conversion system further includes an overall control/calculation unit 1009 that controls various types of calculation and the entire digital still camera, and a timing generation unit 1008 that outputs various timing signals to the imaging apparatus 1004 and the signal processing unit 1007. The timing signals may be input from the outside. The photoelectric conversion system includes at least the imaging apparatus 1004 and the signal processing unit 1007 that processes an output signal output from the imaging apparatus 1004.

The imaging apparatus 1004 outputs an imaging signal to the signal processing unit 1007. The signal processing unit 1007 outputs image data after performing predetermined signal processing on the imaging signal output from the imaging apparatus 1004. The signal processing unit 1007 generates an image using the imaging signal.

In this manner, according to the present exemplary embodiment, a photoelectric conversion system to which the photoelectric conversion apparatus (imaging apparatus) according to any of the above-described exemplary embodiments is applied can be realized.

A photoelectric conversion system and a movable body according to a sixteenth exemplary embodiment will be described with reference to FIGS. 36A and 36B. 36A and 36B are diagrams illustrating configurations of the photoelectric conversion system and the movable body according to the present exemplary embodiment.

Figure 36A:
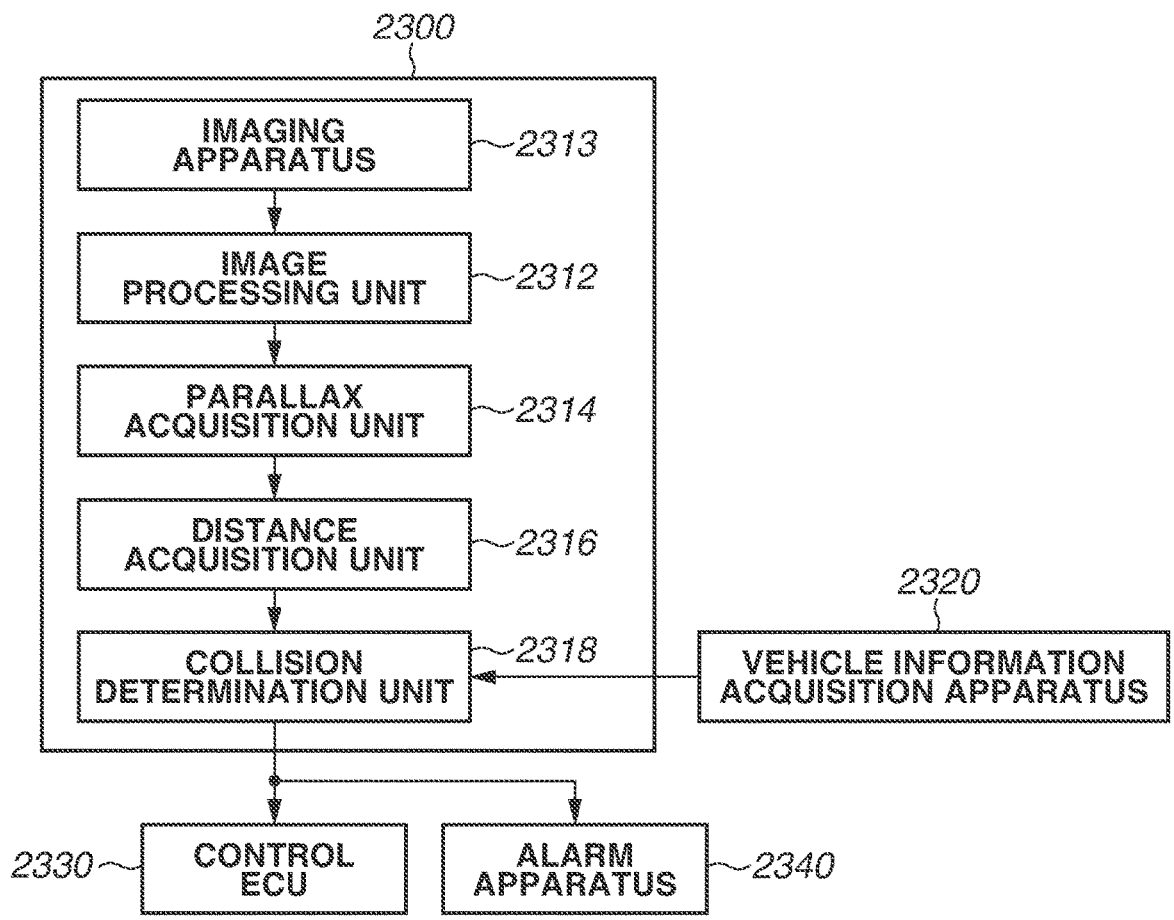
FIGS. 36A and 36B are block diagrams of a photoelectric conversion system according to a sixteenth exemplary embodiment.
Figure 36B:
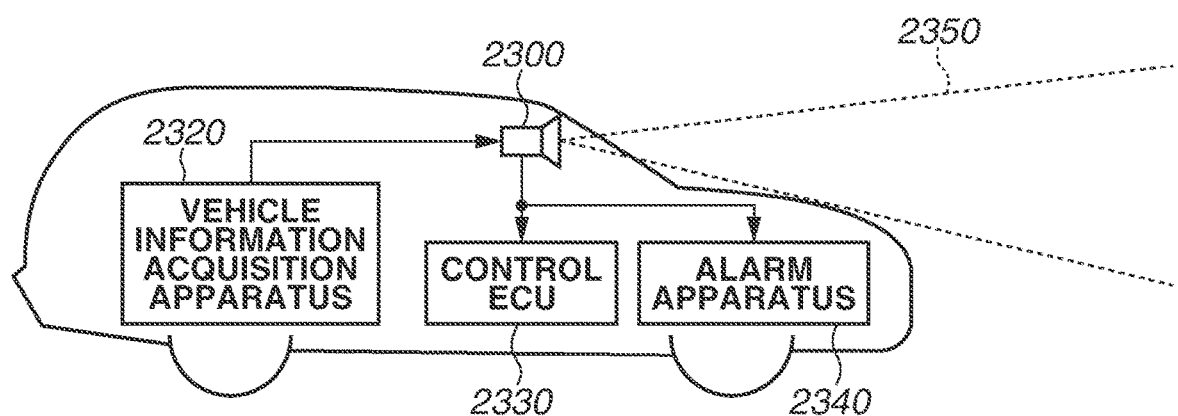

FIG. 36A illustrates an example of a photoelectric conversion system related to an in-vehicle camera. A photoelectric conversion system 2300 includes an imaging apparatus 2310. The imaging apparatus 2310 is the photoelectric conversion apparatus according to any of the above-described exemplary embodiments. The photoelectric conversion system 2300 includes an image processing unit 2312 that performs image processing on a plurality of pieces of image data acquired by the imaging apparatus 2310. The photoelectric conversion system 2300 further includes a parallax acquisition unit 2314 that calculates a parallax (phase difference between parallax images) from the plurality of pieces of image data acquired by the photoelectric conversion system 2300. The photoelectric conversion system 2300 further includes a distance acquisition unit 2316 that calculates a distance to a target object based on the calculated parallax, and a collision determination unit 2318 that determines whether collision is likely to occur, based on the calculated distance. In this example, the parallax acquisition unit 2314 and the distance acquisition unit 2316 serve as an example of a distance information acquisition unit that acquires distance information regarding a distance to a target object. More specifically, the distance information is information regarding a parallax, a defocus amount, and a distance to a target object. The collision determination unit 2318 may determine collision likelihood using any of these pieces of distance information. The distance information acquisition unit may be implemented by dedicatedly-designed hardware, or may be implemented by a software module. Alternatively, the distance information acquisition unit may be implemented by a field programmable gate array (FPGA) or an application specific integrated circuit (ASIC), or may be implemented by the combination of these.

The photoelectric conversion system 2300 is connected with a vehicle information acquisition apparatus 2320, and can acquire vehicle information such as vehicle speed, a yaw rate, or a steer angle. In addition, a control electronic control unit (ECU) 2330 is connected to the photoelectric conversion system 2300. The ECU 2330 serves as a control apparatus (control unit) that outputs a control signal for generating braking force, to a vehicle based on a determination result obtained by the collision determination unit 2318. The photoelectric conversion system 2300 is also connected with an alarm apparatus 2340 that gives an alarm to a driver based on a determination result obtained by the collision determination unit 2318. For example, if the determination result obtained by the collision determination unit 2318 indicates high collision likelihood, the control ECU 2330 performs vehicle control for avoiding collision or reducing damages by braking, releasing a gas pedal, or suppressing engine output. The alarm apparatus 2340 issues an alarm to a user by sounding an alarm such as warning sound, displaying warning information on a screen of a car navigation system, or vibrating a seatbelt or a steering wheel.

In the present exemplary embodiment, the photoelectric conversion system 2300 captures an image of the periphery of the vehicle such as the front side or the rear side, for example. FIG. 36B illustrates the photoelectric conversion system 2300 for capturing an image of a vehicle front side (imaging range 2350). The vehicle information acquisition apparatus 2320 issues an instruction to the photoelectric conversion system 2300 or the imaging apparatus 2310. With this configuration, the accuracy of distance measurement can be further enhanced.

The above description has been given of an example in which control is performed in such a manner as not to collide with another vehicle. The photoelectric conversion system can also be applied to the control for performing automatic driving by following another vehicle, or the control for performing automatic driving in such a manner as not to deviate from a lane. Furthermore, the photoelectric conversion system can be applied to a movable body (moving apparatus) such as a vessel, an aircraft, or an industrial robot aside from a vehicle such as an automobile. Moreover, the photoelectric conversion system can be applied to a device that extensively uses object recognition, such as an intelligent transport system (ITS), in addition to a movable body.

A photoelectric conversion system according to a sixteenth exemplary embodiment will be described with reference to FIG. 37. FIG. 37 is a block diagram illustrating a configuration example of a distance image sensor, which is a photoelectric conversion system.

As illustrated in FIG. 37, a distance image sensor 401 includes an optical system 402, a photoelectric conversion apparatus 403, an image processing circuit 404, a monitor 405, and a memory 406. The distance image sensor 401 can acquire a distance image corresponding to a distance to a subject by receiving light (modulated light or pulse light) that has been projected from a light source apparatus 411 toward the subject and reflected on the front surface of the subject.

The optical system 402 includes one or a plurality of lenses, and forms an image on a light receiving surface (sensor portion) of the photoelectric conversion apparatus 403 by guiding image light (incident light) from the subject to the photoelectric conversion apparatus 403.

The photoelectric conversion apparatus described in the above exemplary embodiment is applied to the photoelectric conversion apparatus 403, and a distance signal indicating a distance obtained from a light receiving signal output from the photoelectric conversion apparatus 403 is supplied to the image processing circuit 404.

The image processing circuit 404 performs image processing of constructing a distance image, based on the distance signal supplied from the photoelectric conversion apparatus 403. Then, a distance image (image data) obtained by the image processing is supplied to the monitor 405 and displayed thereon, or supplied to the memory 406 and stored (recorded) therein.

By applying the above-described photoelectric conversion apparatus, the distance image sensor 401 having the above-described configuration can acquire a more accurate distance image in accordance with improvement of characteristic of a pixel, for example.

A photoelectric conversion system according to a seventeenth exemplary embodiment will be described with reference to FIG. 38. FIG. 38 is a diagram illustrating an example of a schematic configuration of an endoscopic operation system, which is a photoelectric conversion system of the present exemplary embodiment.

FIG. 38 illustrates a state in which an operator (doctor) 1131 is performing an operation on a patient 1132 lying on a patient bed 1133, using an endoscopic operation system 1003. As illustrated in FIG. 38, the endoscopic operation system 1003 includes an endoscope 1100, a surgical tool 1110, and a cart 1134 equipped with various apparatuses for an endoscopic operation.

The endoscope 1100 includes a lens barrel 1101 having a region to be inserted into a body cavity of the patient 1132 by a predetermined length from a distal end, and a camera head 1102 connected to a proximal end of the lens barrel 1101. In the example illustrated in FIG. 38, the endoscope 1100 formed as a rigid scope including the rigid lens barrel 1101 is illustrated, but the endoscope 1100 may be formed as a flexible scope including a flexible lens barrel.

An opening portion into which an objective lens is fitted is provided at the distal end of the lens barrel 1101. A light source apparatus 1203 is connected to the endoscope 1100, and light generated by the light source apparatus 1203 is guided to the distal end of the lens barrel 1101 by a light guide extended inside the lens barrel 1101, and emitted onto an observation target in the body cavity of the patient 1132 via the objective lens. The endoscope 1100 may be a direct view endoscope, or may be an oblique view endoscope or a lateral view endoscope.

An optical system and a photoelectric conversion apparatus are provided inside the camera head 1102. Reflected light (observation light) from an observation target is condensed by the optical system to the photoelectric conversion apparatus. The observation light is photoelectrically-converted by the photoelectric conversion apparatus, and an electric signal corresponding to the observation light (i.e., image signal corresponding to an observed image) is generated. The photoelectric conversion apparatus described in the above exemplary embodiment can be used as the photoelectric conversion apparatus. The image signal is transmitted to a camera control unit (CCU) 1135 as RAW data.

The CCU 1135 includes a central processing unit (CPU) or a graphics processing unit (GPU), and comprehensively controls operations of the endoscope 1100 and a display device 1136. Furthermore, the CCU 1135 receives an image signal from the camera head 1102, and performs various types of image processing for displaying an image that is based on the image signal, such as development processing (demosaic processing), on the image signal.

Based on the control from the CCU 1135, the display device 1136 displays an image that is based on an image signal on which image processing has been performed by the CCU 1135.

The light source apparatus 1203 includes a light source such as a light emitting diode (LED), and supplies irradiating light for capturing an image of an operative site, to the endoscope 1100.

An input apparatus 1137 is an input interface for the endoscopic operation system 1003. A user can input various types of information and instructions to the endoscopic operation system 1003 via the input apparatus 1137.

A processing tool control apparatus 1138 controls the driving of an energy processing tool 1112 for cauterizing or cutting a tissue, or sealing a blood vessel.

The light source apparatus 1203 that supplies irradiating light for capturing an image of an operative site, to the endoscope 1100 can include, for example, an LED, a laser light source, or a white light source including a combination of these. In a case where a white light source includes a combination of RGB laser light sources, because output intensity and an output timing of each color (each wavelength) can be controlled highly accurately, white balance of a captured image can be adjusted in the light source apparatus 1203. In this case, by emitting laser light from each RGB laser light source onto an observation target in a time division manner, and controlling the driving of an image sensor of the camera head 1102 in synchronization with the emission timing, an image corresponding to each of RGB can be captured in a time division manner According to the method, a color image can be obtained without providing a color filter in the image sensor.

The driving of the light source apparatus 1203 may be controlled in such a manner as to change the intensity of light to be output every predetermined time. By acquiring images in a time division manner by controlling the driving of the image sensor of the camera head 1102 in synchronization with the change timing of the light intensity and combining the images, it is possible to generate a high dynamic range image without blocked up shadows and clipped whites.

The light source apparatus 1203 may be configured to supply light in a predetermined wavelength band adapted to special light observation. In the special light observation, for example, wavelength dependency of light absorption in body tissues is utilized. Specifically, by emitting light in a narrower band as compared with irradiating light (i.e., white light) in normal observation, an image of a predetermined tissue such as a blood vessel of a superficial portion of a mucous membrane is captured with high contrast. Alternatively, in special light observation, fluorescent observation of obtaining an image by fluorescence generated by emitting excitation light may be performed. In the fluorescent observation, fluorescence from a body tissue can be observed by emitting excitation light onto the body tissue, or a fluorescent image can be obtained by locally injecting reagent such as indocyanine green (ICG) into a body tissue and emitting excitation light suitable for a fluorescence wavelength of the reagent, onto the body tissue. The light source apparatus 1203 can be configured to supply narrow-band light and/or excitation light adapted to such special light observation.

Figure 39A:
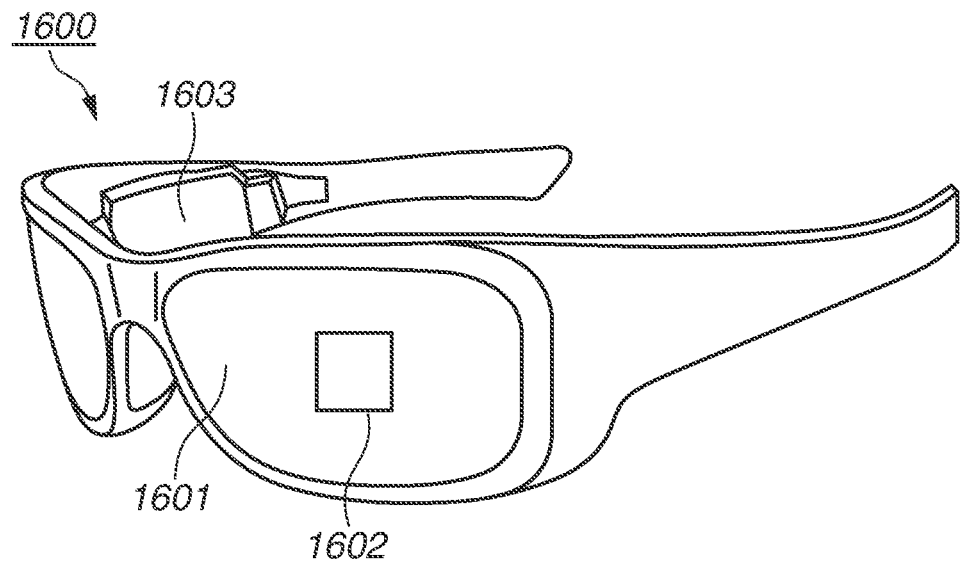
FIGS. 39A and 39B are diagrams illustrating specific examples of a photoelectric conversion system according to a nineteenth exemplary embodiment.
Figure 39B:
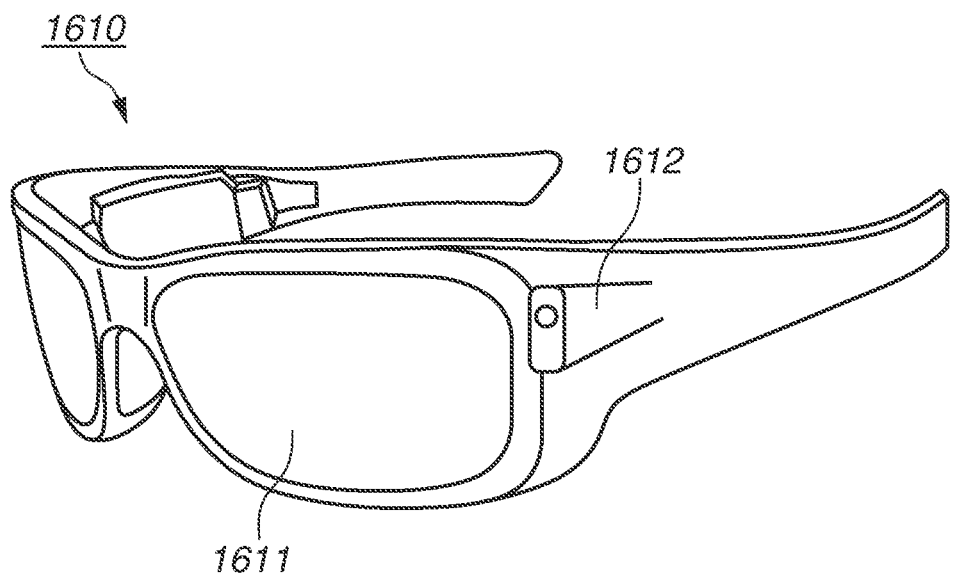

A photoelectric conversion system according to a seventeenth exemplary embodiment will be described with reference to FIGS. 39A and 39B. FIG. 39A is a diagram illustrating an example of a configuration of eyeglasses 1600 (smart glass), which is a photoelectric conversion system. The eyeglasses 1600 include a photoelectric conversion apparatus 1602. The photoelectric conversion apparatus 1602 is the photoelectric conversion apparatus described in the above-described first to twelfth exemplary embodiments. A display device including a light emission device such as an organic light emitting diode (OLED) or an LED may be provided on the back surface side of a lens 1601. The number of photoelectric conversion apparatuses 1602 may be one or plural. A plurality of types of photoelectric conversion apparatuses may be used in combination. An arrangement position of the photoelectric conversion apparatus 1602 is not limited to the position illustrated in FIG. 39A.

The eyeglasses 1600 further include a control apparatus 1603. The control apparatus 1603 functions as a power source that supplies power to the photoelectric conversion apparatus 1602 and the above-described display device. The control apparatus 1603 controls operations of the photoelectric conversion apparatus 1602 and the display device. In the lens 1601, an optical system for condensing light to the photoelectric conversion apparatus 1602 is formed.

FIG. 22B illustrates eyeglasses 1610 (smart glass) according to one application example. The eyeglasses 1610 include a control apparatus 1612, and the control apparatus 1612 is equipped with a photoelectric conversion apparatus equivalent to the photoelectric conversion apparatus 1602, and a display device. In a lens 1611, an optical system for projecting light emitted from the photoelectric conversion apparatus and the display device in the control apparatus 1612 is formed, and an image is projected onto the lens 1611. The control apparatus 1612 functions as a power source that supplies power to the photoelectric conversion apparatus and the display device, and controls operations of the photoelectric conversion apparatus and the display device. The control apparatus may include a line-of-sight detection unit that detects a line of sight of a wearer. Infrared light may be used for the detection of a line of sight. An infrared light emission unit emits infrared light onto an eyeball of a user looking at a displayed image. An imaging unit including a light receiving element detects reflected light of the emitted infrared light that has been reflected from the eyeball. A captured image of the eyeball is thereby obtained. By including a reduction unit for reducing light from the infrared light emission unit to a display unit in a planar view, a decline in image quality is suppressed.

A line of sight of a user with respect to a displayed image is detected from a captured image of an eyeball obtained by image capturing using infrared light. An arbitrary known method can be applied to line-of-sight detection that uses a captured image of an eyeball. As an example, a line-of-sight detection method that is based on a Purkinje image obtained by reflection of irradiating light on a cornea can be used.

More specifically, line-of-sight detection processing that is based on the pupil center corneal reflection is performed. A line of sight of a user is detected by calculating an eye vector representing the direction (rotational angle) of an eyeball based on an image of a pupil and a Purkinje image that are included in a captured image of the eyeball using the pupil center corneal reflection.

The display device of the present exemplary embodiment includes the photoelectric conversion apparatus including a light receiving element, and a displayed image of the display device may be controlled based on line-of-sight information of the user from the photoelectric conversion apparatus.

Specifically, in the display device, a first eyeshot region viewed by the user, and a second eyeshot region other than the first eyeshot region are determined based on the line-of-sight information. The first eyeshot region and the second eyeshot region may be determined by a control apparatus of the display device, or the first eyeshot region and the second eyeshot region determined by an external control apparatus may be received. In a display region of the display device, a display resolution of the first eyeshot region may be controlled to be higher than a display resolution of the second eyeshot region. In other words, a resolution of the second eyeshot region may be made lower than a resolution of the first eyeshot region.

The display region includes a first display region and a second display region different from the first display region. A region with high priority may be determined from the first display region and the second display region based on the line-of-sight information. The first display region and the second display region may be determined by a control apparatus of the display device, or the first display region and the second display region determined by an external control apparatus may be received. A resolution of a region with high priority may be controlled to be higher than a resolution of a region other than the region with high priority. In other words, a resolution of a region with relatively-low priority may be set to a low resolution.

Artificial intelligence (AI) may be used for determining the first eyeshot region and the region with high priority. The AI may be a model configured to estimate an angle of a line of sight and a distance to a target existing at the end of the line of sight, from an image of an eyeball using teaching data including an image of the eyeball and a direction in which the eyeball in the image actually gives a gaze. An AI program may be included in the display device, the photoelectric conversion apparatus, or an external apparatus. In a case where an external apparatus includes an AI program, the AI program is transmitted to the display device via communication.

In a case where display control is performed based on line-of-sight detection, the present invention can be desirably applied to a smart glass further including a photoelectric conversion apparatus that captures an image of the outside. The smart glass can display external information obtained by image capturing, in real time.

The exemplary embodiments described above can be appropriately changed without departing from the technical idea. An example in which a partial configuration of a certain exemplary embodiment is added to another exemplary embodiment, and an example in which a partial configuration of a certain exemplary embodiment is replaced with a partial configuration of another exemplary embodiment are also included in the exemplary embodiments of the present invention.

According to the photoelectric conversion apparatus according to the present exemplary embodiment, it becomes possible to provide a photoelectric conversion apparatus that can achieve miniaturization of a pixel size.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2020-180165, filed Oct. 28, 2020, No. 2021-047087, filed Mar. 22, 2021, and No. 2021-157065, filed Sep. 27, 2021, which are hereby incorporated by reference herein in their entirety.

What is claimed is:

1. A photoelectric conversion apparatus comprising:
   a semiconductor layer having a first surface and a second surface, the second surface being a surface opposite to the first surface; and
   a plurality of avalanche photodiodes arranged on the semiconductor layer and including a first avalanche photodiode, a second avalanche photodiode and a third avalanche photodiode, wherein each of the plurality of avalanche photodiodes includes an avalanche multiplication unit formed by a first semiconductor region of a first conductivity type in which a carrier of a same conductivity type as a signal charge is regarded as a majority carrier and which is arranged at a first depth, and a second semiconductor region of a second conductivity type different from the first conductivity type and which is arranged at a second depth deeper than the first depth with respect to the first surface, wherein a third semiconductor region of the second conductivity type is arranged between the first avalanche photodiode and the second avalanche photodiode, wherein a fourth semiconductor region is arranged between the first avalanche photodiode and the second avalanche photodiode at a position shallower than the third semiconductor region with respect to the first surface, wherein the fourth semiconductor region is a second conductivity type semiconductor region in which an impurity concentration of the second conductive type is lower than an impurity concentration of the second conductive type in the third semiconductor region, or a first conductivity type semiconductor region, wherein the second semiconductor region is arranged in contact with the third semiconductor region, wherein the first avalanche photodiode and the second avalanche photodiode are arranged adjacently in a first direction, wherein the second avalanche photodiode and the third avalanche photodiode are arranged adjacently in a second direction orthogonal to the first direction, wherein a distance between the first semiconductor region of the first avalanche photodiode and the first semiconductor region of the third avalanche photodiode is longer than a distance between the first semiconductor region of the first avalanche photodiode and the first semiconductor region of the second avalanche photodiode, wherein an isolation region including a trench structure is arranged between the first avalanche photodiode and the second avalanche photodiode, wherein the third semiconductor region and the fourth semiconductor region are arranged in a side wall portion of the trench structure, wherein the first semiconductor region includes a top surface and a bottom surface, wherein the top surface of the first semiconductor region is arranged on the first surface of the semiconductor layer and the bottom surface is a surface opposite to the top surface of the first semiconductor region, wherein the third semiconductor region includes a top surface and a bottom surface, wherein the bottom surface of the third semiconductor region is arranged on the second surface of the semiconductor layer and the top surface is a surface opposite to the bottom surface of the third semiconductor region, and wherein the top surface of the third semiconductor region is deeper than the bottom surface of the first semiconductor region with respect to the first surface.

2. The photoelectric conversion apparatus according to claim 1, wherein a depth of a boundary portion between the third semiconductor region and the fourth semiconductor region is shallower than the second depth with respect to the first surface.

3. The photoelectric conversion apparatus according to claim 1, wherein the fourth semiconductor region is a semiconductor region of the first conductivity type.

4. The photoelectric conversion apparatus according to claim 1,
wherein the fourth semiconductor region is a semiconductor region of the second conductivity type, and
wherein a width of the fourth semiconductor region is narrower than a width of the third semiconductor region.

5. The photoelectric conversion apparatus according to claim 1, wherein the trench structure penetrates the semiconductor layer from the second surface of the semiconductor layer to the first surface of the semiconductor layer.

6. The photoelectric conversion apparatus according to claim 1,
wherein the trench structure is formed from the first surface of the semiconductor layer.

7. The photoelectric conversion apparatus according to claim 1,
wherein the trench structure is formed from the second surface of the semiconductor layer.

8. The photoelectric conversion apparatus according to claim 3, wherein a semiconductor region of the second conductivity type is arranged between the first semiconductor region of the first avalanche photodiode and the first semiconductor region of the third avalanche photodiode, and an impurity concentration of the semiconductor region of the second conductivity type is higher than the impurity concentration of the second conductive type in the third semiconductor region.

9. The photoelectric conversion apparatus according to claim 8, wherein, between the second semiconductor region of the first avalanche photodiode and the second semiconductor region of the third avalanche photodiode, the trench structure is arranged.

10. The photoelectric conversion apparatus according to claim 8, wherein a length of the trench structure in a depth direction of a cross-section passing through the first avalanche photodiode and the third avalanche photodiode and a length of the trench structure in a depth direction of a cross-section passing through the first avalanche photodiode and the second avalanche photodiode are different.

11. The photoelectric conversion apparatus according to claim 8, wherein a contact plug configured to supply a potential to the first avalanche photodiode is arranged between the first avalanche photodiode and the third avalanche photodiode in a third direction in which the first avalanche photodiode and the third avalanche photodiode are arranged.

12. The photoelectric conversion apparatus according to claim 2, wherein a potential is supplied to the avalanche photodiode from the second surface.

13. The photoelectric conversion apparatus according to claim 2, wherein at least any one of a metal material, an insulating material, and an air is arranged inside the trench structure.

14. The photoelectric conversion apparatus according to claim 1, wherein a depth of a boundary portion between the third semiconductor region and the fourth semiconductor region is shallower than a top surface of the second semiconductor region or same as the second depth.

15. A photoelectric conversion apparatus comprising:
a semiconductor layer including a plurality of photoelectric conversion elements and having a first surface and a second surface, the second surface being a surface opposite to the first surface, wherein each of the plurality of photoelectric conversion elements includes an avalanche photodiode,
wherein the avalanche photodiode includes a first semiconductor region of a first conductivity type in which a carrier of a same conductivity type as a signal charge is regarded as a majority carrier and a second semiconductor region of a second conductivity type different from the first conductivity type,
wherein the plurality of photoelectric conversion elements is isolated by an isolation portion including a third semiconductor region of the second conductivity type,
wherein the second semiconductor region is arranged in contact with the third semiconductor region,
wherein the plurality of photoelectric conversion elements includes a first photoelectric conversion element, a second photoelectric conversion element and a third photoelectric conversion element,
wherein the first photoelectric conversion element and a second photoelectric conversion element are arranged in a first direction,
wherein the second photoelectric conversion element and a third photoelectric conversion element are arranged in a second direction intersecting with the first direction,
wherein the isolation portion includes a trench structure,
wherein the trench structure penetrates through the semiconductor layer between the first photoelectric conversion element and the second photoelectric conversion element, and does not penetrate through the semiconductor layer between the first photoelectric conversion element and the third photoelectric conversion element,
wherein the second semiconductor region includes a top surface and a bottom surface, wherein the top surface of the second semiconductor region is shallower than the bottom surface of the second semiconductor region with respect to the first surface,
wherein the third semiconductor region includes a top surface and a bottom surface, wherein the bottom surface of the third semiconductor region is arranged on the second surface of the semiconductor layer and the top surface is a surface opposite to the bottom surface of the third semiconductor region, and
wherein the top surface of the third semiconductor region is shallower than the bottom surface of the second semiconductor region with respect to the first surface.

16. The photoelectric conversion apparatus according to claim 15, wherein the first direction is a side facing direction, and the second direction is a diagonal direction.

17. The photoelectric conversion apparatus according to claim 15, wherein a contact plug is connected to the first surface of the semiconductor layer between the first photoelectric conversion element and the third photoelectric conversion element.

18. The photoelectric conversion apparatus according to claim 17, wherein a voltage is applied to the second semiconductor region via the contact plug and the third semiconductor region.

19. The photoelectric conversion apparatus according to claim 15,
wherein a fourth semiconductor region of the first conductivity type is continuously arranged between the first semiconductor region of the first photoelectric conversion element and the first semiconductor region of the second photoelectric conversion element,
wherein an impurity concentration of the fourth semiconductor region is lower than an impurity concentration of the first semiconductor region, and
wherein the fourth semiconductor region constitutes a part of the first surface.

20. The photoelectric conversion apparatus according to claim 19, wherein the fourth semiconductor region includes a first portion having a first impurity concentration and a second portion that is distant from the first semiconductor region more than the first portion and that has an impurity concentration lower than the first impurity concentration.

21. The photoelectric conversion apparatus according to claim 15,
wherein the trench structure includes a first portion and a second portion located closer to the second surface than the first portion, and
wherein, between the first photoelectric conversion element and the second photoelectric conversion element, the first portion contacts the third semiconductor region and the second portion contacts a semiconductor region of the first conductivity type.

22. The photoelectric conversion apparatus according to claim 21, wherein, in the trench structure, a pinning film is arranged at least in the second portion in such a manner as to contact the semiconductor layer.

23. The photoelectric conversion apparatus according to claim 15, wherein an oxidized film is arranged in the trench structure.

24. The photoelectric conversion apparatus according to claim 15,
wherein in the trench structure,
at least one of an air and a metal material is arranged by being sandwiched by an oxidized film.

25. A photoelectric conversion system comprising:
the photoelectric conversion apparatus according to claim 1, and
a signal processing unit configured to generate an image using a signal output by the photoelectric conversion apparatus.

26. A movable body including the photoelectric conversion apparatus according to claim 1, the movable body comprising:
a control unit configured to control a movement of the movable body using a signal output by the photoelectric conversion apparatus.

27. The photoelectric conversion apparatus according to claim 2, wherein each of the plurality of avalanche photodiodes includes a semiconductor region which is arranged at a third depth deeper than the second depth with respect to the first surface and which is a photoelectric conversion region.

28. The photoelectric conversion apparatus according to claim 27, wherein the third semiconductor region is arranged between the semiconductor region arranged at the third depth of the first avalanche photodiode and the semiconductor region arranged at the third depth of the second avalanche photodiode.

29. The photoelectric conversion apparatus according to claim 28,
wherein the second semiconductor region has a first portion positioned between the first semiconductor region and the semiconductor region arranged at the third depth and a second portion arranged around the first portion, and
wherein a potential with respect to the signal charge in the second portion of the second semiconductor region is higher than that in the first portion of the second semiconductor region.

30. The photoelectric conversion apparatus according to claim 29, wherein each of the plurality of avalanche photodiodes includes a semiconductor region of the second conductivity type and which is arranged at a fourth depth deeper than the third depth with respect to the first surface.

31. The photoelectric conversion apparatus according to claim 30, wherein the semiconductor region of the second conductivity type arranged at the fourth depth is in contact with the third semiconductor region.

32. The photoelectric conversion apparatus according to claim 2,
wherein an impurity concentration of the first conductivity type of the fourth semiconductor region is lower than an impurity concentration of the first conductivity type of the first semiconductor region, and
wherein the fourth semiconductor region constitutes a part of the first surface of the semiconductor layer.

33. The photoelectric conversion apparatus according to claim 32, wherein the fourth semiconductor region includes a first portion of a first impurity concentration and a second portion that is farther from the first semiconductor region than a first portion of the fourth semiconductor region and has an impurity concentration lower than that of the first portion of the fourth semiconductor region.

34. The photoelectric conversion apparatus according to claim 33, wherein the first portion of the fourth semiconductor region is arranged between the first semiconductor region and the second semiconductor region.

* * * * *